United States Patent
Yang et al.

(10) Patent No.: US 11,108,393 B2
(45) Date of Patent: *Aug. 31, 2021

(54) OPTICAL KEYSWITCH TRIGGERED BY SUPPORT MECHANISM HAVING AT LEAST ONE ROTATABLE FRAME ENABLE A PROTRUSION TO MOVE ALONG WITH A KEY CAP

(71) Applicant: Darfon Electronics Corp., Taoyuan (TW)

(72) Inventors: Chen Yang, Taoyuan (TW); Yu-Chun Hsieh, Taoyuan (TW); Yung-Chih Wang, Taoyuan (TW); Chia-Hung Liu, Taoyuan (TW); Ching-Yu Wang, Taoyuan (TW); Li-Te Chang, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 111 days.

This patent is subject to a terminal disclaimer.

(21) Appl. No.: 16/240,096

(22) Filed: Jan. 4, 2019

(65) Prior Publication Data

US 2019/0238131 A1    Aug. 1, 2019

Related U.S. Application Data

(60) Provisional application No. 62/613,806, filed on Jan. 5, 2018.

(30) Foreign Application Priority Data

Feb. 14, 2018  (TW) ................. 107105665

(51) Int. Cl.
*H03K 17/969* (2006.01)
*H03K 17/968* (2006.01)

(52) U.S. Cl.
CPC ......... *H03K 17/969* (2013.01); *H03K 17/968* (2013.01); *H03K 2217/9651* (2013.01); *H03K 2217/9653* (2013.01)

(58) Field of Classification Search
CPC ............... H03K 17/968; H03K 17/969; H03K 2217/9651; H03K 2217/9653; G01J 1/0238

(Continued)

(56) References Cited

U.S. PATENT DOCUMENTS 4,479,111 A   10/1984 Madsen et al.
4,836,636 A    6/1989 Obara et al.
(Continued)

FOREIGN PATENT DOCUMENTS

CN    203521244 U   4/2014
CN    203812764 U   9/2014
(Continued)

*Primary Examiner* — Que Tan Le
(74) *Attorney, Agent, or Firm* — McClure, Qualey & Rodack, LLP

(57) ABSTRACT

An optical keyswitch includes a keycap, a supporting mechanism having a protrusion disposed under the keycap to support the keycap to move downward or upward, and a switch module including a circuit board, an emitter, and a receiver. The emitter and the receiver are electrically connected to the circuit board. The emitter emits an optical signal to the receiver. When the keycap is not pressed, the receiver receives the optical signal of a first intensity. When the keycap is pressed, the protrusion moves along with the keycap, and the protrusion changes the optical signal received by the receiver to have a second intensity different from the first intensity, so the switch module is triggered to generate a triggering signal.

17 Claims, 54 Drawing Sheets

(58) Field of Classification Search
USPC .................. 250/221, 227.11, 227.22, 227.24
See application file for complete search history.

(56) References Cited

U.S. PATENT DOCUMENTS

| | | | |
|---|---|---|---|
| 5,266,949 | A | 11/1993 | Rossi |
| 9,634,661 | B1 | 4/2017 | Chen |
| 9,838,006 | B2 * | 12/2017 | Chen ..................... H03K 17/78 |
| 2016/0179212 | A1 | 6/2016 | Toraille et al. |
| 2017/0019102 | A1 | 1/2017 | Chen |
| 2017/0115747 | A1 | 4/2017 | Chen et al. |
| 2017/0178830 | A1 | 6/2017 | Feng |
| 2017/0264294 | A1 | 9/2017 | Li |
| 2018/0008619 | A1 | 1/2018 | Baheti et al. |
| 2018/0083619 | A1 | 3/2018 | Hou et al. |

FOREIGN PATENT DOCUMENTS

| | | |
|---|---|---|
| CN | 204130394 U | 1/2015 |
| CN | 204407228 U | 6/2015 |
| CN | 204441139 U | 7/2015 |
| CN | 104991319 A | 10/2015 |
| CN | 104992867 A | 10/2015 |
| CN | 105006396 A | 10/2015 |
| CN | 105097342 A | 11/2015 |
| CN | 205004229 U | 1/2016 |
| CN | 205004233 U | 1/2016 |
| CN | 105429620 A | 3/2016 |
| CN | 205092842 U | 3/2016 |
| CN | 104299818 B | 9/2016 |
| CN | 105931907 A | 9/2016 |
| CN | 206180999 U | 5/2017 |
| CN | 107017870 A | 8/2017 |
| CN | 206758332 U | 12/2017 |

* cited by examiner

OPTICAL KEYSWITCH TRIGGERED BY SUPPORT MECHANISM HAVING AT LEAST ONE ROTATABLE FRAME ENABLE A PROTRUSION TO MOVE ALONG WITH A KEY CAP

BACKGROUND OF THE INVENTION

1. Field of the Invention

The invention generally relates to an optical keyswitch. Particularly, the invention relates to an optical keyswitch which is triggered according to the receiving status of the optical signal by pressing the keycap.

2. Description of the Prior Art

Membrane keyswitches and mechanical keyswitches are common types of keyswitch for keyboards. The major difference between the membrane keyswitch and the mechanical keyswitch is the circuit structure for generating the triggering signal. In general, the membrane keyswitch utilizes the membrane circuit as a switch for generating the triggering signal. When the keycap is pressed to trigger the membrane circuit, the upper circuit layer is deformed to enable the upper switch contact of the upper circuit layer to contact the corresponding lower switch contact of the lower circuit layer, so the membrane circuit is conducted to generate the signal. However, the membrane circuit is easily damaged and difficult to repair when it is frequently used or operated by improper forces. Moreover, when the user presses the keycap to trigger the membrane circuit, the tactile feedback is less significant, which causes the pressing feeling to be poor and cannot satisfy the user's expectation.

The mechanical keyswitch is triggered based on whether the metal piece and the metal contact are conducted. However, the metal piece and the metal contact are easily worn out due to operation impact, which reduces the life of the keyswitch. The metal piece and the metal contact are also prone to rusty, resulting in poor conduction, which affects the operation stability of the keyswitch. Moreover, conventional mechanical keyswitches are more complicate in structure and bigger in volume and not suitable for portable electronic devices having higher thinning requirements, such as laptop computer.

SUMMARY OF THE INVENTION

It is an object of the invention to provide an optical keyswitch, which utilizes a switch module constructed by the emitter and the receiver, and provides fast and accurate triggering function based on the receiving status of the optical signal changed by components of the keyswitch, which are movable during the stroke.

It is another object of the invention to provide an optical keyswitch, which integrates the optical switch to the limited space of the keyswitch and is suitable for use in portable electronic devices.

It is yet another object of the invention to provide an optical keyswitch, which includes the optical switch and the mechanical restoring mechanism, not only providing mechanical pressing feeling but also enhancing the repairability.

In an embodiment, the invention provides an optical keyswitch including a keycap, a support mechanism, and a switch module. The support mechanism is disposed below the keycap and configured to support the keycap moving upward and downward. The support mechanism has a protrusion. The switch module includes a circuit board, an emitter, and a receiver. The emitter and the receiver are electrically connected to the circuit board, and the emitter emits an optical signal to the receiver. When the keycap is not pressed, the receiver receives the optical signal of a first intensity. When the keycap is pressed, the protrusion is driven by the keycap to move along with the keycap, and the protrusion changes the optical signal received by the receiver to have a second intensity different from the first intensity, so that the switch module is triggered to generate a triggering signal.

In another embodiment, the invention provides an optical keyswitch including a keycap, a support mechanism, a restoring mechanism, and a switch module. The keycap has a protrusion. The support mechanism is disposed below the keycap and configured to support the keycap moving upward and downward. The restoring mechanism is disposed below the keycap and configured to provide a restoring force to enable the keycap to return to a non-pressed position. The restoring mechanism includes a casing having an accommodation space and a resilient member disposed in the accommodation space. The switch module includes a circuit board, an emitter, and a receiver. The emitter and the receiver are electrically connected to the circuit board, and the emitter emits an optical signal to the receiver. The emitter and the receiver are spaced apart by an intensity adjustment space. When the keycap is not pressed, the protrusion is at a first position relative to the intensity adjustment space, and the receiver receives the optical signal of a first intensity. When the keycap is pressed, the protrusion moves along with the keycap outside the casing to a second position relative to the intensity adjustment space. The second position is different from the first position, and the protrusion changes the optical signal received by the receiver to have a second intensity different from the first intensity, so that the switch module is triggered to generate a triggering signal.

In an embodiment, the protrusion has an opening. The first position refers that the opening is away from the intensity adjustment space, and the protrusion at least partially blocks the optical signal received by the receiver. The second position refers that the opening is located in the intensity adjustment space, and the optical signal is allowed to pass the opening, so that the second intensity is greater than the first intensity to trigger the switch module generating the triggering signal.

In an embodiment, the first position refers that the protrusion is away from the intensity adjustment space, and the protrusion does not change the intensity of the optical signal received by the receiver. The second position refers that the protrusion is located in the intensity adjustment space, and the protrusion reduces the intensity of the optical signal received by the receiver, so that the second intensity is smaller than the first intensity to trigger the switch module generating the triggering signal.

In an embodiment, the casing has an up-down path and a sidewall. The sidewall is located between the up-down path and the accommodation space to separate the up-down path from the accommodation space. When the keycap is pressed, the protrusion is driven by the keycap to move downward in the up-down path.

In an embodiment, the circuit board further has a receiving space aligned with the up-down path and the intensity adjustment space. When the keycap is pressed, the protrusion is driven by the keycap to move downward in the up-down path into the receiving space through the intensity adjustment space.

In an embodiment, the casing includes an upper casing and a lower casing. The lower casing has a substantially U-shaped horizontal cross section. The upper casing includes a left arm portion and a right arm portion protruding toward each other beyond the lower casing to form an open region between the left arm portion and the right arm portion. The up-down path is located within the open region, and the emitter and the receiver are located beneath the left arm portion and the right arm portion, respectively.

In an embodiment, the support mechanism includes a scissor-like support mechanism including an inner frame and an outer frame. The inner frame couples with the outer frame to rotate about a scissor axis. The restoring mechanism, the emitter, and the receiver are all within a vertical projection area of the inner frame. The restoring mechanism is substantially located at a first side with respect to the scissor axis, and the emitter and the receiver are located at a second side with respect to the scissor axis opposite to first side.

In an embodiment, the emitter, the intensity adjustment space, and the receiver are sequentially arranged along a straight optical path, and the straight optical path is parallel to the scissor axis.

In an embodiment, the casing includes an upper casing and a lower casing. The lower casing has a deformable portion extending from the lower casing toward the upper casing and corresponding to the protrusion. When the protrusion is driven to move along with the keycap, the protrusion presses against the deformable portion and the deformable portion is bent to at least partially block the optical signal, so the second intensity is smaller than the first intensity.

In an embodiment, the upper casing has a deformable portion extending from the upper casing and corresponding to the protrusion. When the protrusion is driven to move along with the keycap, the protrusion presses against the deformable portion and the deformable portion is bent to at least partially block the optical signal, so the second intensity is smaller than the first intensity.

In an embodiment, the optical keyswitch further includes a baseplate. The circuit board is disposed on the baseplate. The protrusion extends from a lower surface of the keycap toward the baseplate. The baseplate has an extension portion extending toward the keycap and corresponding to the protrusion to at least partially block the optical signal. When the protrusion is driven to move along with the keycap, the protrusion presses against the extension portion, and the extension portion deforms to avoid the optical signal, so the second intensity is greater than the first intensity.

In an embodiment, the casing has a grating portion disposed corresponding to the emitter or the receiver to define a stroke distance of generating the triggering signal when the keycap is pressed.

In a further embodiment, the invention provides an optical keyswitch including a keycap, a support mechanism, a switch module, and a restoring mechanism. The support mechanism is disposed below the keycap and configured to support the keycap moving upward and downward. The switch module includes a circuit board, an emitter, and a receiver. The emitter and the receiver are electrically connected to the circuit board, and the emitter emits an optical signal to the receiver. The restoring mechanism is disposed below the keycap and configured to provide a restoring force to enable the keycap to return to a non-pressed position. The restoring mechanism includes a resilient member. The resilient member includes a spring portion and an extension portion extending from the spring portion toward the keycap. When the keycap is pressed, the keycap presses against the extension portion, and the extension portion deforms to at least partially block the optical signal, so the switch module is triggered to generate a triggering signal.

In a further another embodiment, the invention provides an optical keyswitch including a baseplate, a keycap, a support mechanism, a magnetic member, and a switch module. The baseplate has a magnetic portion. The keycap is disposed above the baseplate. The support mechanism is disposed between the keycap and the baseplate to support the keycap moving relative to the baseplate. The support mechanism includes a first frame and a second frame located on two opposite sides of the keycap, respectively. The magnetic member is disposed corresponding to the magnetic portion. The magnetic member has a first side movably connected to the first frame and a second side corresponding to the second frame. The magnetic member and the magnetic portion contact each other to generate an attractive force to support the keycap at a non-pressed position. The switch module includes a circuit board, an emitter, and a receiver. The emitter and the receiver are electrically connected to the circuit board and disposed along a connecting line of the first side and the second side of the magnetic member. The emitter emits an optical signal to the receiver. When the keycap is not pressed, the magnetic member blocks the optical signal. When the keycap is pressed, the second frame moves along with the keycap to drive the magnetic member to move away from the magnetic portion to allow the receiver to receive the optical signal, so the switch module is triggered to generate a triggering signal.

In another embodiment, the invention provides an optical keyswitch including a keycap, a support mechanism, a resilient member, and a switch module. The support mechanism is disposed below the keycap and configured to support the keycap moving upward and downward. The support mechanism includes a first frame and a second frame. The resilient member connects the first frame and the second frame. The switch module includes a circuit board, an emitter, and a receiver. The emitter and the receiver are electrically connected to the circuit board, and the emitter emits an optical signal to the receiver. When the keycap is pressed, the first frame is driven by the keycap to slide substantially parallel to the circuit board and at least partially block the optical signal, so the switch module is triggered to generate a triggering signal.

In another embodiment, the invention provides an optical keyswitch including a keycap, a support mechanism, a resilient member, a tactile resilient member, and a switch module. The support mechanism is disposed below the keycap and configured to support the keycap moving upward and downward. The support mechanism includes a first frame and a second frame. The resilient member connects the first frame and the second frame. The tactile resilient member includes a connecting portion, a pressing portion, and a hitting portion. The connecting portion connects the first frame. The pressing portion corresponds to the first frame. The hitting portion is connected to the pressing portion and located opposite to the connecting portion. The switch module includes a circuit board, an emitter, and a receiver. The emitter and the receiver are electrically connected to the circuit board, and the emitter emits an optical signal to the receiver. When the keycap is pressed, the first frame is driven by the keycap to press against the pressing portion, and the hitting portion at least partially blocks the optical signal, so the switch module is triggered to generate a triggering signal.

In an embodiment, the optical keyswitch further includes a backlight source. The keycap has a light-transparent portion. The backlight source is electrically connected to the circuit board and provides a light toward the keycap to emit out from the light-transparent portion.

Compared to the prior art, the optical keyswitch of the invention utilizes the emitter and the receiver as the switch unit. The optical keyswitch can be fast and accurately triggered by changing the receiving status of the optical signal and is applicable to various kinds of keyswitch structures for portable electronic devices. Moreover, the optical keyswitch of the invention optionally has the grating portion to reduce the interference of external light, so that the triggering accuracy can be enhanced and the triggering position can be suitably controlled to reduce the triggering error. Furthermore, the optical keyswitch of the invention has the restoring mechanism leaning (or lying) on the circuit board (or baseplate), so that the replacement of the restoring mechanism can be readily achieved to promote the repairability.

DETAILED DESCRIPTION OF THE PREFERRED EMBODIMENT

The invention provides an optical keyswitch, which can be applied to any pressing-type input device, such as keyboard, or integrated to any suitable electronic devices, such as keybuttons or keyboard equipped in portable devices or lap top computers, so as to provide fast and accurate triggering function, to be applicable to various keyswitch designs, and to promote repairability. Hereinafter, the optical keyswitch of the invention will be described in detail with reference to the drawings.

Figure 1A:
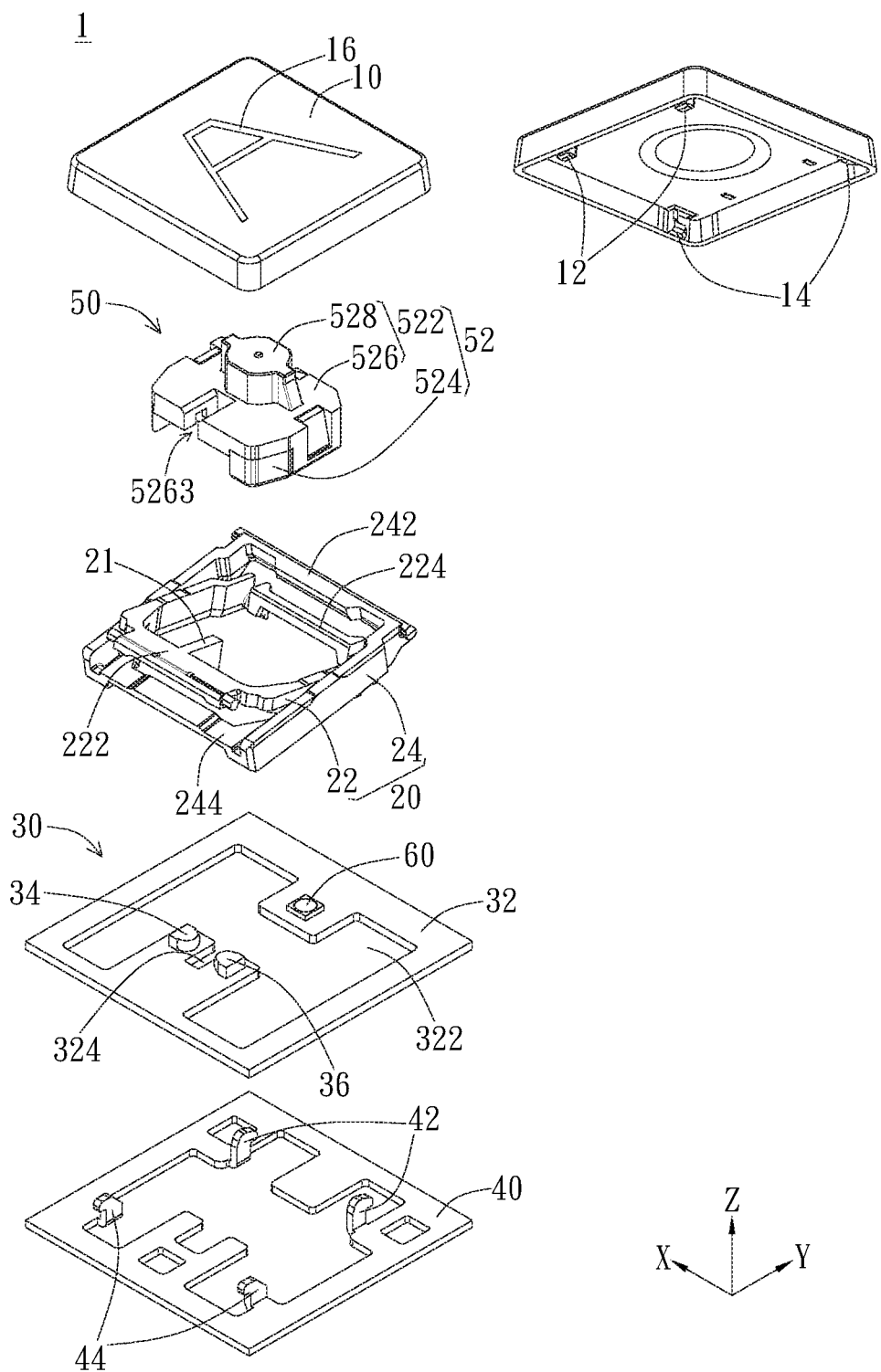
FIG. 1A is an exploded view of a first embodiment of the optical keyswitch of the invention.
Figure 1B:
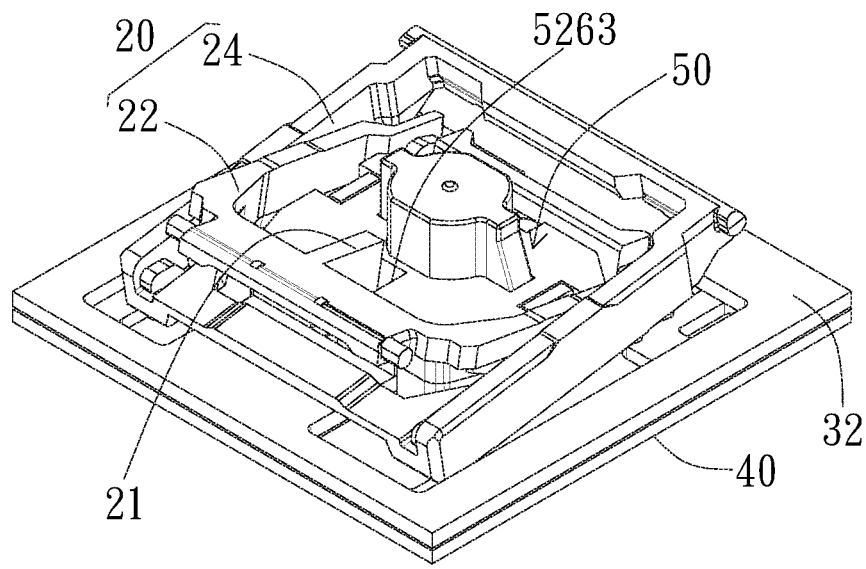
FIG. 1B is a schematic view of the optical keyswitch of FIG. 1A without the keycap.
Figure 1C:
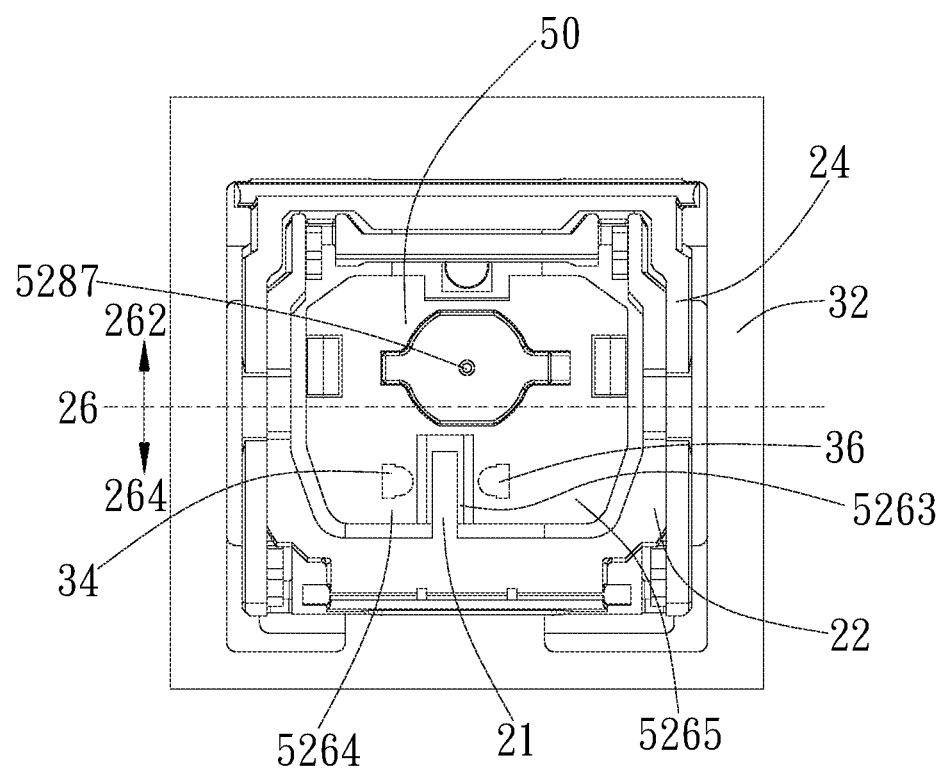
FIG. 1C is a top view of FIG. 1B.
Figure 1D:
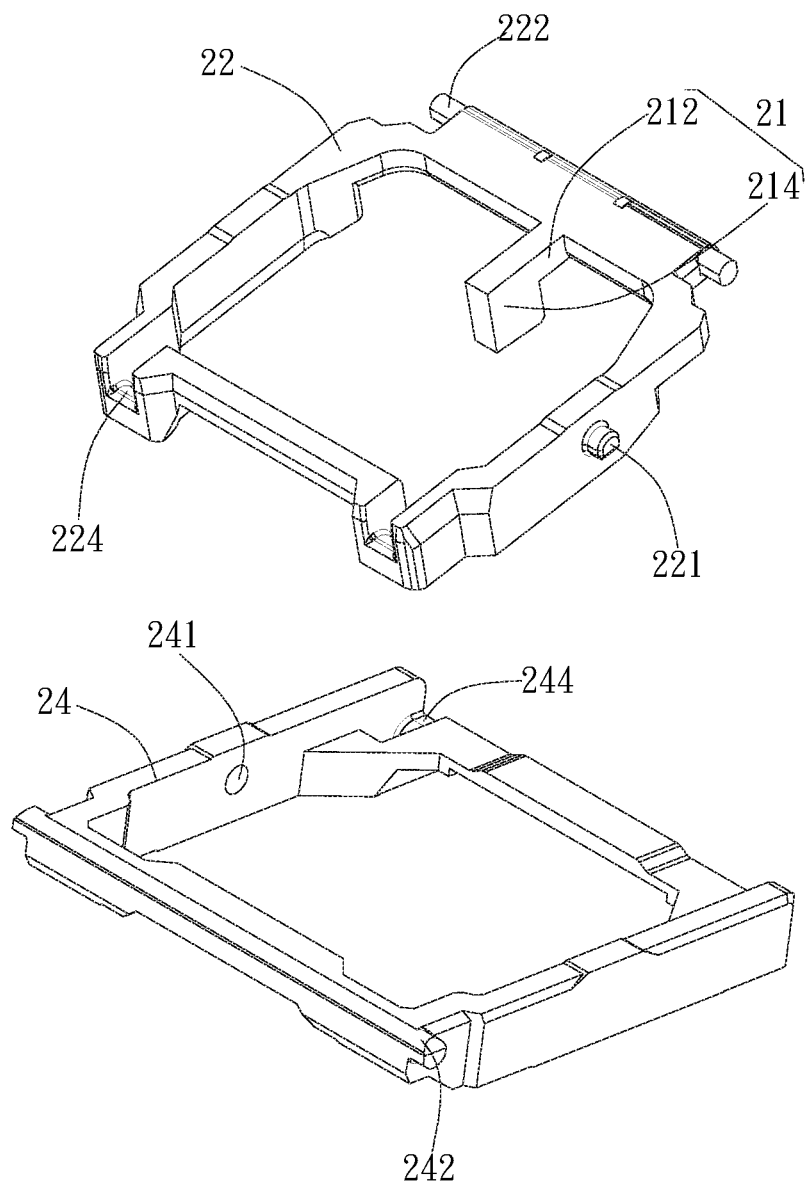
FIG. 1D is an exploded view of the support mechanism of FIG. 1A from a different viewing angle.
Figure 1E:
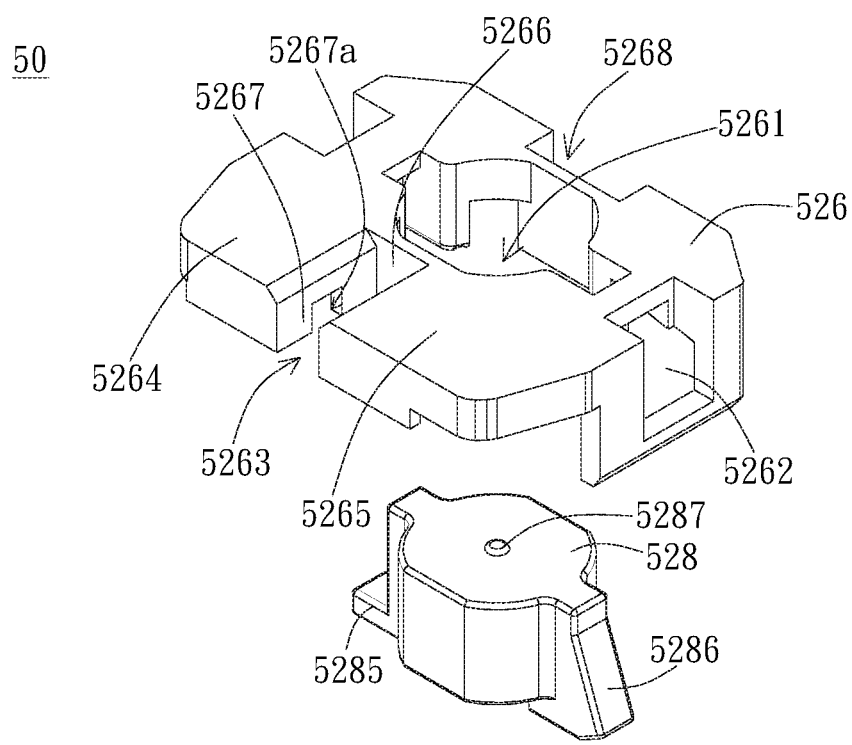
FIG. 1E is an exploded view of the restoring mechanism of FIG. 1A.
Figure 1E:
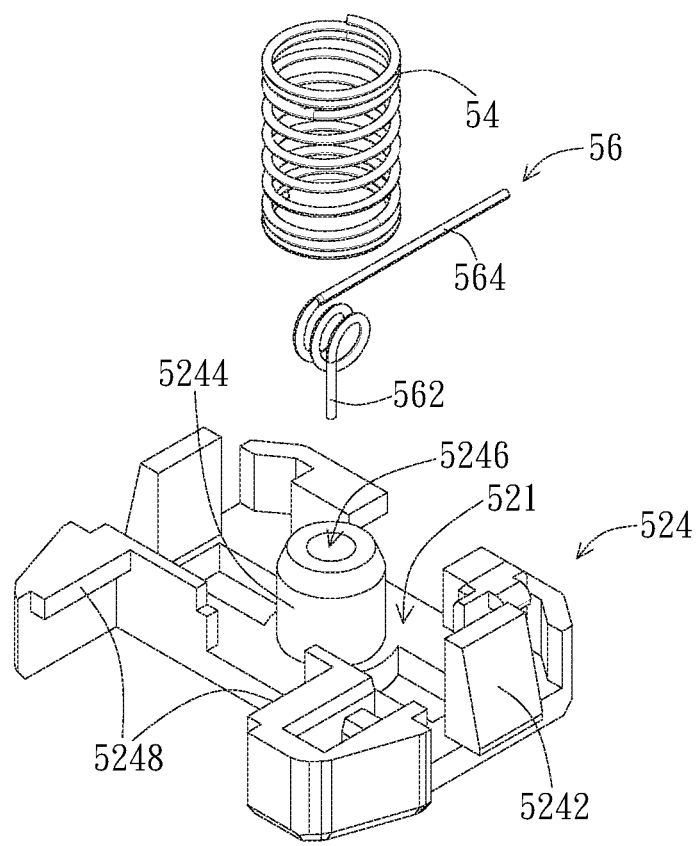
Figure 1F:
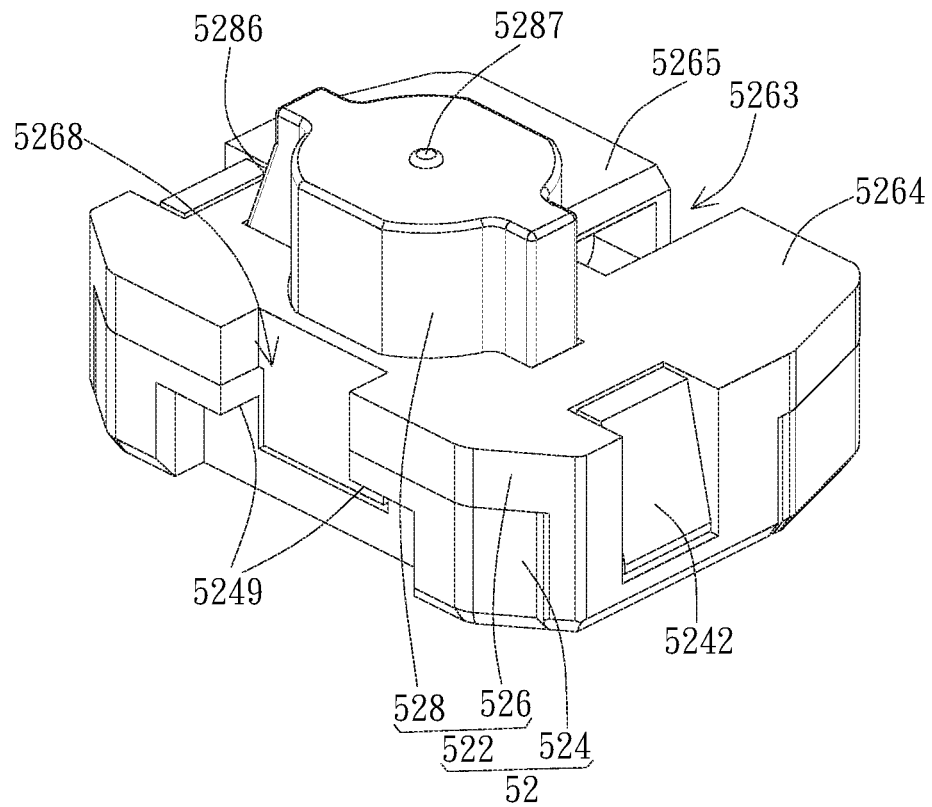
FIG. 1F is a schematic view of the restoring mechanism of FIG. 1A from a different viewing angle.
Figure 1G:
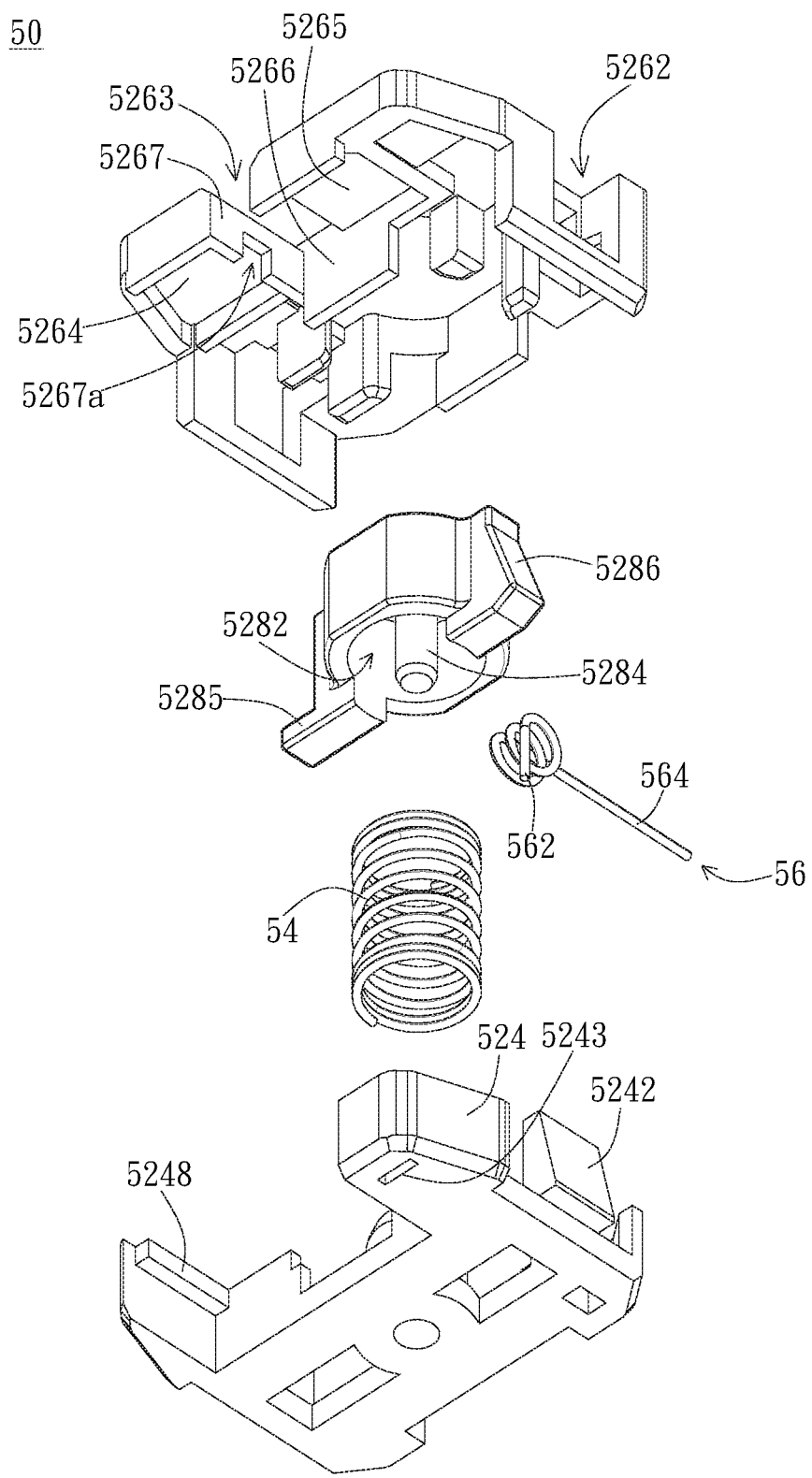
FIGS. 1G and 1H are an exploded bottom view and a schematic bottom view of the restoring mechanism of FIG. 1A, respectively.

FIG. 1A to FIG. 4B are schematic views of a first embodiment of the invention, wherein FIG. 1A is an exploded view of the first embodiment of the optical keyswitch of the invention, FIG. 1B is a schematic view of the optical keyswitch of FIG. 1A without the keycap, and FIG. 1C is a top view of FIG. 1B. As shown in FIGS. 1A to 1C, an optical keyswitch 1 in the first embodiment includes a keycap 10, a support mechanism 20, and a switch module 30. The support mechanism 20 is disposed below the keycap 10 and configured to support the keycap 10 moving upward and downward. The support mechanism 20 has a protrusion 21. The switch module 30 includes a circuit board 32, an emitter 34, and a receiver 36. The emitter 34 and the receiver 36 are electrically connected to the circuit board 32, and the emitter 34 emits an optical signal to the receiver 36. When the keycap 10 is not pressed, the receiver 36 receives the optical signal of a first intensity. When the keycap 10 is pressed, the protrusion 21 is driven by the keycap 10 to move along with the keycap 10, and the protrusion 21 changes the optical signal received by the receiver 36 to have a second intensity different from the first intensity, so that the switch module 30 is triggered to generate a triggering signal. In addition, the optical keyswitch 1 may further includes a baseplate 40, a restoring mechanism 50, and a backlight source 60 (described later).

Particularly, the keycap 10 can be, for example, an injection-molded rectangular keycap. The keycap 10 has coupling members 12 and 14 formed on its bottom surface to couple the support mechanism 20. In an embodiment, the coupling member 12 can be a coupling structure with a pivotal hole, and the coupling member 14 can be a coupling structure with a groove. Moreover, according to practical applications, the keycap 10 may be a keycap with a light-transparent portion 16 to be implemented to a luminous keyboard. For example, the light-transparent portion 16 can be in a form of pattern, such as alphabets, numbers, or any suitable characters, to indicate the instruction inputted through the keyswitch.

The baseplate 40 is disposed below the keycap 10 and extends horizontally beyond the keycap 10. For example, the baseplate 40 can be a support plate to enhance the structural strength of the optical keyswitch 1. The baseplate 40 has connection members 42 and 44 for coupling the support mechanism 20. In an embodiment, the baseplate 40 is a metal plate formed by stamping. The connection members 42 and 44 are hook-like portions protrudingly bent from the baseplate 40 toward the keycap 10. It is noted that when the circuit board 32 has sufficient structural strength, the connection members 42 and 44 can be alternatively disposed on the circuit board 32 to omit the baseplate 40.

Referring to FIG. 1A to FIG. 1D, FIG. 1D is an exploded view of the support mechanism of FIG. 1A from a different viewing angle. As shown in the figures, the support mechanism 20 preferably includes an inner frame 22 and an outer frame 24. The inner frame 22 is pivotally connected to an inner side of the outer frame 24 to form a scissor-like support mechanism. For example, the inner frame 22 and the outer frame 24 are injection-molded rectangular frames, and the inner frame 22 and the outer frame 24 are rotatably connected to each other by a combination of pivotal rod and pivotal hole. For example, the inner frame 22 has pivotal rods 221, which are located at two opposite outer sides of its middle section and protrude outward. The outer frame 24 has pivotal holes 241, which are located at two opposite inner sides and correspond to the pivotal rods 221, respectively. Therefore, the inner frame 22 and the outer frame 24 couple with each other and rotate about a scissor axis 26 (i.e. a connection line of the two pivotal rods 221). Moreover, two ends of the inner frame 22 and the outer frame 24 are movably connected to the keycap 10 and the baseplate 40, respectively. For example, the keycap end 222 of the inner frame 22 is rotatably connected to the coupling member 12 of the keycap 10, and the baseplate end 224 of the inner frame 22 is movably connected to the connection member 42 of the baseplate 40. Similarly, the keycap end 242 of the outer frame 24 is movably connected to the coupling member 14 of the keycap 10, and the baseplate end 244 of the outer frame 24 is movably connected to the connection member 44 of the baseplate 40. As such, the support mechanism 20 is connected to the keycap 10 and the baseplate 40 and supports the keycap 10 stably moving upward and downward relative to the baseplate 40.

The protrusion 21 is disposed on the inner frame 22 and extends from an inner side of the inner frame 22 toward an inner direction of the inner frame 22. For example, the protrusion 21 is preferably disposed on the inner side of the keycap end 222 of the inner frame 22. The protrusion 21 is preferably an L-shaped protrusion rod, which includes a horizontal portion 212 extending from the inner frame 22 toward the frame center horizontally and a vertical portion 214 extending downward from an end portion of the horizontal portion 212.

The circuit board 32 is preferably disposed on the baseplate 40. The circuit board 32 has openings 322 allowing the connection members 42, 44 of the baseplate 40 passing therethrough to couple with the support mechanism 20. The emitter 34 and the receiver 36 are disposed on the circuit board 32, and electrically connected to the circuit board 32. Particularly, the circuit board 32 has a switch circuit, and the emitter 34 and the receiver 36 are electrically connected to the switch circuit, so that the emitter 34 can emit the optical signal toward the receiver 36. When the intensity of the optical signal received by the receiver 36 changes, the switch module 30 is triggered to generate the triggering signal. For example, the emitter 34 can be any suitable emitters, which can emit optical signal of suitable wavelength, and the optical signal emitted by the emitter 34 can include electromagnetic waves, infrared rays, or visible lights. The receiver 36 can be any suitable receivers, which can correspondingly receive the optical signal. The circuit board 32 preferably has a receiving space 324 for allowing the protrusion 21 to pass therethrough. For example, the receiving space 324 can be a receiving groove opened on the circuit board 32, and the emitter 34 and the receiver 36 are disposed on two opposite sides of the receiving groove, so that an intensity adjustment space 52b (shown in FIG. 2A) is formed between the emitter 34 and the receiver 36.

Moreover, in response to the disposition of the backlight source 60, the circuit board 32 preferably has a light source circuit for driving the backlight source 60. The backlight source 60 can be disposed on the circuit board 32 and electrically connected to the light source circuit of the circuit board 32 to emit light out of the light-transparent portion 16 of the keycap 10. In an embodiment, the backlight source 60 is preferably a light-emitting diode, and the wavelength of the light emitted from the backlight source 60 is preferably different from the wavelength of the optical signal emitted from the emitter 34, so as to reduce interference, but not limited thereto. The backlight source 60 is preferably disposed on the opposite side of the emitter 34 and the receiver 36. The backlight source 60, the emitter 34, and the receiver 36 are preferably all within a vertical projection area of the inner frame 22 on the baseplate 40. For example, the emitter 34 and the receiver 36 are disposed corresponding to the protrusion 21 and neighboring the keycap end 222 of the inner frame 22, and the backlight source 60 is correspondingly disposed neighboring the baseplate end 224 of the inner frame 22.

Referring to FIGS. 1A to 1C and FIGS. 1E to 1H, in an embodiment, the restoring mechanism 50 is disposed below the keycap 10 and configured to provide a restoring force to enable the keycap 10 to return to a non-pressed position after the keycap 10 is released from the pressing force. Specifically, the restoring mechanism 50 is disposed between the keycap 10 and the baseplate 40 (or the circuit board 32), and the restoring mechanism 50 includes a casing 52 and a resilient member 54. The casing 52 has an accommodation space 521, and the resilient member 54 is disposed in the accommodation space 521. In this embodiment, the resilient member 54 is a spring to provide a mechanical tactile feedback. The casing 52 includes an upper casing 522 and a lower casing 524, which are combined to enclose the accommodation space 521. The upper casing 522 includes an upper casing body 526 and a movable part 528. The movable part 528 is movably coupled to the upper casing body 526. Specifically, the upper casing body 526 has a through hole 5261 and an upper engaging portion 5262. The movable part 528 is movably inserted into the through hole 5261 to position the resilient member 54 and functions as an actuator when the keycap 10 is pressed. The lower casing 524 has a lower engaging portion 5242 for engaging the upper engaging portion 5262 to combine the upper casing 522 and the lower casing 524. In an embodiment, the upper engaging portion 5262 can be slots formed on two opposite sides of the upper casing body 526, and the lower engaging portion 5242 can be corresponding protrudent portions, but not limited thereto. According to practical applications, the upper engaging portion 5262 can be protrudent portions formed on the upper casing body 526, and the lower engaging portion 5242 can be corresponding slots.

Figure 1H:
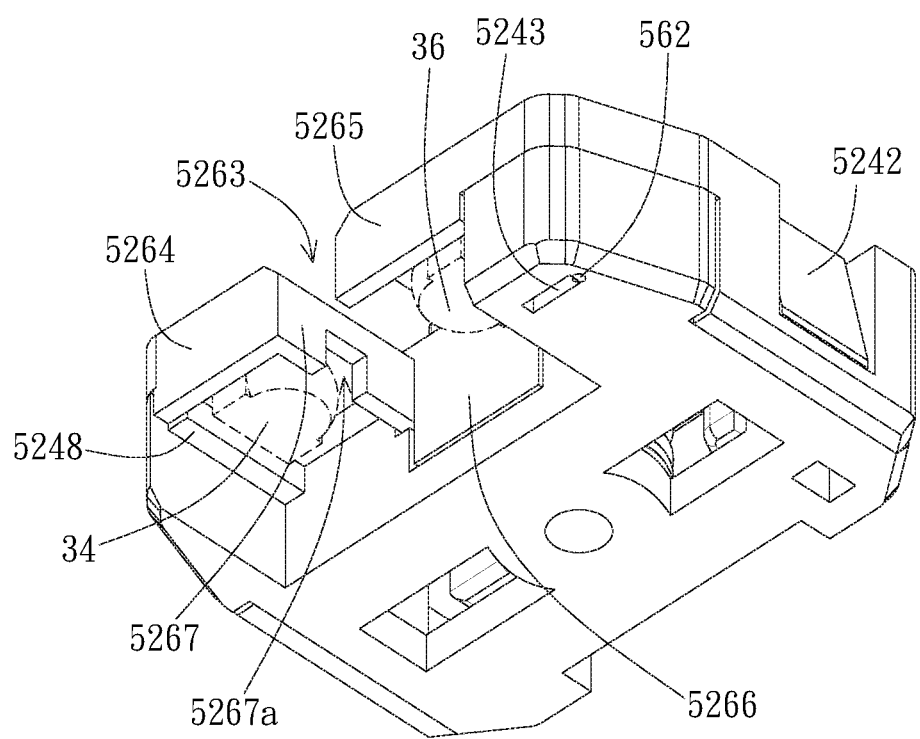

Specifically, the upper casing body 526 is preferably a rectangular cover with an open region 5263. The upper engaging portions 5262 are preferably disposed on two sides with respect to the open region 5263, so that a left arm portion 5264 is formed between the left upper engaging portion 5262 and the open region 5263, and a right arm portion 5265 is formed between the right upper engaging portion 5262 and the open region 5263. When the restoring mechanism 50 is disposed on the circuit board 32, the emitter 34 and the receiver 36 are preferably covered by the casing 52 for dust-protection and interference reduction. For example, the emitter 34 and the receiver 36 are respectively located on two opposite sides with respect to the open region 5263 and covered by the upper casing body 526. In an embodiment, the lower casing 524 has a substantially U-shaped horizontal cross section. The left arm portion 5264 and the right arm portion 5265 of the upper casing body 526 protrude toward each other, from two sides of the substantially U-shaped horizontal cross section, beyond the lower casing 524. In other words, the vertical projections of the left arm portion 5264 and the right arm portion 5265 of the upper casing body 526 at least partially exceed the vertical projection of the lower casing 524, so as to form the open region 5263 between the left arm portion 5264 and the right arm portion 5265. As shown in FIG. 1H, the emitter 34 and the receiver 36 are respectively positioned beneath the left arm portion 5264 and the right arm portion 5265 for dust-protection, but not limited thereto. In other embodiments, by modifying design of the lower casing 524, the emitter 34 and the receiver 36 can be positioned beneath lateral portions of the U-shaped horizontal cross section of the lower casing 524, so as to be covered by the lower casing 524. Moreover, the upper casing body 526 has a sidewall 5266 adjacent to the open region 5263. The accommodation space 521 is separated from the open region 5263 by the sidewall 5266, so that when the keycap 10 is pressed, the protrusion 21 moves outside the casing 52. That is, when the keycap 10 is pressed, the protrusion 21 preferably moves outside the accommodation space 521, which is enclosed by the upper casing 522 and the lower casing 524.

In an embodiment, the movable part 528 is preferably a barrel-like object to define a positioning space 5282 on the bottom of the movable part 528 and has a positioning post 5284 extending axially along the barrel-like object. The movable part 528 has a restricting portion 5285 and an acting portion 5286 on two opposite sides of the barrel-like object. The restricting portion 5285 is configured to restrict the movement of the movable part 528 relative to the upper casing body 526. The acting portion 5286 is configured to work with the tactile resilient member 56 to provide tactile feedback (described later). In an embodiment, the restricting portion 5285 can be a hook-like portion extending radially outward from the movable part 528, and the acting portion 5286 can be an inclined face inclining outward from up to down. The movable part 528 further has a protrudent bump 5287 on top center of the barrel-like object to serve as a contact point with the keycap 10.

The lower casing 524 further has a coupling portion 5244 configured to position the resilient member 54. In an embodiment, the coupling portion 5244 protrudes corresponding to the movable part 528 from the surface of the lower casing 524 toward the upper casing 522. A guiding groove 5246 is formed at the inner side of the coupling portion 5244 along the extending direction of the coupling portion 5244. When assembling the restoring mechanism 50, the spring-type resilient member 54 is sleeved on the outer side of the coupling portion 5244, and the positioning post 5284 of the movable part 528 extends into the guiding groove 5246 of the lower casing 524, so that the top end of the resilient member 54 is received in the positioning space 5282, and the lower end of the resilient member 54 is positioned between the movable part 528 and the coupling portion 5244. Then, the upper engaging portion 5262 of the upper casing body 526 engages with the lower engaging portion 5242 of the lower casing 524, so that the top end of the movable part 528 extends out of the through hole 5261 of the upper casing body 526, and the resilient member 54 is positioned between the movable part 528 and the lower casing 524 by the coupling portion 5244 and the positioning post 5284. When the keycap 10 is pressed, the movable part 528 moves downward along the guiding groove 5246 relative to the upper casing body 526, so as to compress the resilient member 54. When the keycap 10 is released, the resilient member 54 provides the resilient force, so that the movable part 528 as well as the keycap 10 are driven by the resilient force to move upward relative to the upper casing body 526 and positioned at the non-pressed position by the restricting portion 5285.

In an embodiment, the lower casing 524 further has wing portions 5248 and 5249. The restoring mechanism 50 is positioned on the circuit board 32 by the wing portions 5248 and 5249. Specifically, the wing portions 5248 and 5249 are preferably disposed on two opposite sides of the lower casing 524. For example, the wing portion 5248 is leaned on the circuit board 32 neighboring the emitter 34 and the receiver 36, and the wing portion 5249 is leaned on the circuit board 32 neighboring the backlight source 60. In an embodiment, the wing portion 5248 can be a pair of supporting arms of the lower casing 524, which protrude toward each other and are respectively located corresponding to the emitter 34 and the receiver 36 below the left arm portion 5264 and the right arm portion 5265. The wing portion 5249 can be a pair of protruding blocks with concaves of the lower casing 524. For example, the protruding blocks protrude horizontally form the lower casing 524 toward each other and recess from the bottom surface of the lower casing 524 to form the concaves. The upper casing body 526 has an opening 5268 corresponding to the wing portion 5249, and the backlight source 60 is disposed corresponding to the opening 5268. As such, the light emitted from the backlight source 60 can be blocked by the restoring mechanism 50 and less likely to influence the intensity of the optical signal received by the receiver 36, so as to reduce the possibility that the switch module 30 is triggered to generate a false triggering signal.

In an embodiment, the restoring mechanism 50 further includes a tactile resilient member 56 for providing a tactile feedback when the keycap 10 is pressed. For example, the tactile resilient member 56 can be implemented as a torsion spring, wherein one end of the torsion spring acts as a positioning end 562, and the other end of the torsion spring acts as an acting end 564. The lower casing 524 correspondingly has a positioning hole 5243. When the tactile resilient member 56 is disposed on the lower casing 524, the positioning end 562 couples to the positioning hole 5243, and the acting end 564 is disposed corresponding to the acting portion 5286 of the movable part 528. In this embodiment, the acting end 564 preferably extends vertical to the scissor axis 26 (i.e., the rotation axis of the scissor-like support mechanism where the two frames are pivotally connected). When the keycap 10 is pressed, the acting portion 5286 moves downward along with the keycap 10 and generates relative displacement with respect to the acting end 564 of the torsion spring. Therefore, the acting end 564 (1) firstly slides on the bottom inclined surface of the acting portion 5286, allowing the user to feel a larger resistance, (2) then, the acting end 564 escapes from the acting portion 5286 (i.e. moves across the bottom inclined surface of the acting portion 5286), allowing the user to feel the resistance being greatly decreased. As such, a clear tactile feedback of pressing feeling can be provided to the user, and sound is generated by the acting end 564 hitting the upper casing body 526. When the keycap 10 is released, the resilient member 54 provides the restoring force to enable the keycap 10 and the movable part 528 including the acting portion 5286 to move upward, so the acting end 564 slides downward along the smoother top inclined surface (i.e. moves across the top inclined surface of the acting portion 5286) back to its original position.

Moreover, referring to FIG. 1C, the restoring mechanism 50 and the emitter 34 and the receiver 36 of the switch module 30 are all preferably located within the vertical projection of the inner frame 22 on the baseplate 40. Specifically, the restoring mechanism 50 is substantially located at a first side 262 with respect to the scissor axis 26. The emitter 34 and the receiver 36 are located at a second side 264 with respect to the scissor axis 26 opposite to first side 262. The first side 262 and the second side 264 are two opposite sides with respect to the scissor axis 26. It is noted that in this embodiment, "the restoring mechanism 50 is substantially located at the first side 262" refers that the center of the movable part 528 or the central axis of the resilient member 54, e.g. the location of the protrudent bump 5287, is located at the first side 262 and preferably neighboring the scissor axis 26, but not limited thereto.

Moreover, the casing 52 preferably has a grating portion 5267, which is disposed corresponding to the emitter 34 or the receiver 36 to define a stroke distance of generating the triggering signal when the keycap 10 is pressed. For example, the grating portion 5267 can have a gate-like structure with a slit 5267*a* and is preferably located between the emitter 34 and the receiver 36 adjacent to the emitting end of the emitter 34 or the receiving end of the receiver 36. The grating portion 5267 can control the triggering position by the size and position of the slit 5267a, so as to reduce the false triggering. For example, the possible triggering error is about the thickness of the emitter 34 and the receiver 36, and by controlling the size of the slit 5267a to correspond to (e.g. smaller than) the thickness of the emitter 34 or the receiver 36, the triggering error can be reduced. In an embodiment, the grating portion 5267 of the casing 52 is disposed on the left arm portion 5264 of the upper casing body 526 and neighbors the emitter 34, but not limited thereto. According to practical applications, in corporation with the design of the circuit board 32, the locations of the emitter 34 and the receiver 36 can be exchanged, so the emitter 34 and the receiver 36 can be located respectively beneath the right arm portion 5265 and the left arm portion 5264, and the grating portion 5267 is accordingly adjacent to the receiver 36. As such, the optical signal at the receiver 36 is less interfered by external light, and the possibility of generating a false triggering signal is effectively reduced.

Figure 2A:
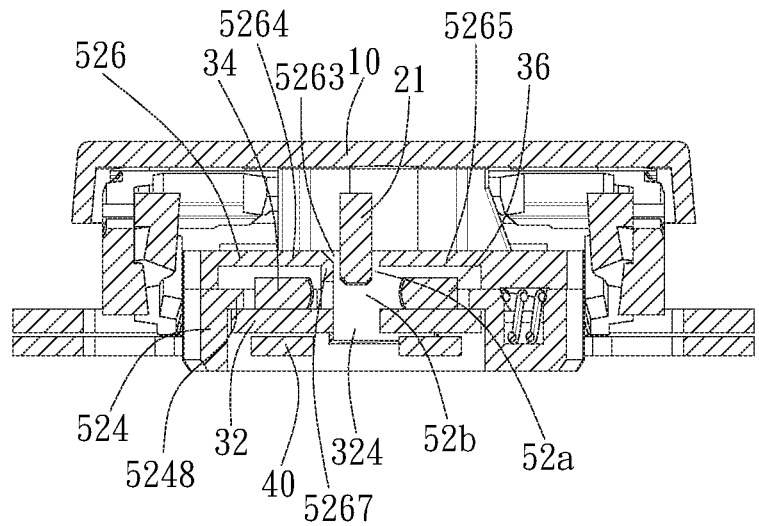
FIGS. 2A, 3A, and 4A are cross-sectional views of the optical keyswitch of the first embodiment of the invention along the X axis at the non-pressed position, the triggering position, and the lowest position, respectively.
Figure 2B:
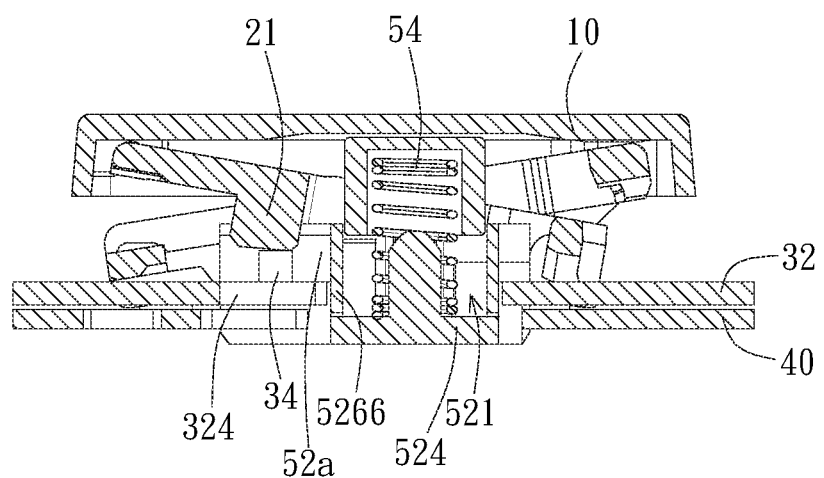
FIGS. 2B, 3B, and 4B are cross-sectional views of the optical keyswitch of the first embodiment of the invention along the Y axis at the non-pressed position, the triggering position, and the lowest position, respectively.
Figure 3A:
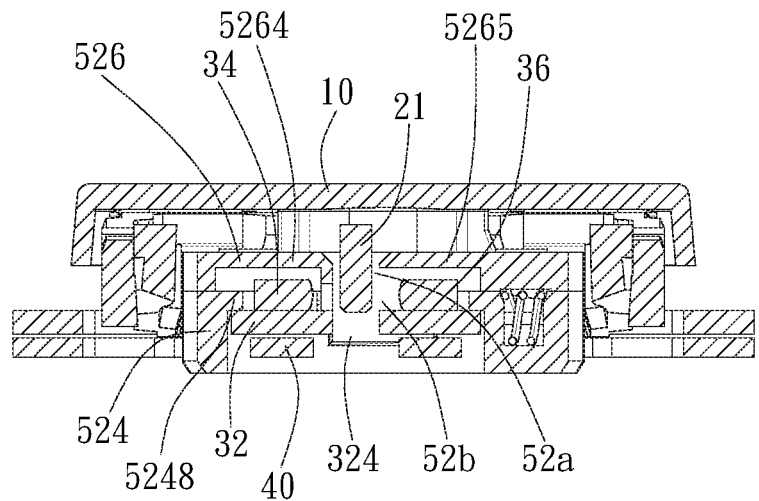
Figure 3B:
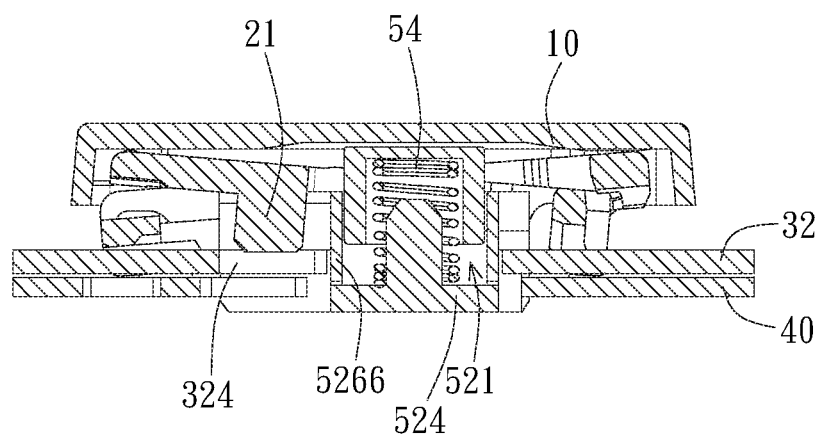
Figure 4A:
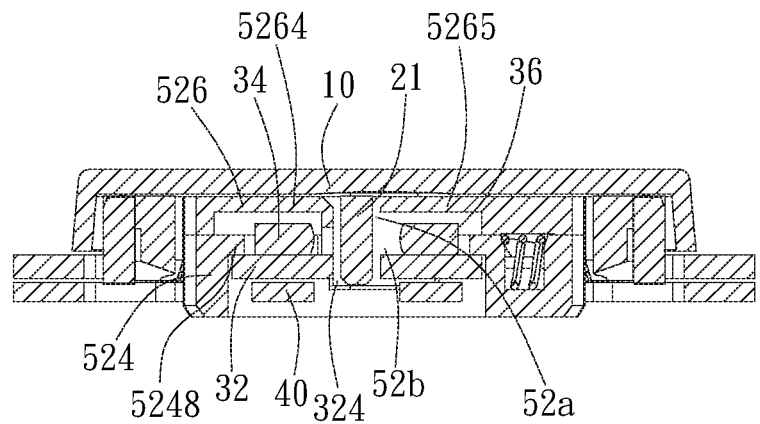
Figure 4B:
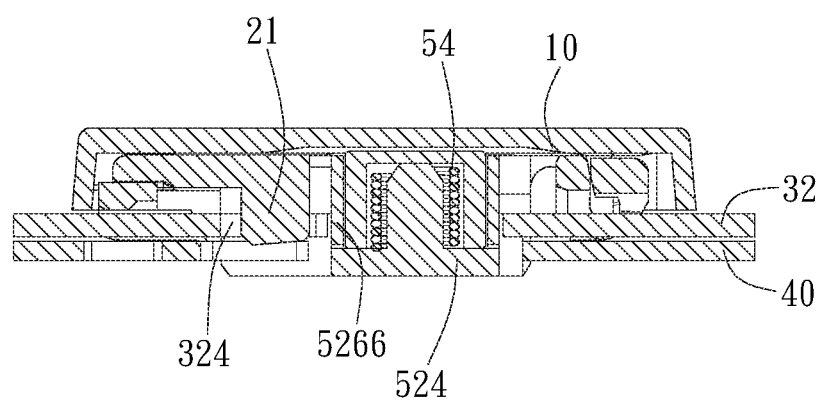

Referring to FIGS. 2A to 4B, the operation of the optical keyswitch of the first embodiment will be illustrated. FIGS. 2A, 3A, and 4A are cross-sectional views of the optical keyswitch along the X axis at the non-pressed position, the triggering position, and the lowest position, respectively. FIGS. 2B, 3B, and 4B are cross-sectional views of the optical keyswitch along the Y axis at the non-pressed position, the triggering position, and the lowest position, respectively. As shown in FIGS. 2A and 2B, the casing 52 has an up-down path 52a, and the sidewall 5266 is located between the up-down path 52a and the accommodation space 521 to separate the up-down path 52a from the accommodation space 521. In other words, the up-down path 52a is located within the open region 5263. In this embodiment, the emitter 34, the intensity adjustment space 52b, and the receiver 36 are preferably arranged sequentially along a straight optical path (e.g. arranged straightly along the X axis), and the straight optical path is substantially parallel to the scissor axis 26. When the keycap 10 is not pressed, the protrusion 21 is at a first position relative to the intensity adjustment space 52b, and the receiver 36 receives the optical signal of the first intensity, such as an intensity that the optical signal is not blocked or attenuated.

As shown in FIGS. 3A and 3B, when the keycap 10 is pressed, the protrusion 21 moves along with the keycap 10 outside the casing 52 to a second position relative to the intensity adjustment space 52b. The second position is different from the first position, and the protrusion 21 changes the optical signal received by the receiver 36 to have a second intensity different from the first intensity, so that the switch module 30 is triggered to generate the triggering signal. For example, when the keycap 10 is pressed, the inner frame 22 of the support mechanism 20 is driven by the keycap 10 to horizontally slide on the baseplate 40, so that the protrusion 21 moves downward in the up-down path 52a.

In this embodiment, the first position refers that the protrusion 21 is away from the intensity adjustment space 52b, and the protrusion 21 does not substantially change the intensity of the optical signal received by the receiver 36. The second position refers that the protrusion 21 is located in the intensity adjustment space 52b, and the protrusion 21 reduces the intensity of the optical signal received by the receiver 36, so that the second intensity is smaller than the first intensity to trigger the switch module 30 to generate the triggering signal. For example, when the protrusion 21 is driven by the keycap 10, the protrusion 21 moves to at least partially block the optical signal, so the second intensity is smaller than the first intensity, and the switch module 30 is triggered to generate the triggering signal. In an embodiment, when the protrusion 21 is driven by the keycap 10, the protrusion 21 moves to substantially completely block the optical signal, so the optical signal cannot be received by the receiver 36, i.e. the second intensity is zero. For example, the horizontal portion 212 of the protrusion 21 preferably has a length long enough to extend to the open region 5263, and the vertical portion 214 has a size large enough to substantially block the optical signal, but not limited thereto. It is noted that by modifying the circuit design of the circuit board 32, the switch module 30 can generate the triggering signal based on the variation in intensity of the optical signal received by the receiver 36, or based on whether the receiver 36 receives the optical signal.

As shown in FIGS. 4A and 4B, the up-down path 52a, the intensity adjustment space 52b, and the receiving space 324 are aligned and communicated. Therefore, when the keycap 10 is pressed, the protrusion 21 is driven by the keycap 10 to move downward in the up-down path 52a to the triggering position and further into the receiving space 324 through the intensity adjustment space 52b. As such, not only a faster triggering effect can be achieved, but also the stroke distance can be increased to enhance the tactile feedback. It is noted that according to practical applications, the baseplate 40 can also have a similar design corresponding to the receiving space 324. For example, the baseplate 40 can be recessed to have a concave portion or formed with an opening at the position corresponding to the receiving space 324. Therefore, when the keycap 10 is pressed, the protrusion 21 is driven by the keycap 10 to move downward in the up-down path 52a to the triggering position, further into the receiving space 324 through the intensity adjustment space 52b, and then into the concave portion or the opening of the baseplate 40.

Figure 5A:
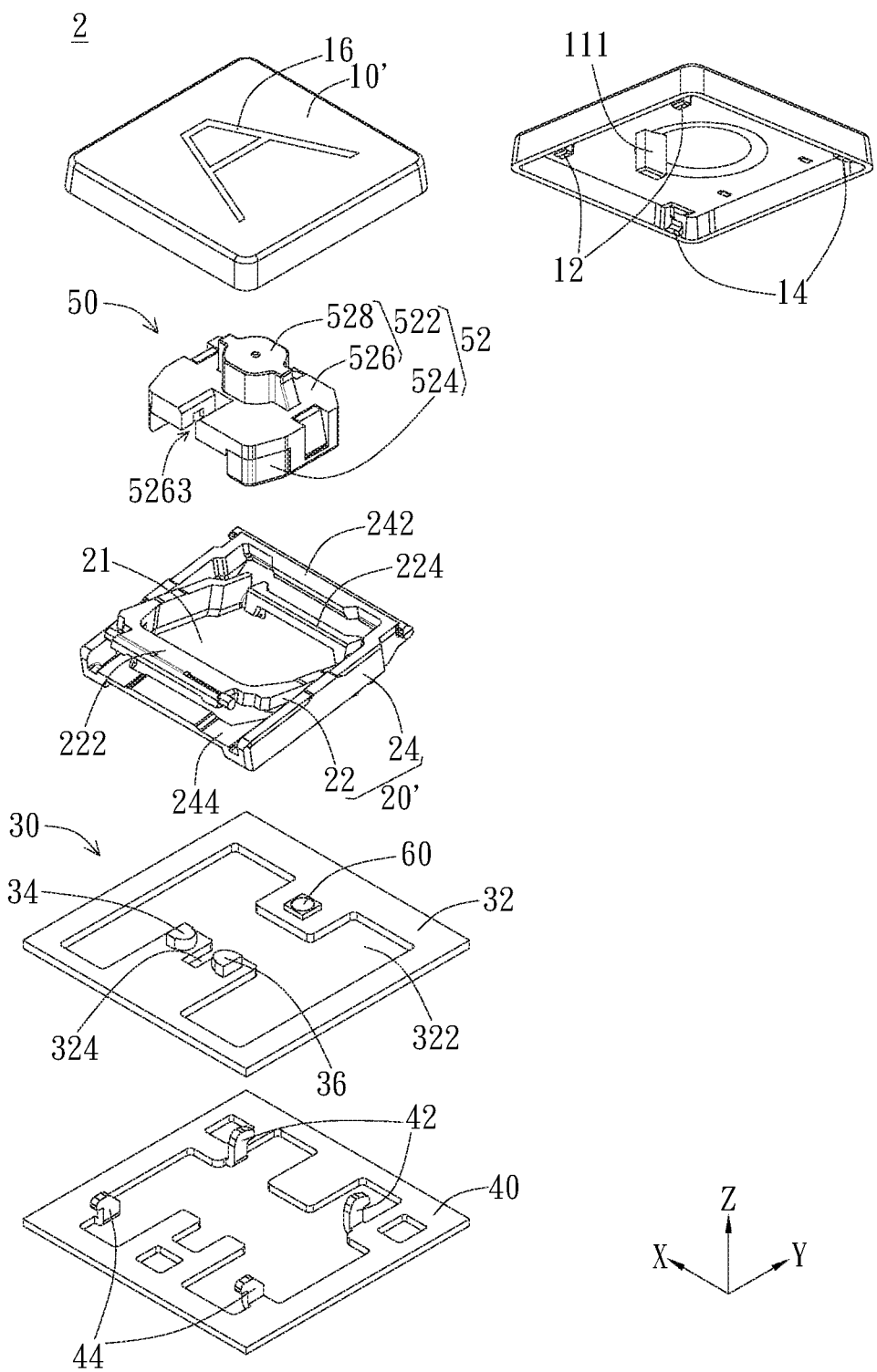
FIG. 5A is an exploded view of a second embodiment of the optical keyswitch of the invention.
Figure 5B:
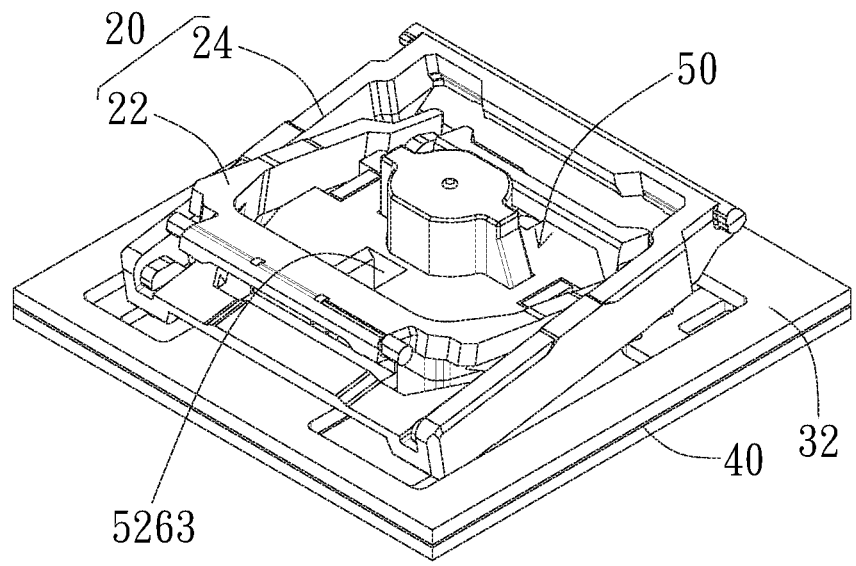
FIG. 5B is a schematic view of the optical keyswitch of FIG. 5A without the keycap.
Figure 5C:
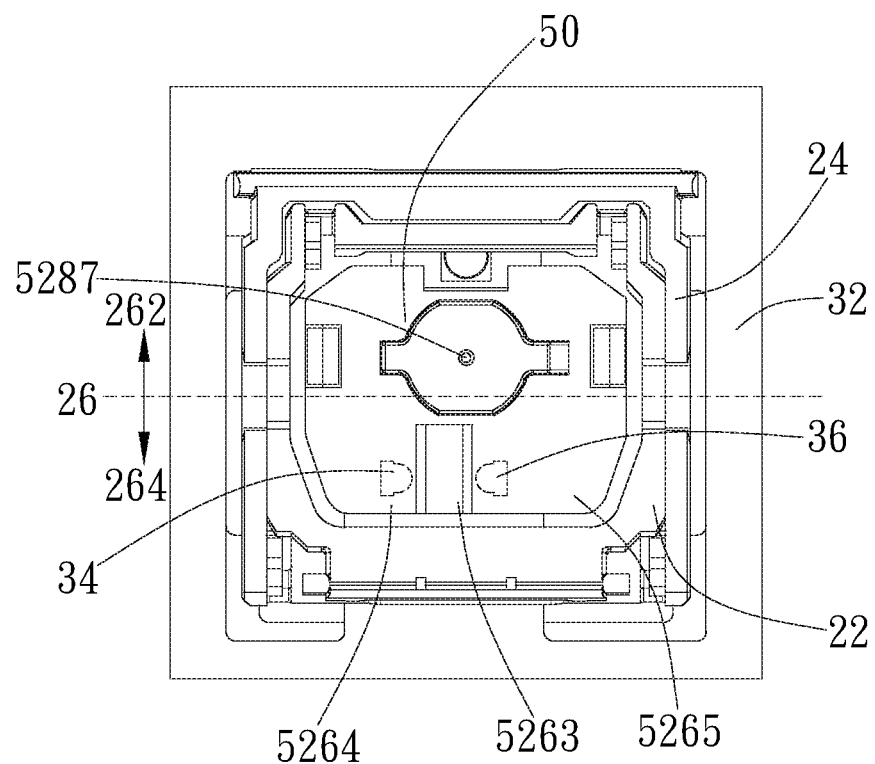
FIG. 5C is a top view of FIG. 5B.

FIG. 5A to FIG. 8B are schematic views of a second embodiment of the invention, wherein FIG. 5A is an exploded view of the second embodiment of the optical keyswitch of the invention, FIG. 5B is a schematic view of the optical keyswitch of FIG. 5A without the keycap, and FIG. 5C is a top view of FIG. 5B. As shown in the figures, in the second embodiment, the optical keyswitch 2 includes a keycap 10', a support mechanism 20', the switch module 30, and the restoring mechanism 50. The keycap 10' has a protrusion 111. The support mechanism 20' is disposed below the keycap 10' and configured to support the keycap 10' moving upward and downward. The restoring mechanism 50 is disposed below the keycap 10' and configured to provide a restoring force to enable the keycap 10' to return to a non-pressed position. The restoring mechanism 50 includes the casing 52 having the accommodation space 521 and the resilient member 54 disposed in the accommodation space 521. The switch module 30 includes the circuit board 32, the emitter 34, and the receiver 36. The emitter 34 and the receiver 36 are electrically connected to the circuit board 32, and the emitter 34 emits an optical signal to the receiver 36. The emitter 34 and the receiver 36 are spaced apart by the intensity adjustment space 52b. When the keycap 10' is not pressed, the protrusion 111 is at a first position relative to the intensity adjustment space 52b, and the receiver 36 receives the optical signal of a first intensity. When the keycap 10' is pressed, the protrusion 111 moves along with the keycap 10' outside the casing 52 to a second position relative to the intensity adjustment space 52b. The second position is different from the first position, and the protrusion 111 changes the optical signal received by the receiver 36 to have a second intensity different from the first intensity, so that the switch module 30 is triggered to generate a triggering signal.

The optical keyswitch 2 of FIG. 5A is different from the optical keyswitch 1 of FIG. 1A in that the support mechanism 20' does not have the protrusion 21, and the protrusion 111 is disposed on the lower surface of the keycap 10'. In this embodiment, the protrusion 111 is preferably a baffle extending from the lower surface of the keycap 10' and correspondingly located above the open region 5263 of the restoring mechanism 50. Other components of the optical keyswitch 2 (e.g. the switch module 30, the restoring mechanism 50, the baseplate 40, the backlight source 60) as well as other portions of the keycap 10' and the support mechanism 20' can refer to related descriptions of the optical keyswitch 1 of the first embodiment for details of structures and connections, which will not be elaborated again.

Figure 6A:
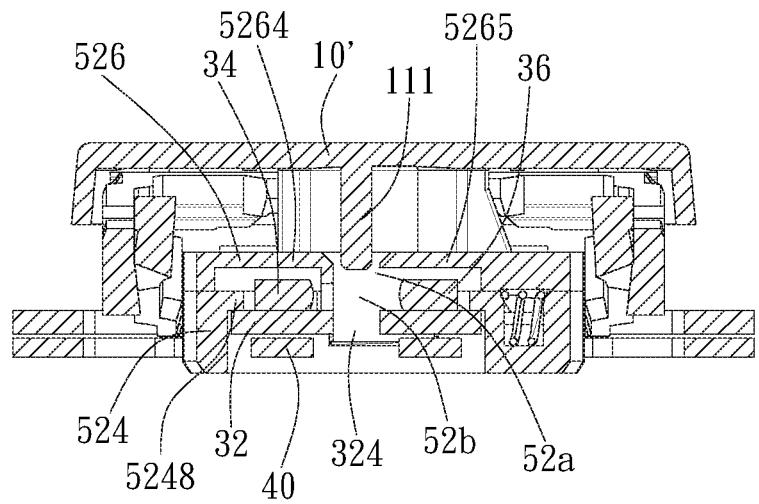
FIGS. 6A, 7A, and 8A are cross-sectional views of the optical keyswitch of the second embodiment of the invention along the X axis at the non-pressed position, the triggering position, and the lowest position, respectively.
Figure 6B:
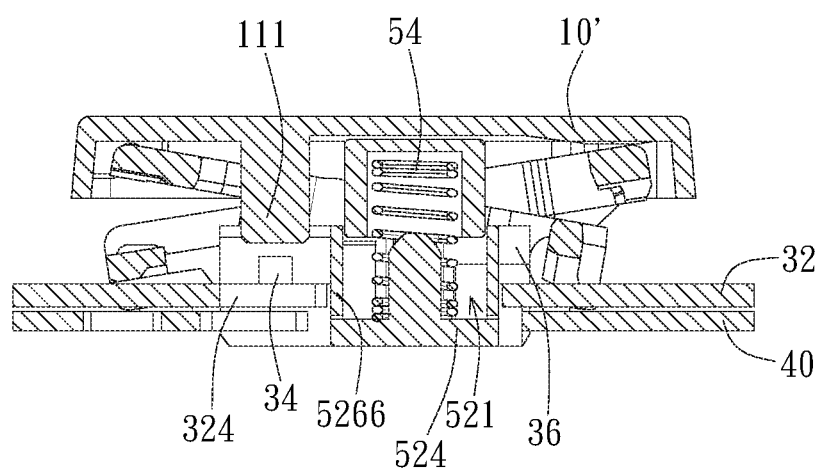
FIGS. 6B, 7B, and 8B are cross-sectional views of the optical keyswitch of the second embodiment of the invention along the Y axis at the non-pressed position, the triggering position, and the lowest position, respectively.

Referring to FIGS. 6A to 8B, the operation of the optical keyswitch of the second embodiment will be illustrated. FIGS. 6A, 7A, and 8A are cross-sectional views of the optical keyswitch along the X axis at the non-pressed position, the triggering position, and the lowest position, respectively. FIGS. 6B, 6B, and 6B are cross-sectional views of the optical keyswitch along the Y axis at the non-pressed position, the triggering position, and the lowest position, respectively. As shown in FIGS. 6A and 6B, the casing 52 has the up-down path 52a, and the sidewall 5266 is located between the up-down path 52a and the accommodation space 521 to separate the up-down path 52a from the accommodation space 521. In other words, the up-down path 52a is located within the open region 5263. In this embodiment, the emitter 34, the intensity adjustment space 52b, and the receiver 36 are preferably arranged sequentially along a straight optical path (e.g. arranged straightly along the X axis), and the straight optical path is substantially parallel to the scissor axis 26. When the keycap 10' is not pressed, the protrusion 111 is away from the intensity adjustment space 52b, and the protrusion 111 does not change the intensity of the optical signal received by the receiver 36.

Figure 7A:
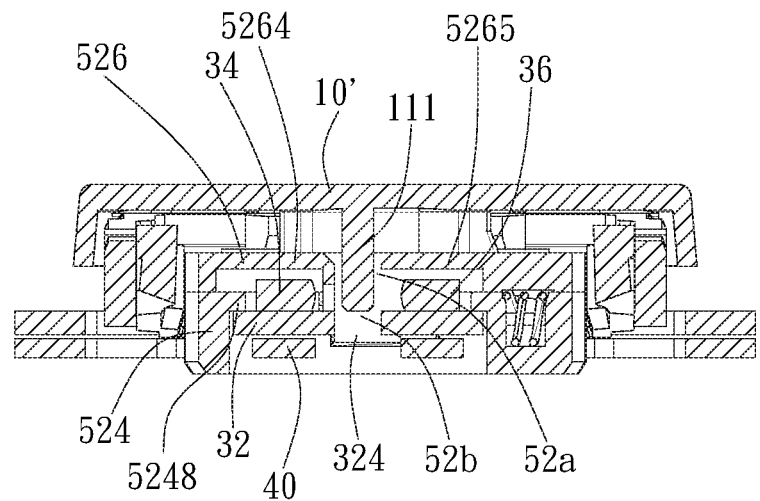
Figure 7B:
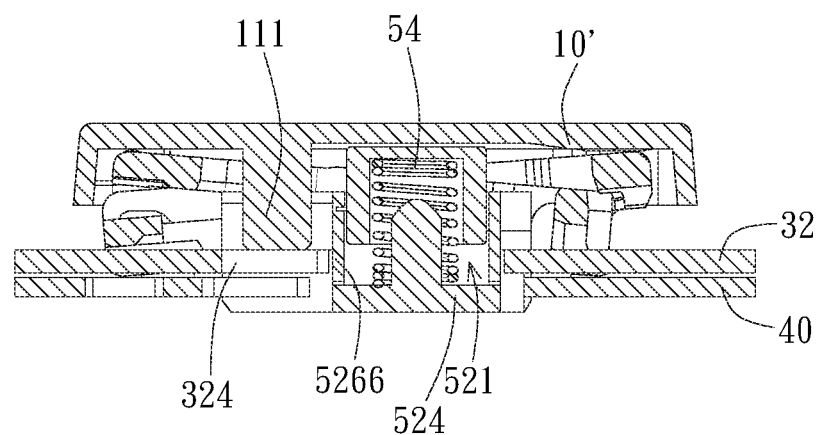

As shown in FIGS. 7A and 7B, when the keycap 10' is pressed, the protrusion 111 moves downward along with the keycap 10' in the up-down path 52a into the intensity adjustment space 52b to at least partially block the optical signal, so that the second intensity is smaller than the first intensity, and the switch module 30 is triggered to generate the triggering signal. By modifying the size (e.g. length and width) of the protrusion 111, the protrusion 111 can be designed to substantially completely or partially block the optical signal, so that the switch module 30 can generate the triggering signal based on the variation in intensity of the optical signal received by the receiver 36, or based on whether the receiver 36 receives the optical signal.

Figure 8A:
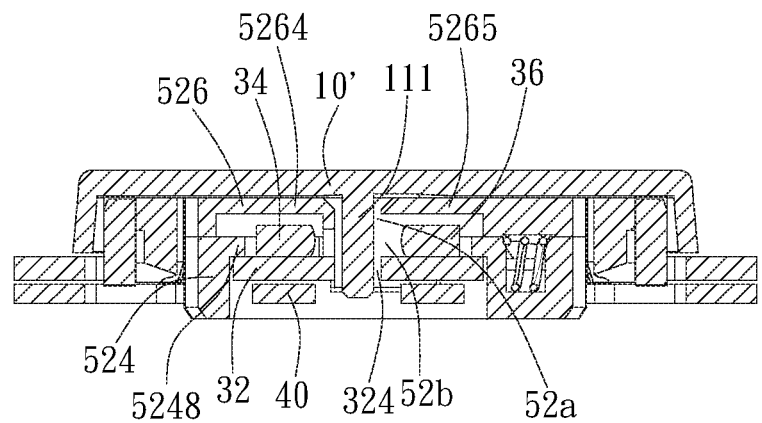
Figure 8B:
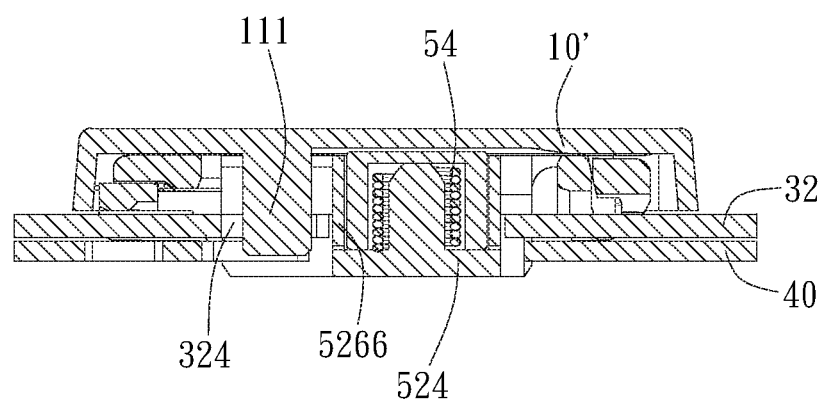

As shown in FIGS. 8A and 8B, the up-down path 52a, the intensity adjustment space 52b, and the receiving space 324 are aligned and communicated. Therefore, when the keycap 10' is pressed, the protrusion 111 moves downward along with the keycap 10' in the up-down path 52a to the triggering position and further into the receiving space 324 through the intensity adjustment space 52b. As such, not only a faster triggering effect can be achieved, but also the stroke distance can be increased to enhance the tactile feedback.

In the first and second embodiments, the optical keyswitch 1 or 2 generates the triggering signal by utilizing the protrusion 21 or 111 to directly change the receiving status of the optical signal received by the receiver 36, but not limited thereto. In other embodiments, the protrusion can work with other components to change the receiving status of the optical signal received by the receiver 36 so as to generate the triggering signal.

Figure 9A:
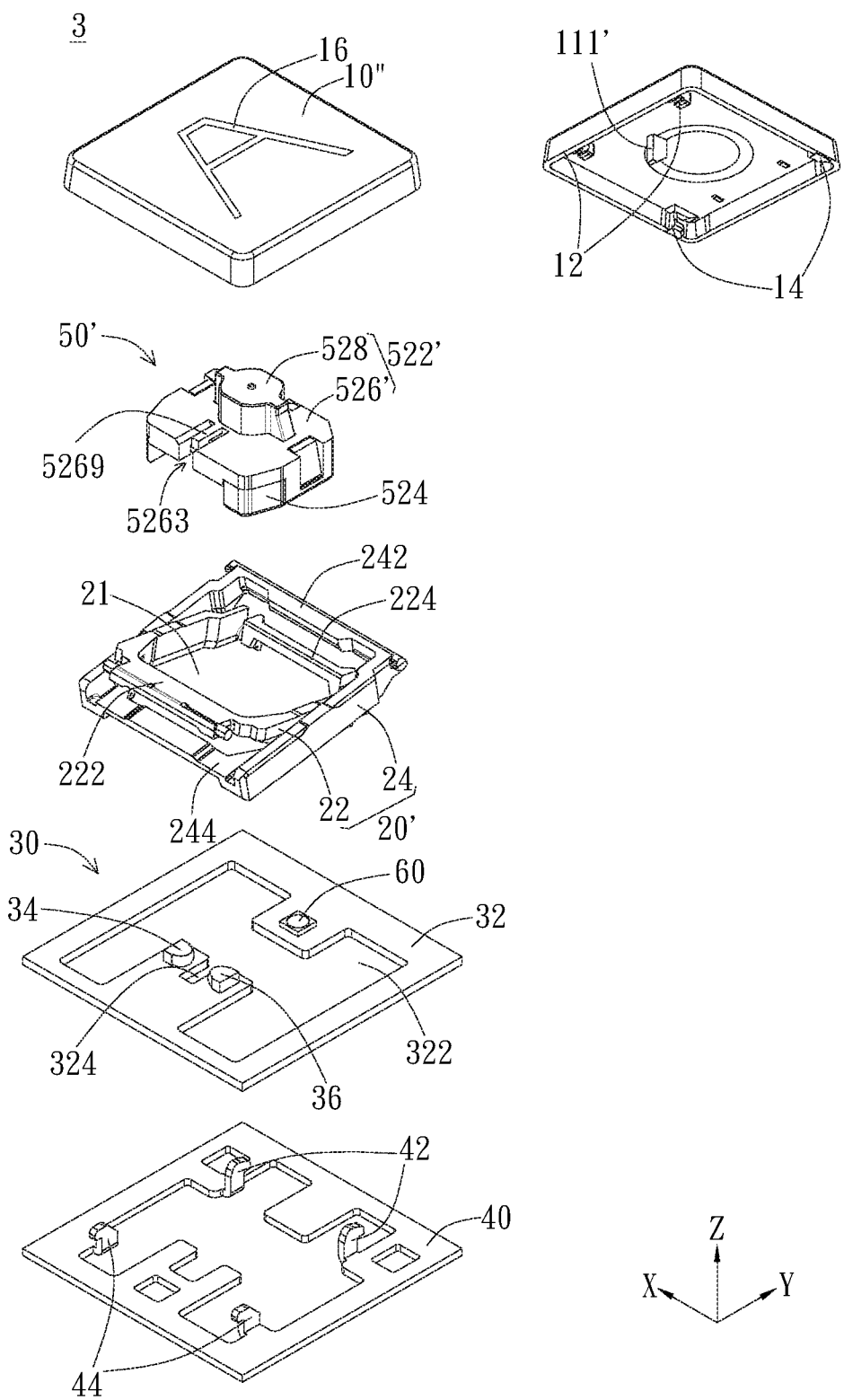
FIG. 9A is an exploded view of a third embodiment of the optical keyswitch of the invention.
Figure 9B:
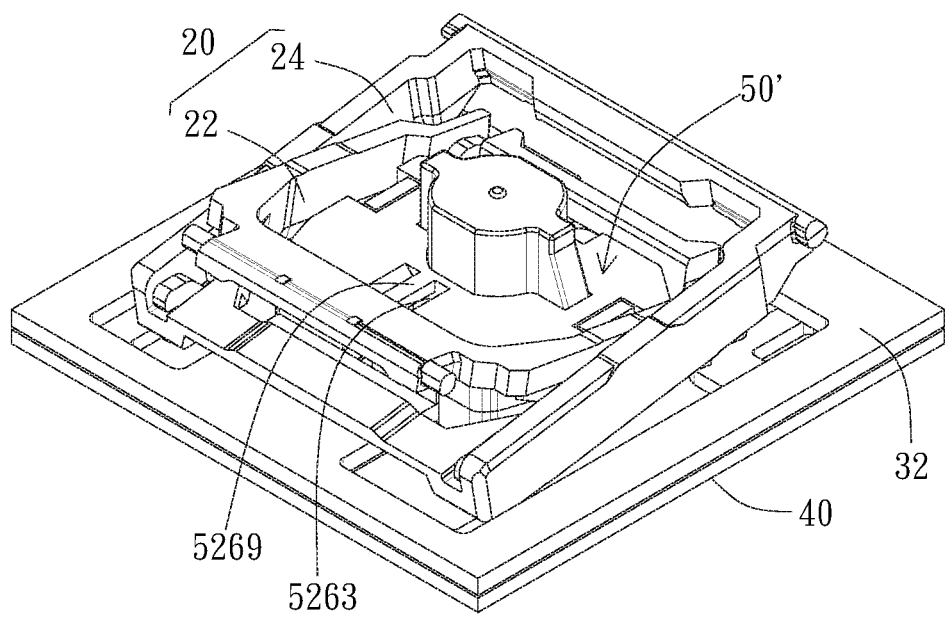
FIG. 9B is a schematic view of the optical keyswitch of FIG. 9A without the keycap.
Figure 9C:
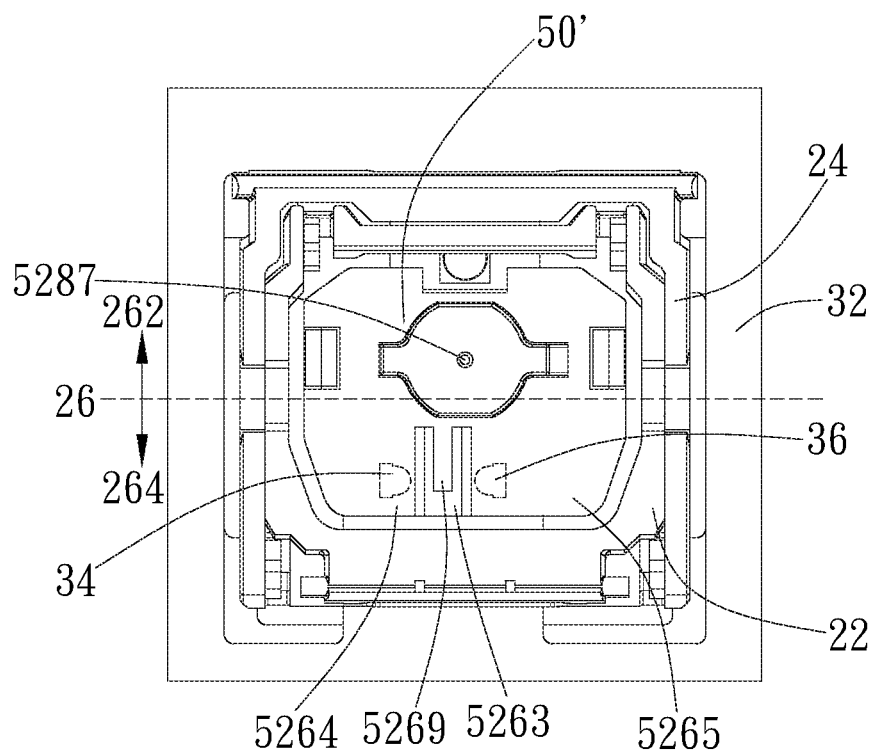
FIG. 9C is a top view of FIG. 9B.
Figure 9D:
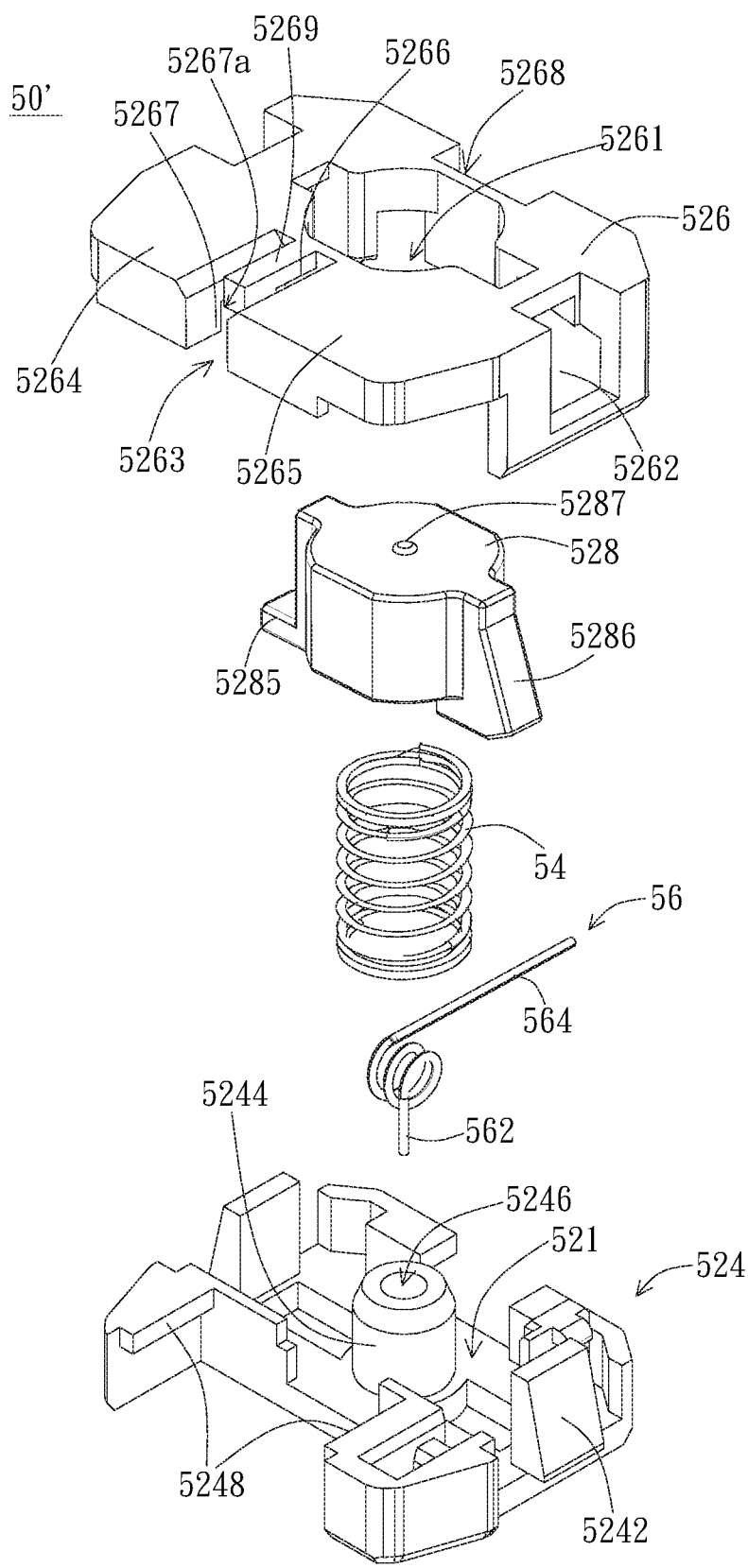
FIG. 9D is an exploded view of the restoring mechanism of FIG. 9A.

FIG. 9A is an exploded view of a third embodiment of the optical keyswitch of the invention. FIG. 9B is a schematic view of the optical keyswitch of FIG. 9A without the keycap. FIG. 9C is a top view of FIG. 9B. FIG. 9D is an exploded view of the restoring mechanism of FIG. 9A. As shown in the figures, in the third embodiment, the optical keyswitch 3 includes a keycap 10", the support mechanism 20', the switch module 30, the baseplate 40, and a restoring mechanism 50'. The details of the support mechanism 20', the switch module 30, and the baseplate 40 can refer to the related descriptions of the first and second embodiments. Hereinafter, the difference between the third embodiment and the foregoing embodiments will be explained.

Specifically, the keycap 10" has a protrusion 111' extending downward from the lower surface of the keycap 10". In an embodiment, the protrusion 111' preferably has a tapered end portion with a sloped surface 1111 and a horizontal surface 1112. The restoring mechanism 50' is different from the restoring mechanism 50 of the first embodiment in that the upper casing 522' has a deformable portion 5269. The deformable portion 5269 extends from the upper casing 522' and corresponds to the protrusion 111'. For example, the deformable portion 5269 is a flexible protrusion extending from the upper casing body 526' to above the open region 5263. In other words, the deformable portion 5269 can be an L-shaped flexible arm, which extends from the upper side of the sidewall 5266 to horizontally above the open region 5263, so that the deformable portion 5269 is located between the left arm portion 5264 and the right arm portion 5265 of the upper casing body 526'. It is noted that the details of other portions (parts) of the restoring mechanism 50' can refer to the related descriptions of the restoring mechanism 50 of the first embodiment, and will not elaborate again.

Figure 10A:
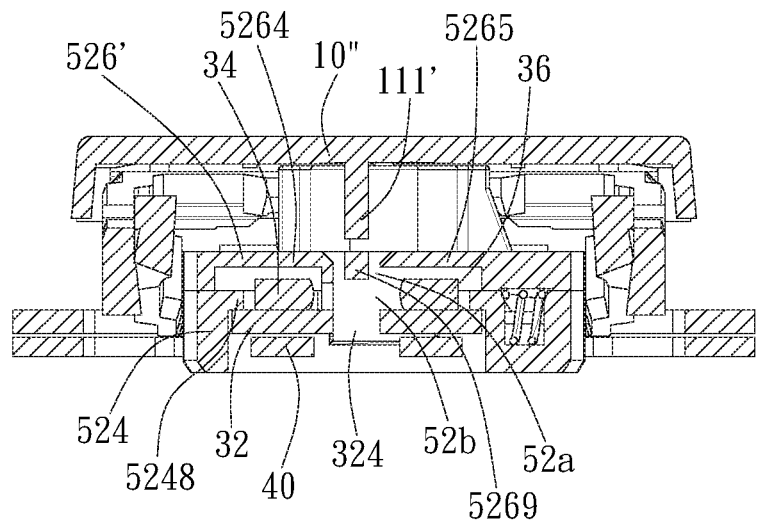
FIGS. 10A and 11A are cross-sectional views of the optical keyswitch of the third embodiment of the invention along the X axis at the non-pressed position and the triggering position, respectively.
Figure 10B:
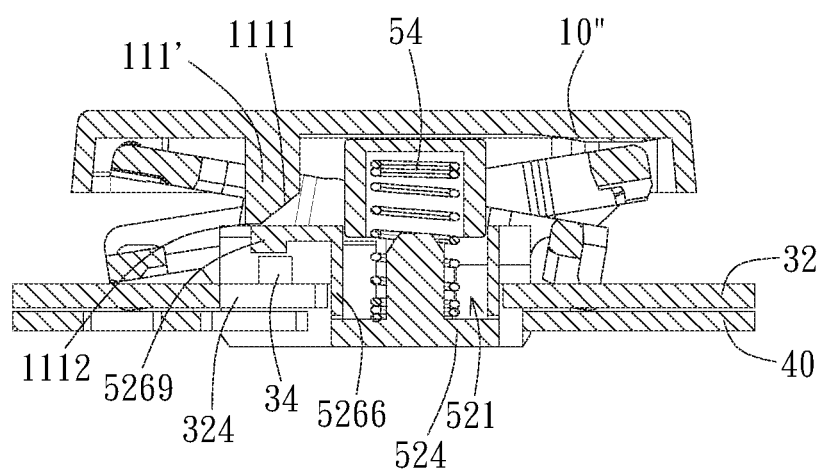
FIGS. 10B and 11B are cross-sectional views of the optical keyswitch of the third embodiment of the invention along the Y axis at the non-pressed position and the triggering position, respectively.
Figure 11A:
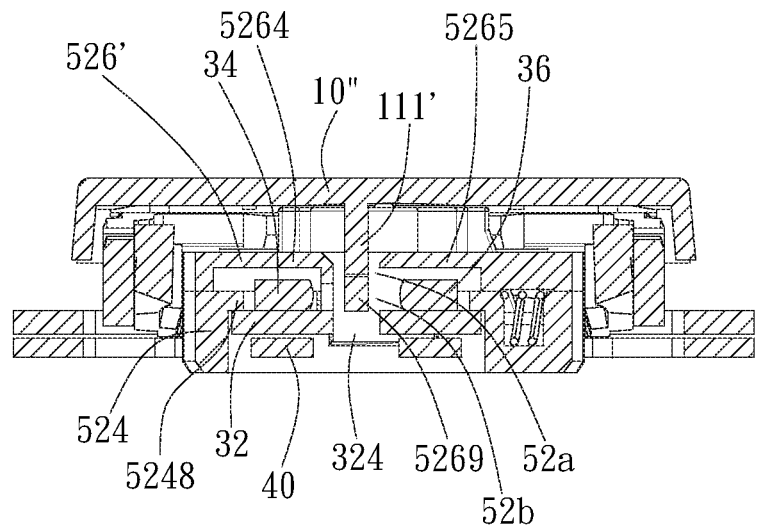
Figure 11B:
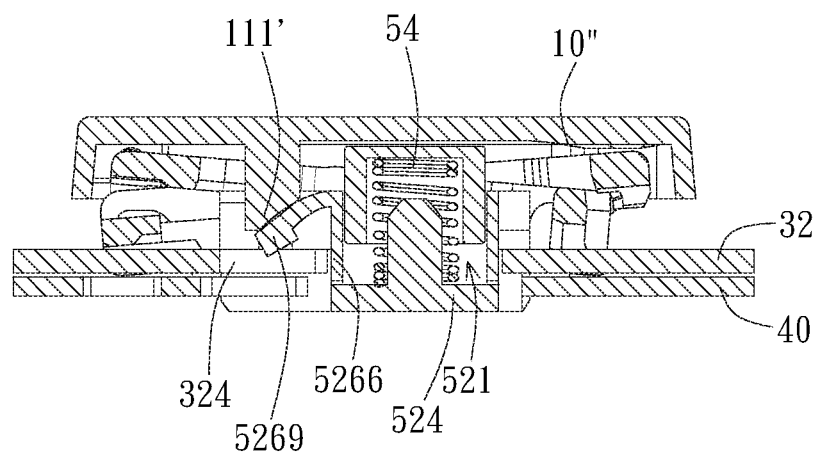

Referring to FIGS. 10A to 11B, the operation of the optical keyswitch of the third embodiment will be illustrated. FIGS. 10A and 11A are cross-sectional views of the optical keyswitch of the third embodiment of the invention along the X axis at the non-pressed position and the triggering position, respectively. FIGS. 10B and 11B are cross-sectional views of the optical keyswitch of the third embodiment of the invention along the Y axis at the non-pressed position and the triggering position, respectively. As shown in FIGS. 10A and 10B, when the keycap 10" is not pressed, the protrusion 111' of the keycap 10" is located correspondingly above the deformable portion 5269. The horizontal surface 1112 of the protrusion 111' is preferably parallel to the surface of the deformable portion 5269, and the sloped surface 1111 inclined upward from the horizontal surface 1112 toward the sidewall 5266, so that the vertical projection of the sloped surface 1111 on the deformable portion 5269 overlaps the deformable portion 5269. The protrusion 111' and the deformable portion 5269 are away from the intensity adjustment space 52b and do not influence the intensity of the optical signal received by the receiver 36.

As shown in FIGS. 11A and 11B, when the keycap 10" is pressed, the protrusion 111' moves downward along with the keycap 10", the protrusion 111' presses against the deformable portion 5269, and the deformable portion 5269 is bent to at least partially block the optical signal, so the second intensity is smaller than the first intensity. Specifically, when the keycap 10" is pressed, the protrusion 111' moves downward along with the keycap 10", and the horizontal surface 1112 presses against the deformable portion 5269, so that the deformable portion 5269 deforms downward along the sloped surface 1111, and the optical signal is at least partially blocked by the deformable portion 5269 and the protrusion 111' (or merely by the deformable portion 5269) to trigger the switch module 30 generating the triggering signal. It is noted that length of the protrusion 111' of this embodiment can be smaller than that of the protrusion 111 of the keycap 10, so that the outer appearance of the keycap can be improved by reducing the possibility of generating dimple at the corresponding upper surface of the protrusion when the keycap is injection molded.

Figure 12A:
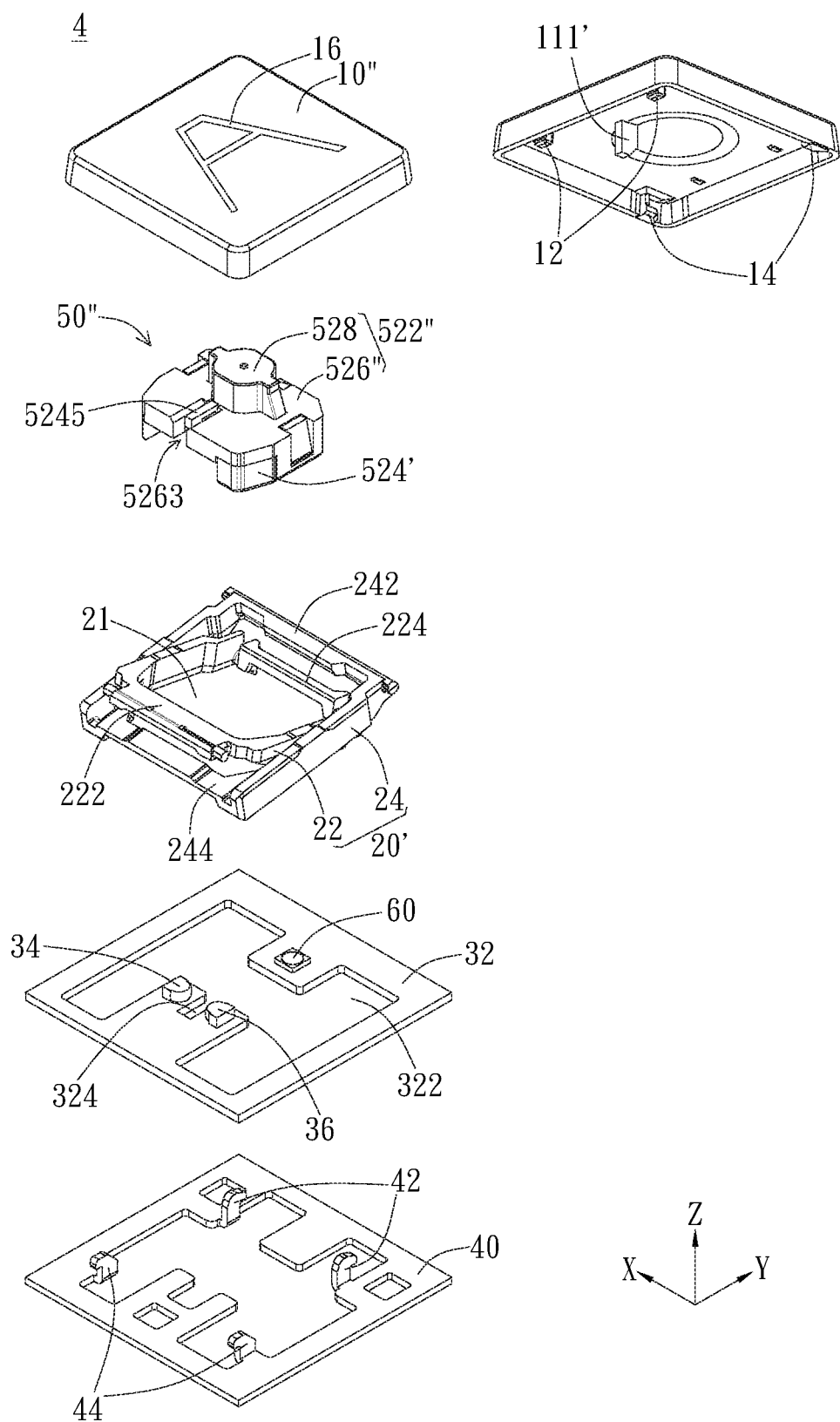
FIG. 12A is an exploded view of a fourth embodiment of the optical keyswitch of the invention.
Figure 12B:
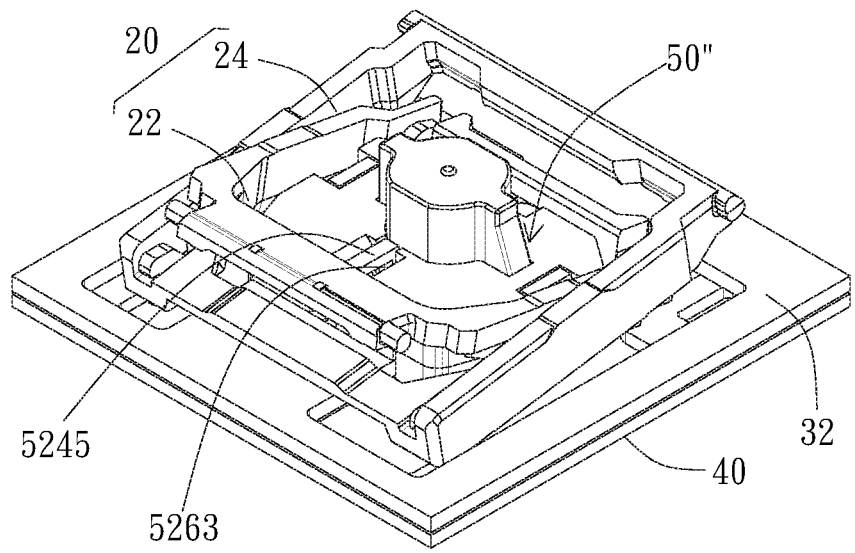
FIG. 12B is a schematic view of the optical keyswitch of FIG. 12A without the keycap.
Figure 12C:
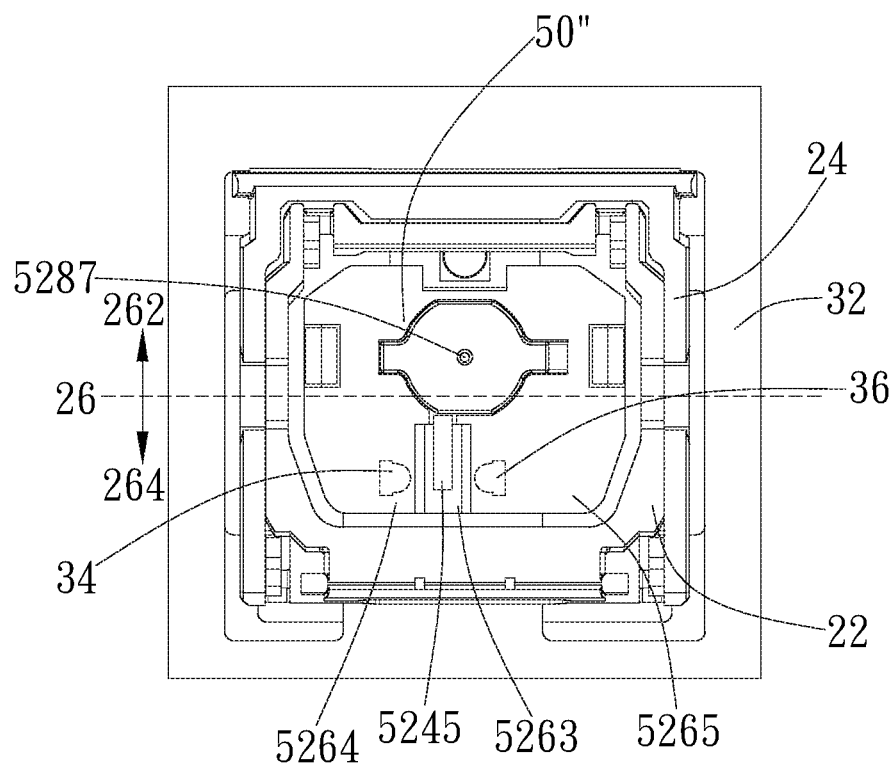
FIG. 12C is a top view of FIG. 12B.
Figure 12D:
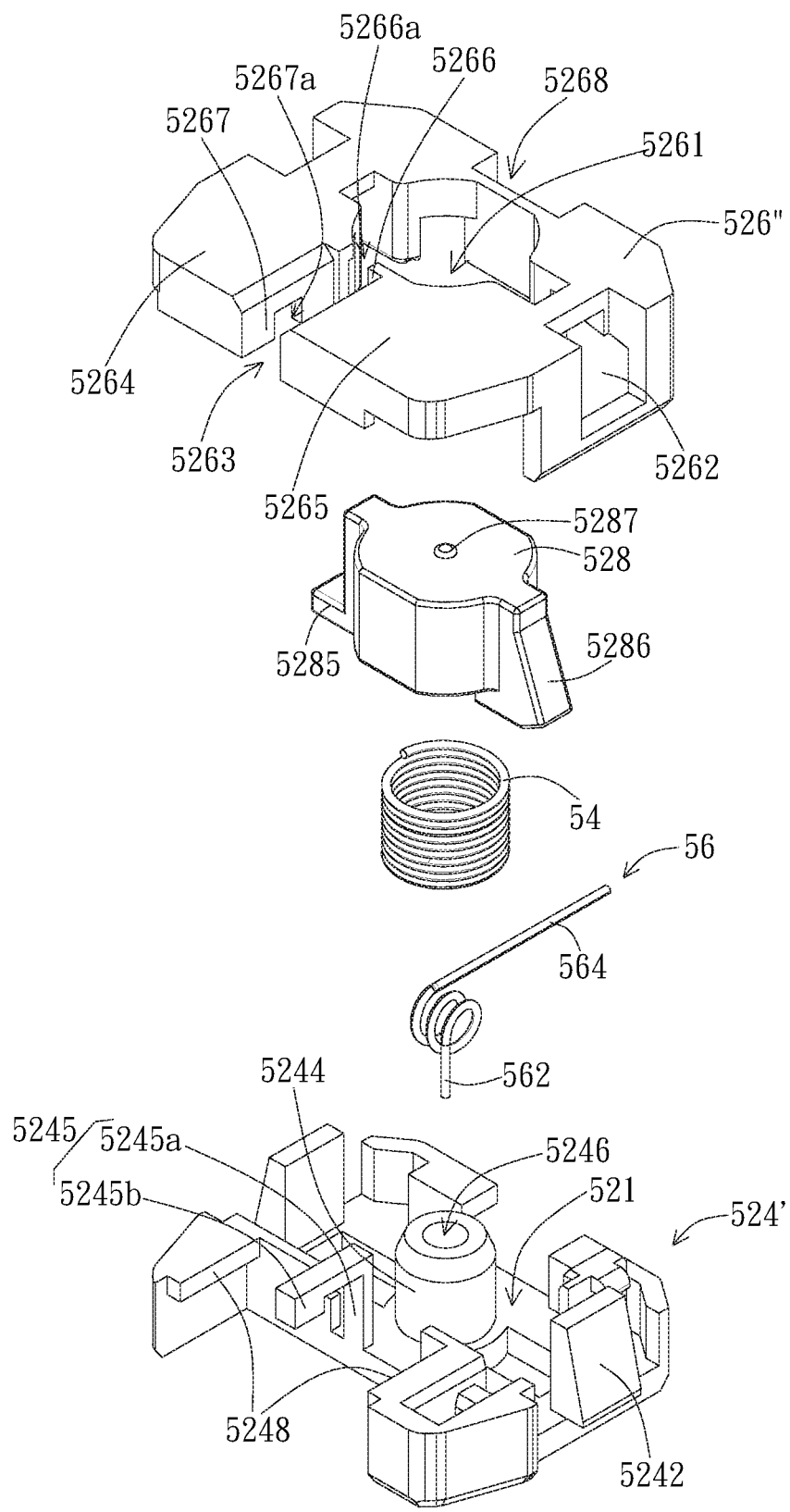
FIG. 12D is an exploded view of the restoring mechanism of FIG. 12A.

FIGS. 12A to 14B are schematic views of a fourth embodiment of the invention, wherein FIG. 12A is an exploded view of the optical keyswitch of the invention, FIG. 12B is a schematic view of the optical keyswitch of FIG. 12A without the keycap, FIG. 12C is a top view of FIG. 12B, and FIG. 12D is an exploded view of the restoring mechanism of FIG. 12A. As shown in the figures, in the fourth embodiment, the optical keyswitch 4 includes the keycap 10", the support mechanism 20', the switch module 30, the baseplate 40, and a restoring mechanism 50". The details of the keycap 10", the support mechanism 20', the switch module 30, and the baseplate 40 can refer to the related descriptions of the first to third embodiments. Hereinafter, the difference between the fourth embodiment and the foregoing embodiments will be explained.

Specifically, the restoring mechanism 50" is different from the restoring mechanism 50 in that the lower casing has a deformable portion 5245. The deformable portion 5245 extends from the lower casing 524' toward the upper casing 522" corresponding to the protrusion 111'. The deformable portion 5245 includes a vertical portion 5245a extending from the lower casing 524' toward the upper casing 522" and a horizontal portion 5245b extending horizontally from the vertical portion 5245a to above the open region 5263, so that the deformable portion 5245 has an "L" shape. In response to the deformable portion 5245, the upper casing body 526" preferably has a channel 5266a formed in the sidewall 5266. The channel 5266a corresponds to the vertical portion 5245a and allows the vertical portion 5245a to extend therethrough. As such, the deformable portion 5245 is located between the left arm portion 5264 and the right arm portion 5265 of the upper casing body 526". The vertical portion 5245a is located in the channel 5266a of the sidewall 5266 and forms an isolation wall together with the sidewall 5266 to separate the accommodation space 521 from the up-down path 52a (and the intensity adjustment space 52b). It is noted that the details of other portions (parts) of the restoring mechanism 50" can refer to the related descriptions of the restoring mechanism 50 of the first embodiment, and will not elaborate again.

Figure 13A:
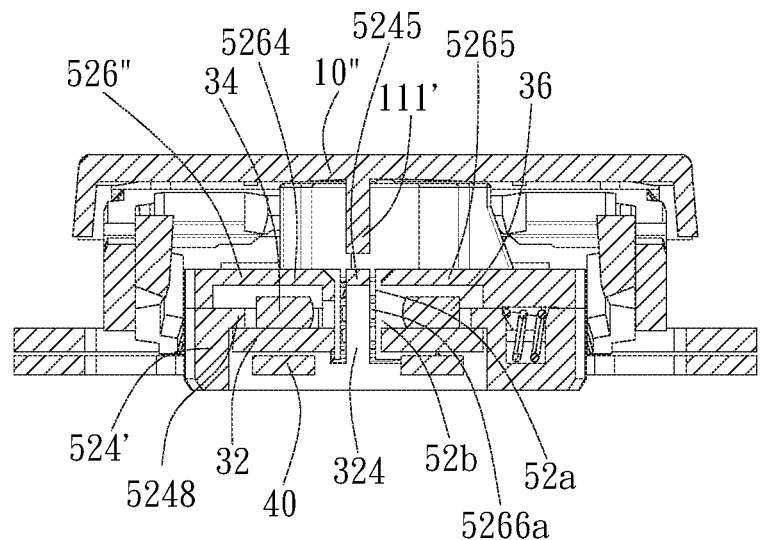
FIGS. 13A and 14A are cross-sectional views of the optical keyswitch of the fourth embodiment of the invention along the X axis at the non-pressed position and the triggering position, respectively.
Figure 13B:
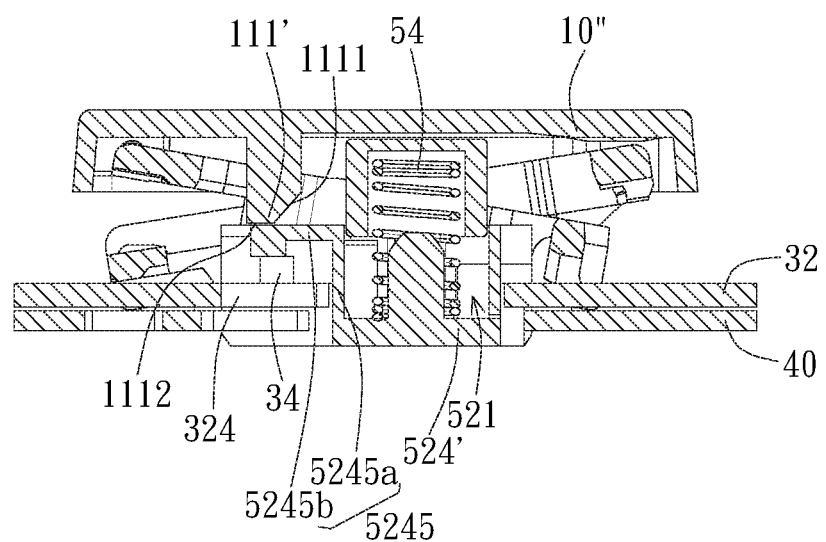
FIGS. 13B and 14B are cross-sectional views of the optical keyswitch of the fourth embodiment of the invention along the Y axis at the non-pressed position and the triggering position, respectively.

Referring to FIGS. 13A to 14B, the operation of the optical keyswitch 4 of the fourth embodiment will be illustrated. FIGS. 13A and 14A are cross-sectional views of the optical keyswitch along the X axis at the non-pressed position and the triggering position, respectively. FIGS. 13B and 13B are cross-sectional views of the optical keyswitch along the Y axis at the non-pressed position and the triggering position, respectively. As shown in FIGS. 13A and 13B, when the keycap 10" is not pressed, the protrusion 111' of the keycap 10" is located correspondingly above the deformable portion 5245. The horizontal surface 1112 of the protrusion 111' is preferably parallel to the horizontal portion 5245b of the deformable portion 5245, and the sloped surface 1111 inclines upward from the horizontal surface 1112 toward the sidewall 5266, so that the vertical projection of the sloped surface 1111 on the deformable portion 5245 overlaps the deformable portion 5245. The protrusion 111' and the deformable portion 5245 are away from the intensity adjustment space 52b and do not influence the intensity of the optical signal received by the receiver 36.

Figure 14A:
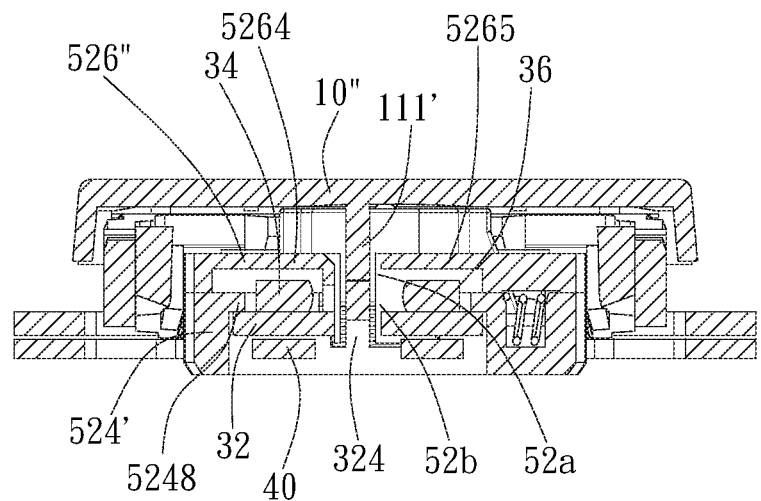
Figure 14B:
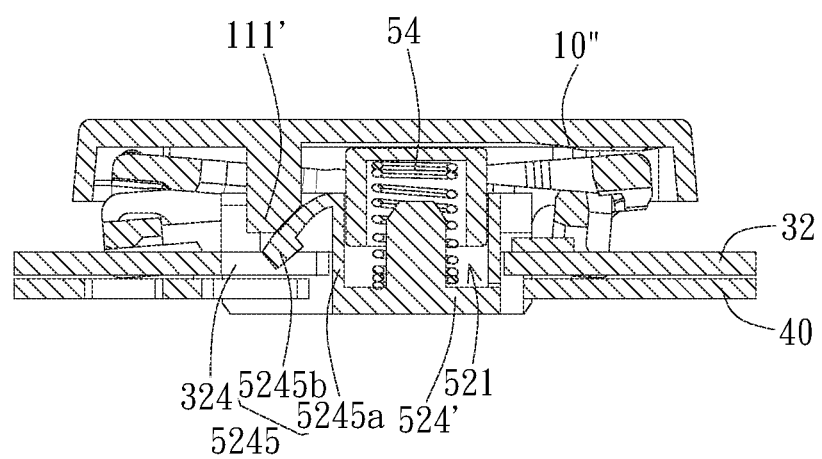

As shown in FIGS. 14A and 14B, when the keycap 10" is pressed, the protrusion 111' moves downward along with the keycap 10". The protrusion 111' presses against the deformable portion 5245, and the deformable portion 5245 is bent to at least partially block the optical signal, so the second intensity is smaller than the first intensity. Specifically, when the keycap 10" is pressed, the protrusion 111' moves downward along with the keycap 10" and the horizontal surface 1112 presses against the horizontal portion 5245b of the deformable portion 5245, so that the deformable portion 5245 deforms downward along the sloped surface 1111, and the optical signal is at least partially blocked by the deformable portion 5245 and the protrusion 111' (or merely by the deformable portion 5245) to trigger the switch module 30 to generate the triggering signal.

Figure 15A:
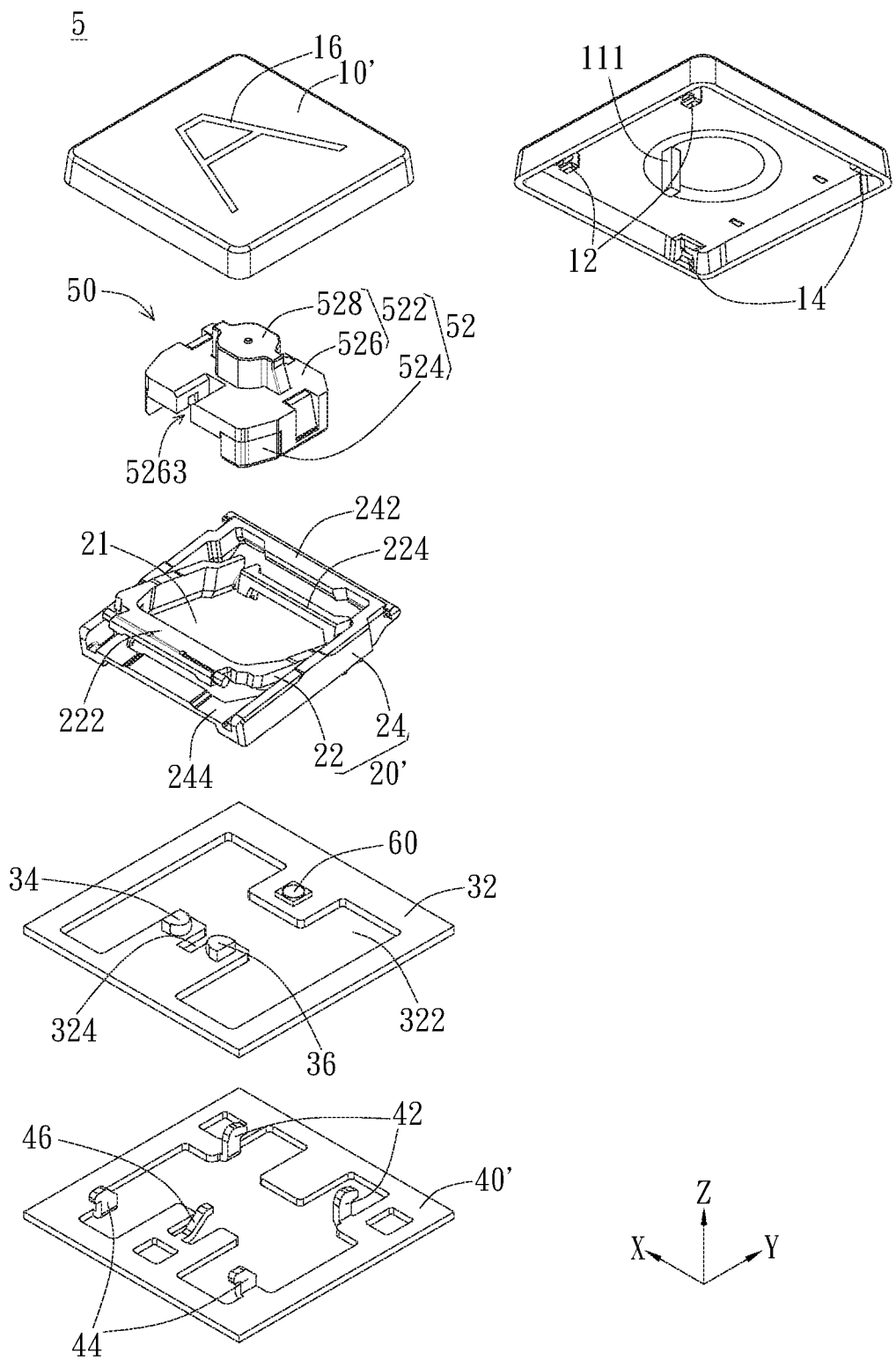
FIG. 15A is an exploded view of a fifth embodiment of the optical keyswitch of the invention.
Figure 15B:
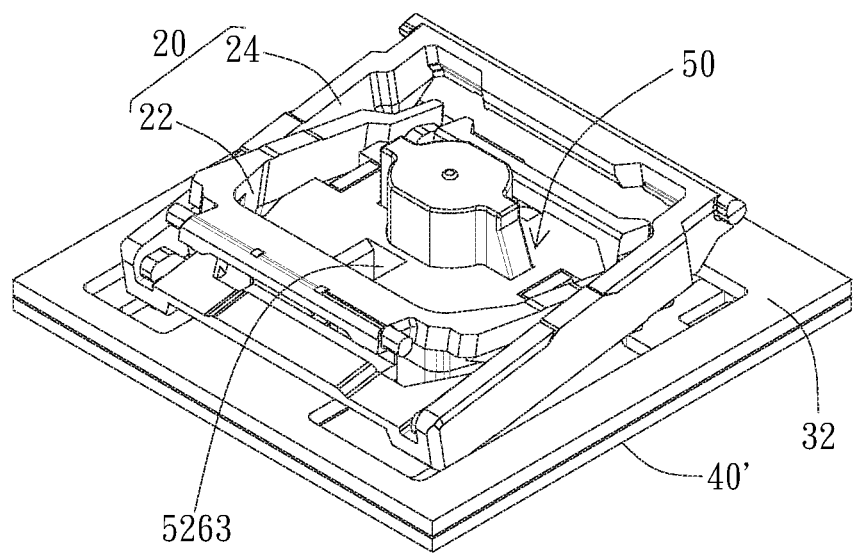
FIG. 15B is a schematic view of the optical keyswitch of FIG. 15A without the keycap.
Figure 15C:
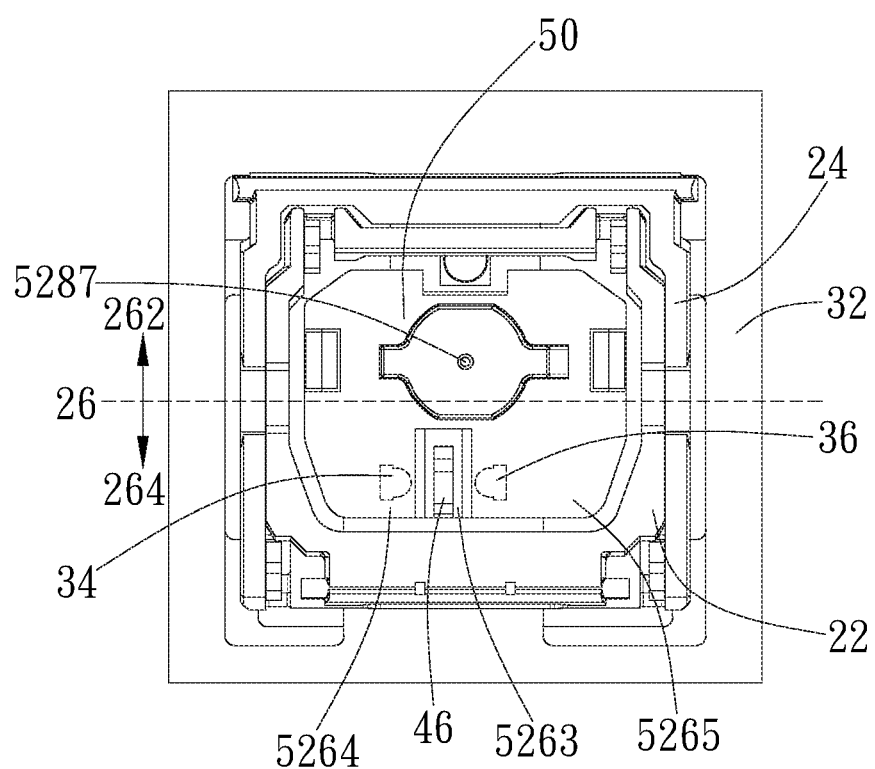
FIG. 15C is a top view of FIG. 15B.

FIGS. 15A to 17B illustrate schematic views of a fifth embodiment of the invention, wherein FIG. 15A is an exploded view of the fifth embodiment of the optical keyswitch of the invention, FIG. 15B is a schematic view of the optical keyswitch of FIG. 15A without the keycap, and FIG. 15C is a top view of FIG. 15B. As shown in the figures, in the fifth embodiment, the optical keyswitch 5 includes the keycap 10', the support mechanism 20', the switch module 30, a baseplate 40', and the restoring mechanism 50. The details of the keycap 10', the support mechanism 20', the switch module 30, and the restoring mechanism 50 can refer to the related descriptions of the first to fourth embodiments. Hereinafter, the difference between the fifth embodiment and the foregoing embodiments will be explained.

Specifically, the protrusion 111 extends from the lower surface of the keycap 10', and the baseplate 40' has an extension portion 46. The extension portion 46 extends toward the keycap 10' and corresponds to the protrusion 111 to at least partially block the optical signal. In this embodiment, the up-down path 52a is preferably shifted from the intensity adjustment space 52b with respect to the moving direction of the protrusion 111, so that when the protrusion 111 moves in the up-down path 52a, the protrusion 111 will not enter the intensity adjustment space 52b and the intensity of the optical signal received by the receiver 36 will not be directly influenced by the protrusion 111. For example, the extension portion 46 can be an L-shaped flexible arm bending upward from the baseplate 40'. The extension portion 46 is preferably located between the left arm portion 5264 and the right arm portion 5265 and extends along the Y axis from the intensity adjustment space 52b to the up-down path 52a.

Figure 16A:
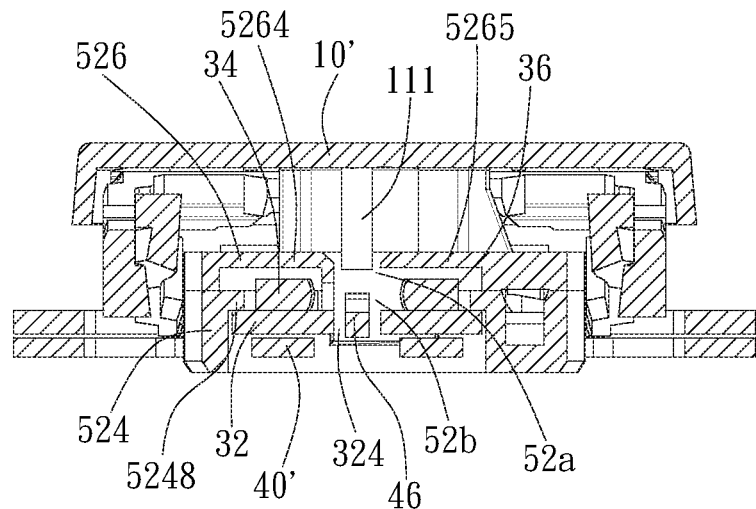
FIGS. 16A and 17A are cross-sectional views of the optical keyswitch of the fifth embodiment of the invention along the X axis at the non-pressed position and the triggering position, respectively.
Figure 16B:
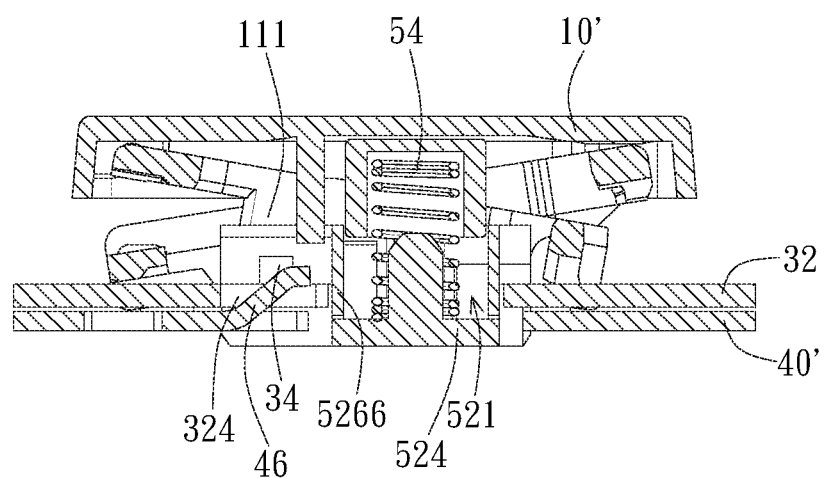
FIGS. 16B and 17B are cross-sectional views of the optical keyswitch of the fifth embodiment of the invention along the Y axis at the non-pressed position and the triggering position, respectively.
Figure 17A:
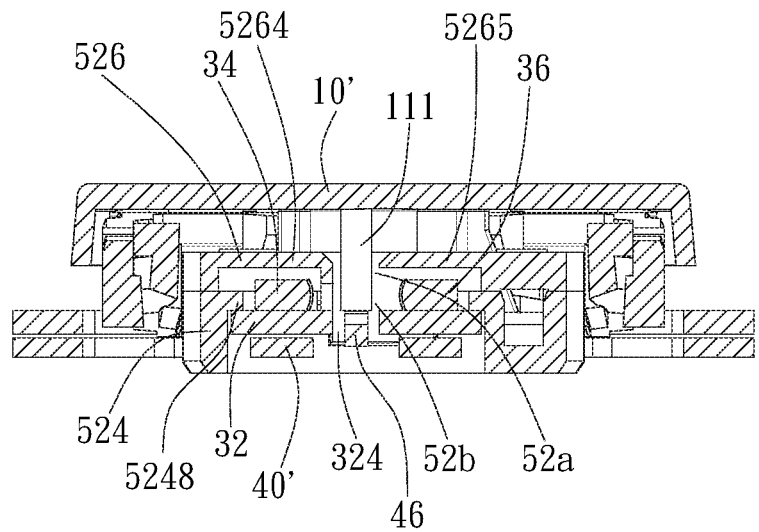
Figure 17B:
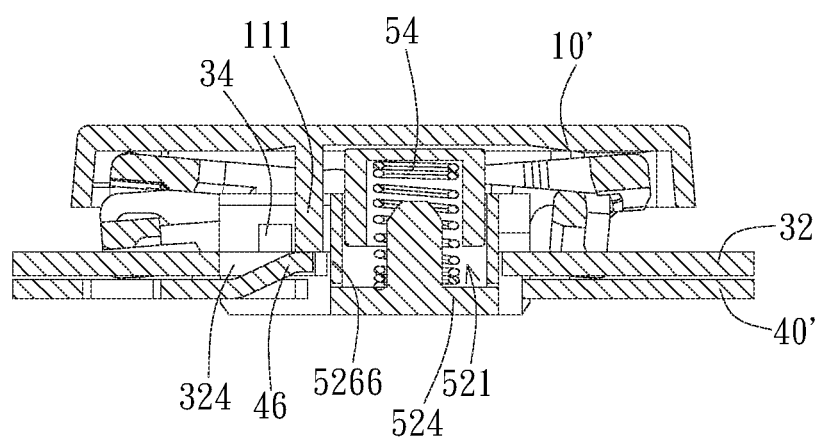

Referring to FIGS. 16A to 17B, the operation of the optical keyswitch 5 of the fifth embodiment will be illustrated. FIGS. 16A and 17A are cross-sectional views of the optical keyswitch along the X axis at the non-pressed position and the triggering position, respectively. FIGS. 16B and 17B are cross-sectional views of the optical keyswitch along the Y axis at the non-pressed position and the triggering position, respectively. As shown in FIGS. 16A and 16B, when the keycap 10' is not pressed, the extension portion 46 corresponding to the protrusion 111 extends toward the keycap 10' into the intensity adjustment space 52b to at least partially block the optical signal, and the distal end of the extension portion 46 extends into the up-down path 52a to correspond to the protrusion 111. The protrusion 111 of the keycap 10' is correspondingly located above the distal end of the extension portion 46, and the protrusion 111 is preferably disposed neighboring the sidewall 5266, so that the protrusion 111 will not influence the intensity of the optical signal received by the receiver 36.

As shown in FIGS. 17A and 17B, when the protrusion 111 is driven to move along with the keycap 10', the protrusion 111 presses against the extension portion 46, and the extension portion 46 deforms to avoid the optical signal, so the second intensity is greater than the first intensity, and the switch module 30 is triggered to generate the triggering signal. Specifically, when the keycap 10' is pressed, the protrusion 111 moves along with the keycap 10' downward in the up-down path 52a to press against the distal end of the extension portion 46, so that the extension portion 46 deforms and retreats from the intensity adjustment space 52b, and the intensity of the optical signal received by the receiver 36 is increased to trigger the switch module 30 to generate the triggering signal.

Figure 18A:
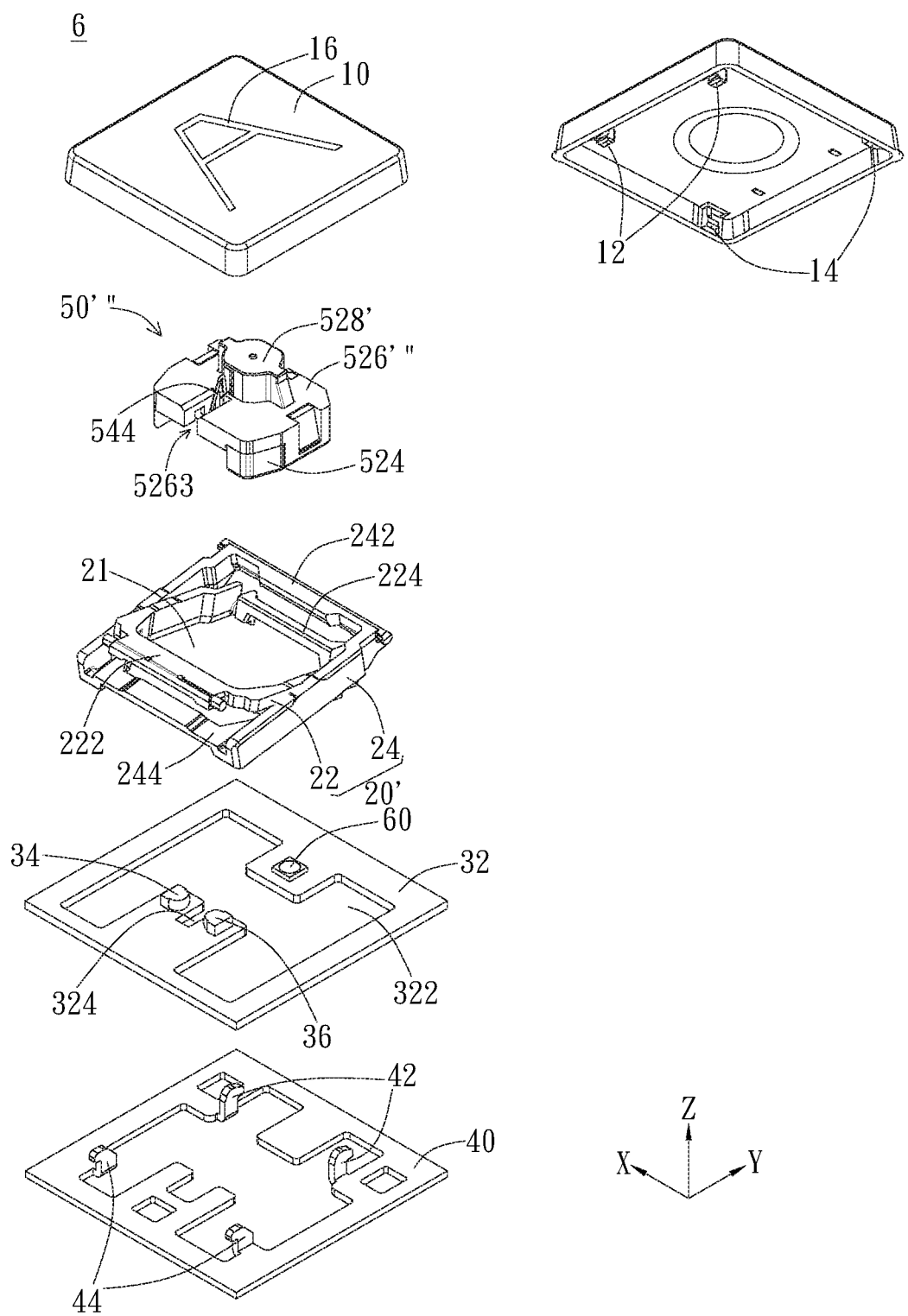
FIG. 18A is an exploded view of a sixth embodiment of the optical keyswitch of the invention.
Figure 18B:
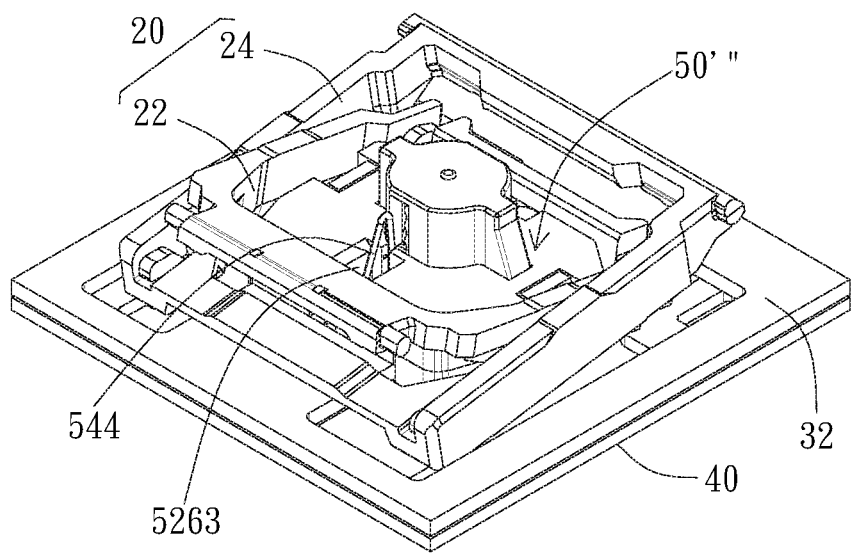
FIG. 18B is a schematic view of the optical keyswitch of FIG. 18A without the keycap.
Figure 18C:
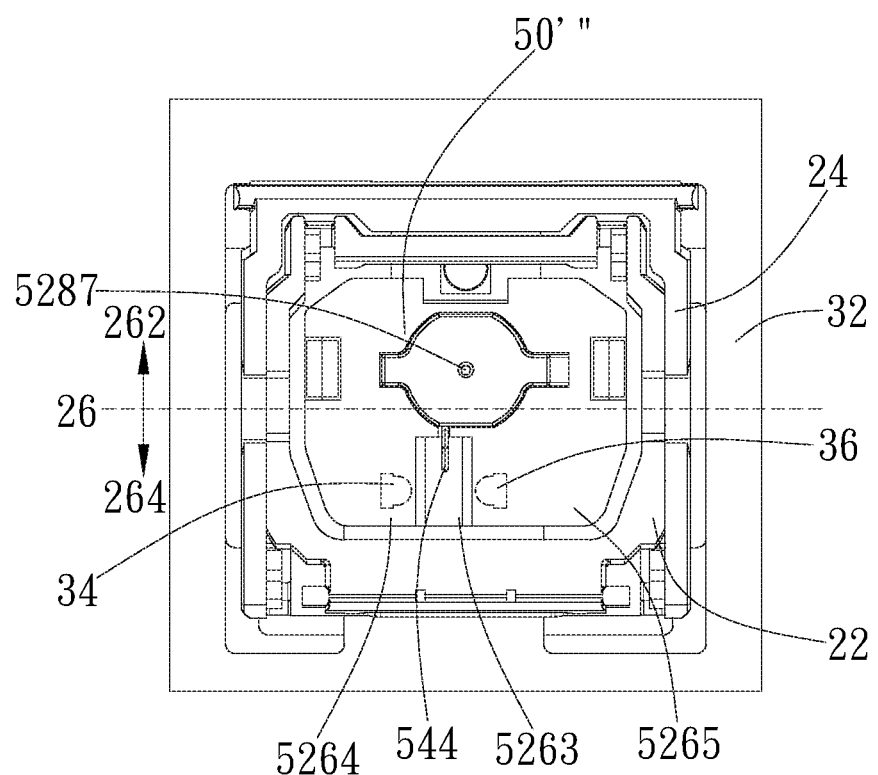
FIG. 18C is a top view of FIG. 18B.
Figure 18D:
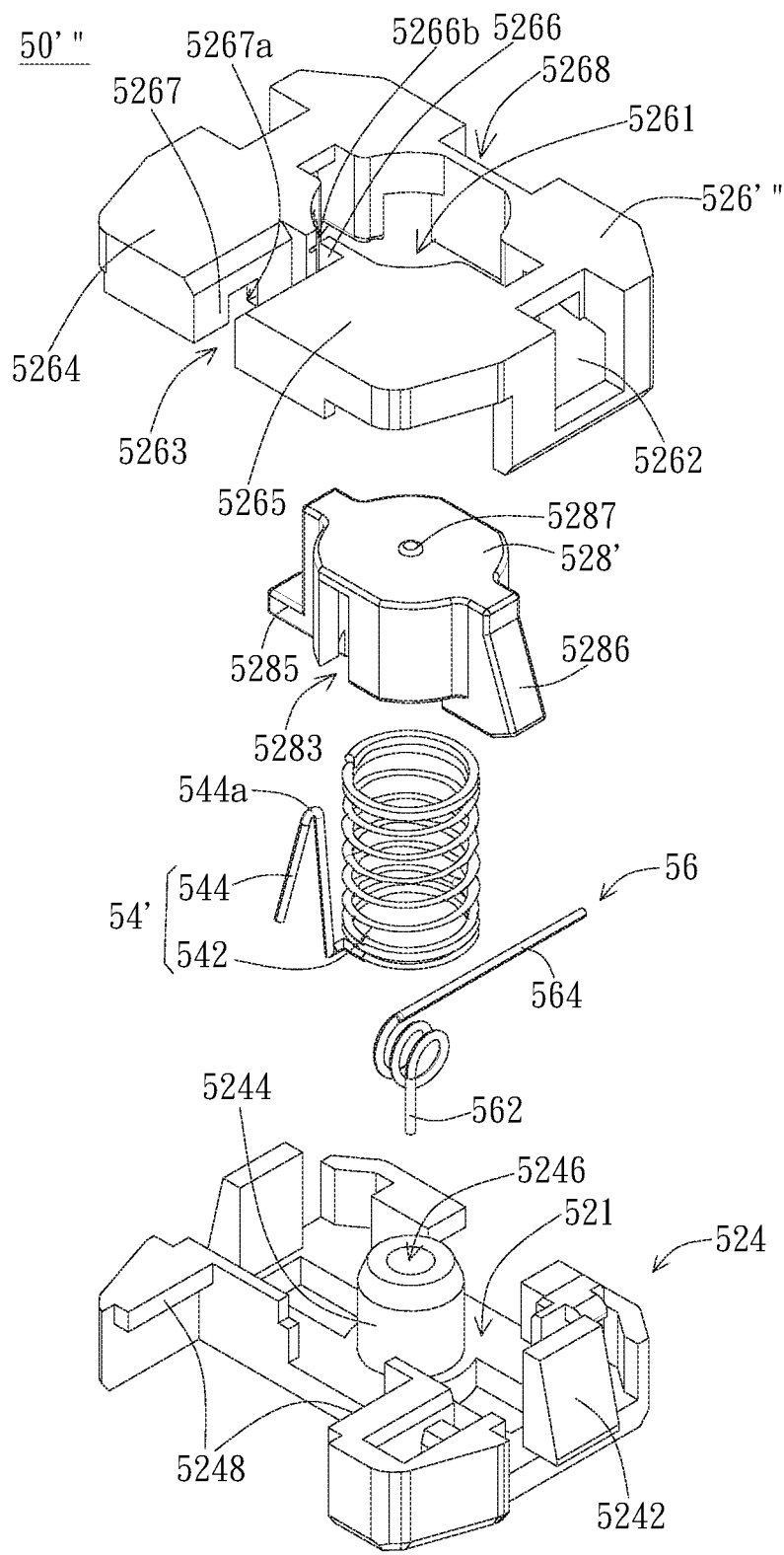
FIG. 18D is an exploded view of the restoring mechanism of FIG. 18A.
Figure 18E:
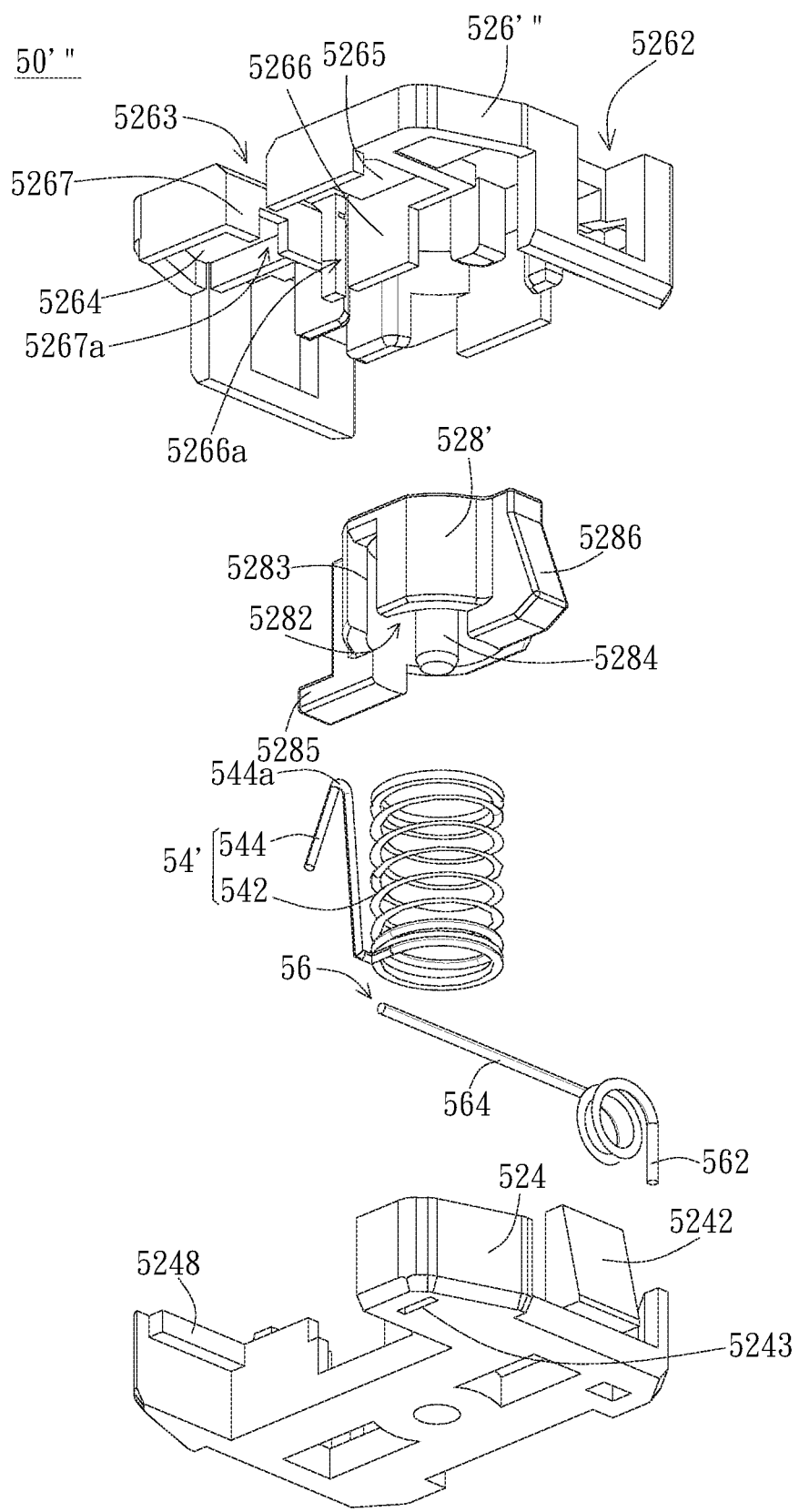
FIG. 18E is an exploded view of the restoring mechanism of FIG. 18A from a different viewing angle.

FIGS. 18A to 18E illustrate schematic views of a sixth embodiment of the invention, wherein FIG. 18A is an exploded view of the sixth embodiment of the optical keyswitch of the invention, FIG. 18B is a schematic view of the optical keyswitch of FIG. 18A without the keycap, FIG. 18C is a top view of FIG. 18B, and FIGS. 18D and 18E are exploded views of the restoring mechanism of FIG. 18A from different angles. As shown in the figures, in the sixth embodiment, the optical keyswitch 6 includes the keycap 10, the support mechanism 20', the switch module 30, and a restoring mechanism 50'''. The support mechanism 20' is disposed below the keycap 10 and configured to support the keycap 10 moving upward and downward. The switch module 30 includes the circuit board 32, the emitter 34, and the receiver 36. The emitter 34 and the receiver 36 are electrically connected to the circuit board 32. The emitter 34 emits an optical signal to the receiver 36. The restoring mechanism 50''' is disposed below the keycap 10 and configured to provide a restoring force to enable the keycap 10 to return to a non-pressed position. The restoring mechanism 50''' includes a resilient member 54'. The resilient member 54' includes a spring portion 542 and an extension portion 544 extending from the spring portion 542 toward the keycap 10. When the keycap 10 is pressed, the keycap 10 presses against the extension portion 544, and the extension portion 544 deforms to at least partially block the optical signal, so the switch module 30 is triggered to generate a triggering signal.

It is noted that the details of the keycap 10, the support mechanism 20', the switch module 30, and the baseplate 40 can refer to the related descriptions of the first to fifth embodiments. Hereinafter, the difference between the restoring mechanism 50''' of the sixth embodiment and the restoring mechanism 50 will be explained. In this embodiment, the spring portion 542 is disposed in the accommodation space 521 of the casing 52'', and the extension portion 544 protrudes outside the accommodation space 521. Specifically, the upper casing body 526''' preferably has a trough 5266b on the sidewall 5266 corresponding to the extension portion 544, so that the extension portion 544 passes through the trough 5266b and is exposed outside the casing 52'''. The extension portion 544 preferably has a bending section 544a, which is configured to be pressed by the keycap 10. Moreover, corresponding to the extension portion 544, the movable part 528' has an opening 5283 on the sidewall. When the movable part 528' moves up and down, the extension portion 544 moves relatively in the opening 5283. In other words, the opening 5283 of the movable part 528', the trough 5266b of the upper casing body 526''', and the open region 5263 are preferably aligned and communicate to each other without obstructing the movement of the movable part 528' and the deformation of the extension portion 544. The details of other components or parts of the restoring mechanism, 50''' can refer to related descriptions of the foregoing embodiments.

Figure 19A:
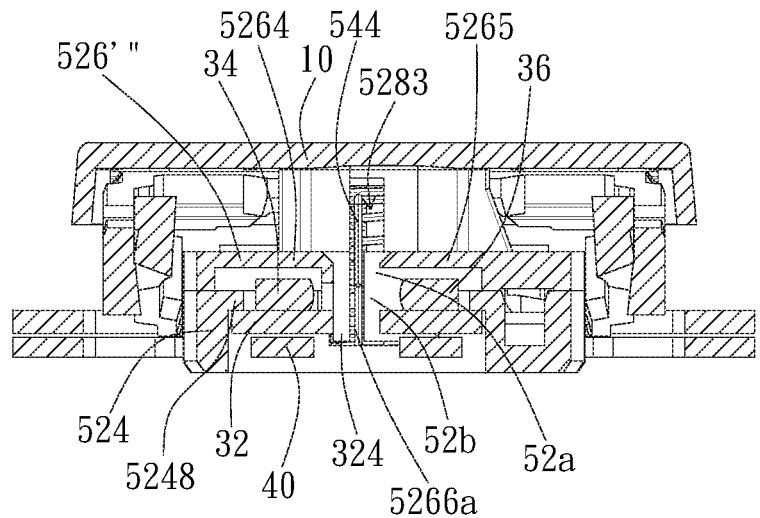
FIGS. 19A and 20A are cross-sectional views of the optical keyswitch of the sixth embodiment of the invention along the X axis at the non-pressed position and the triggering position, respectively.
Figure 19B:
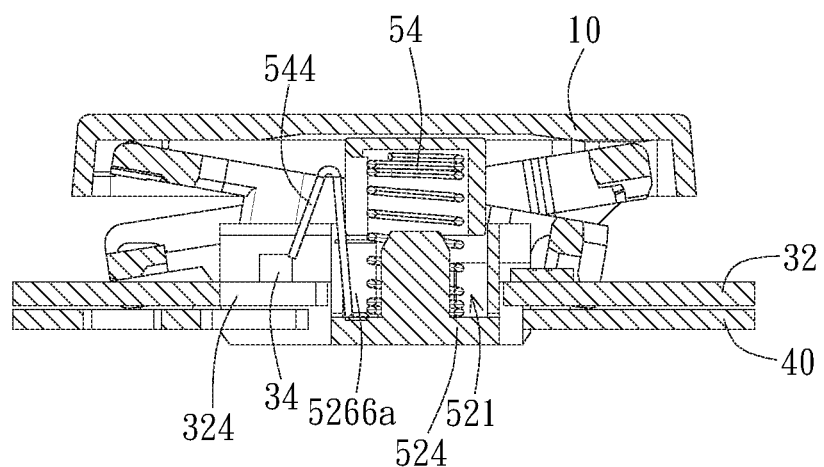
FIGS. 19B and 20B are cross-sectional views of the optical keyswitch of the sixth embodiment of the invention along the Y axis at the non-pressed position and the triggering position, respectively.
Figure 20A:
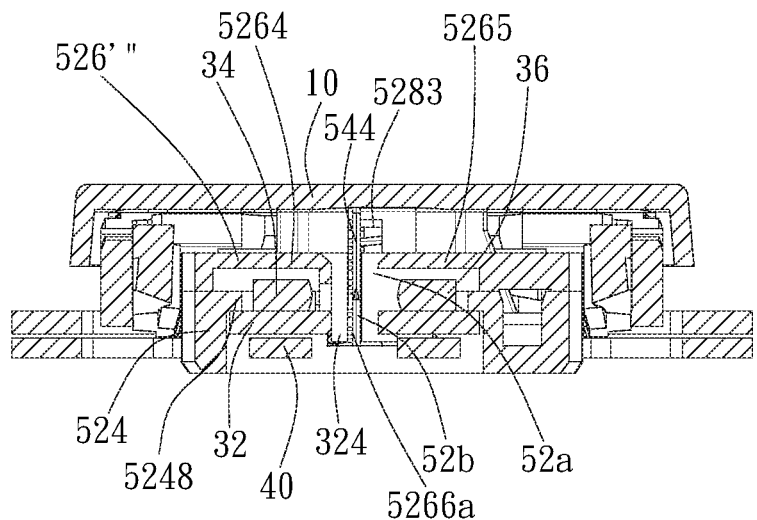
Figure 20B:
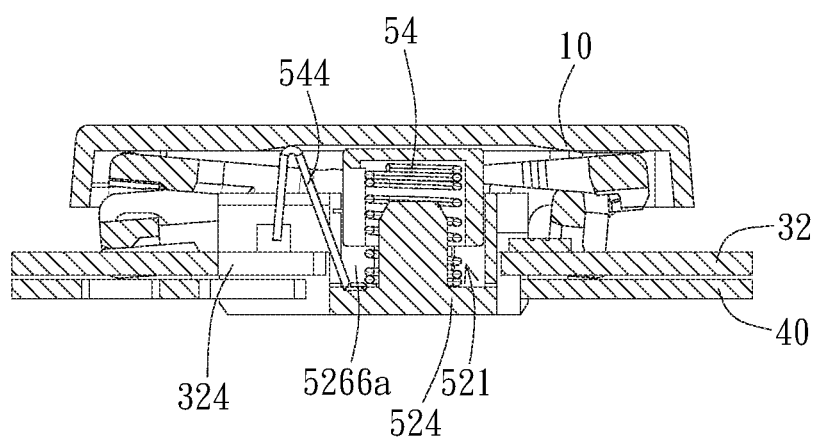

Referring to FIGS. 19A to 20B, the operation of the optical keyswitch 6 of the sixth embodiment will be illustrated. FIGS. 19A and 20A are cross-sectional views of the optical keyswitch of the sixth embodiment along the X axis at the non-pressed position and the triggering position, respectively. FIGS. 19B and 20B are cross-sectional views of the optical keyswitch of the sixth embodiment along the Y axis at the non-pressed position and the triggering position, respectively. As shown in FIGS. 19A and 19B, when the keycap 10 is not pressed, the keycap 10 does not contact or substantially not press the extension portion 544, and the extension portion 544 does not enter the intensity adjustment space 52b. Therefore, the receiver 36 can substantially completely receive the optical signal, i.e. the intensity of the optical signal received by the receiver 36 is substantially not influenced by the extension portion 544.

As shown in FIGS. 20A and 20B, when the keycap 10 is pressed, the keycap 10 moves downward to press against the extension portion 544 (e.g. against the bending section 544a), and the extension portion 544 deforms to enter the intensity adjustment space 52b to at least partially block the optical signal, so that the intensity of the optical signal received by the receiver 36 is reduced, and the switch module 30 is triggered to generate the triggering signal.

Figure 21A:
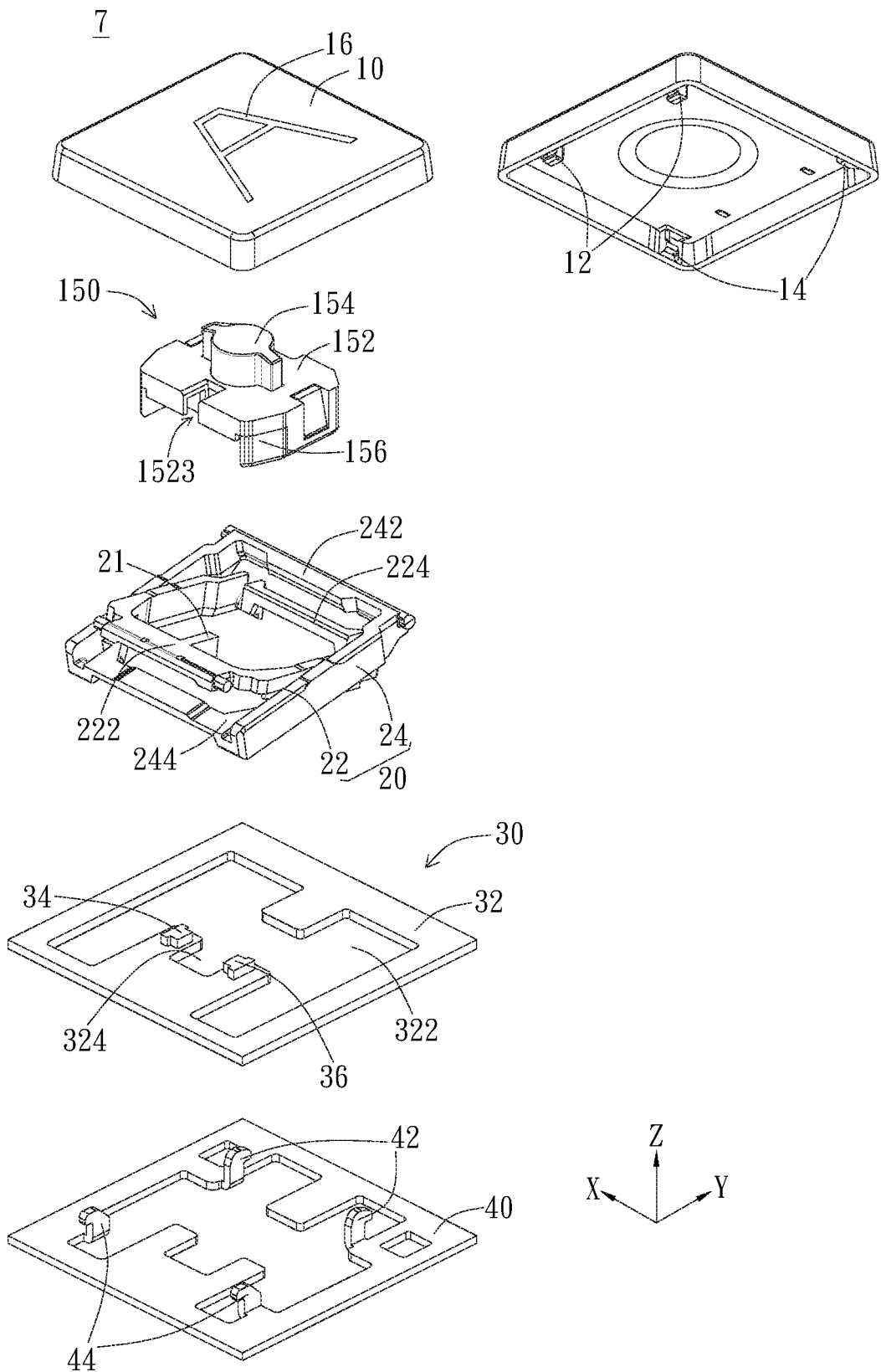
FIG. 21A is an exploded view of a seventh embodiment of the optical keyswitch of the invention.
Figure 21B:
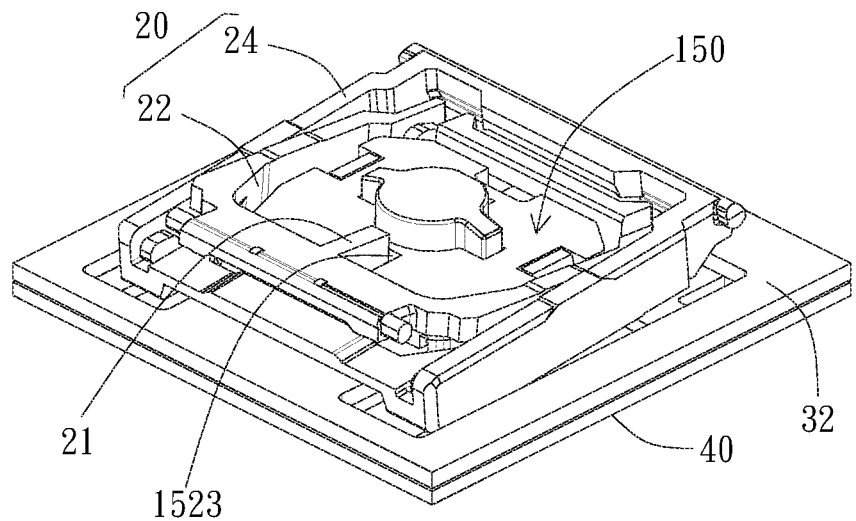
FIG. 21B is a schematic view of the optical keyswitch of FIG. 21A without the keycap.
Figure 21C:
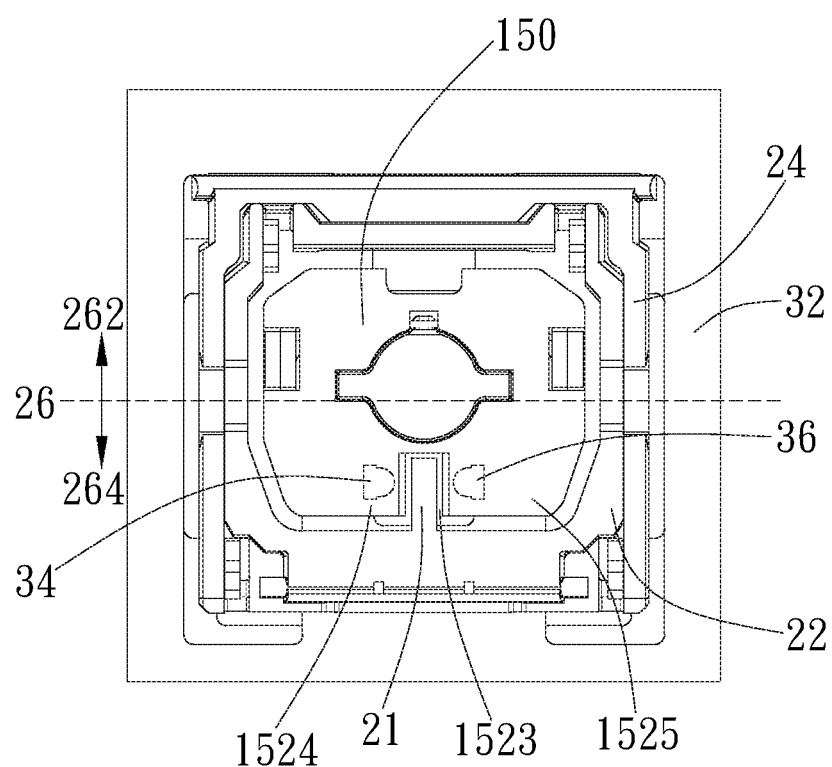
FIG. 21C is a top view of FIG. 21B.
Figure 21D:
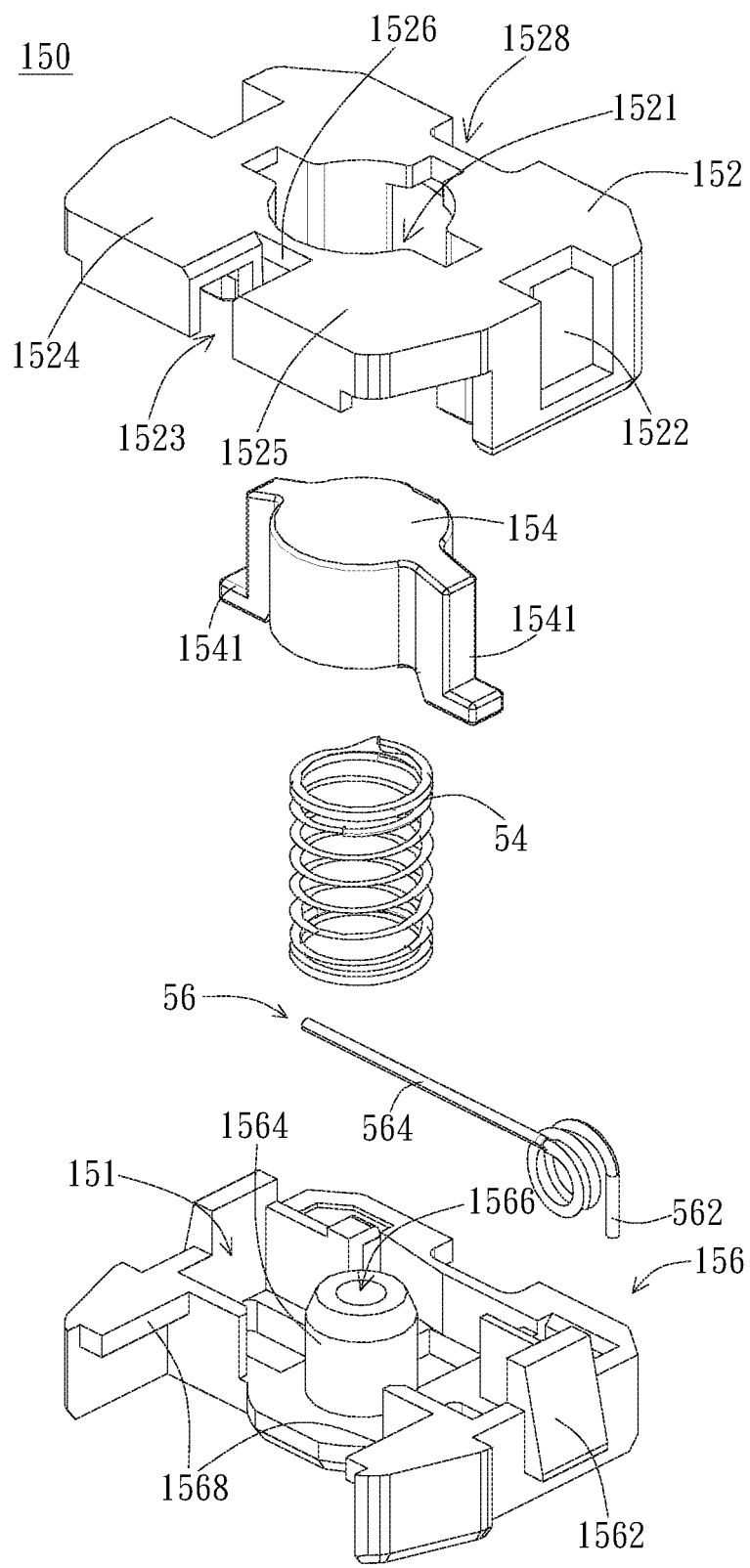
FIGS. 21D and 21E are exploded views of the restoring mechanism of FIG. 21A from different viewing angles.
Figure 21E:
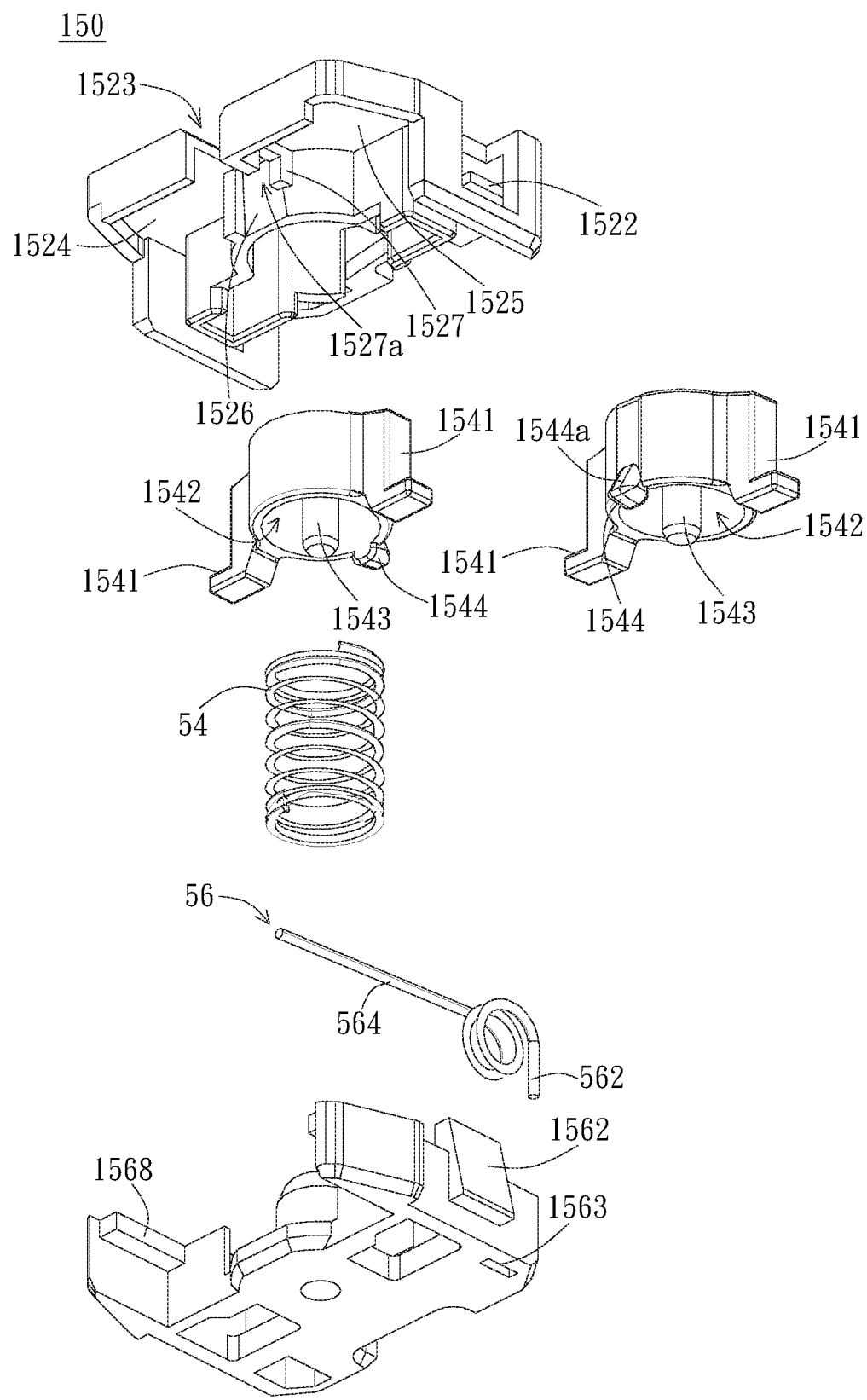

FIGS. 21A to 24B illustrate schematic views of a seventh embodiment of the optical keyswitch module of the invention, wherein FIG. 21A is an exploded view of the seventh embodiment of the optical keyswitch of the invention, FIG. 21B is a schematic view of the optical keyswitch of FIG. 21A without the keycap, FIG. 21C is a top view of FIG. 21B, and FIGS. 21D and 21E are exploded views of the restoring mechanism of FIG. 21A from different viewing angles. As shown in the figures, in the seventh embodiment, the optical keyswitch 7 includes the keycap 10, the support mechanism 20, the switch module 30, the baseplate 40, and the restoring mechanism 150. In this embodiment, the details and connections of the keycap 10, the support mechanism 20, the switch module 30, and the baseplate 40 can refer to the related descriptions of the foregoing embodiments, and will not elaborate again. Hereinafter, the difference of the restoring mechanism 150 will be explained. As shown in the figures, the restoring mechanism 150 includes an upper casing body 152, a movable part 154, a lower casing 156, a resilient member 54, and a tactile resilient member 56. The upper casing body 152 has a through hole 1521, an upper engaging portion 1522, an open region 1523, a left arm portion 1524, a right arm portion 1525, a sidewall 1526, a grating portion 1527, and an opening 1528, which have structures and functions similar to those described in the foregoing embodiments. In this embodiment, the differences in that the grating portion 1527 is disposed neighboring the receiving end of the receiver 36, and by controlling the size and location of the slit 1527a, the interference of external light and the possibility of false triggering can be effectively reduced, but not limited thereto. In other embodiments (not shown), the grating portion 1527 can be disposed on the lower casing 156 by modifying the design of the lower casing 156. The movable part 154 is preferably a barrel-like object having restricting portions 1541 protruding from two opposite sides (e.g. with respect to the X axis) to restrict the upward movement of the movable part 154 relative to the upper casing body 152. The movable part 154 has a positioning space 1542 and a positioning post 1543 on the bottom of the movable part 154, which are configured to position the relative position among the resilient member 54, the movable part 154, and the lower casing 156. The restricting portions 1541, the positioning space 1542, and the positioning post 1543 of the movable part 154 have structures and functions similar to those described in the foregoing embodiments and will not elaborate again. In this embodiment, the movable part 154 further has an acting portion 1544 at a side that is away from the open region 1523 in the Y axis. In an embodiment, the acting portion 1544 is a bump protruding outward from the lower side of the barrel-like object. The acting portion 1544 preferably has an inclined surface 1544*a*, which is inclined outward from up to down, to facilitate the relative movement of the acting end 564 of the tactile resilient member 56 and the acting portion 1544. Moreover, the movable part 154 has a dome shape at the top of the barrel-like object, instead of disposing the bump described above.

In this embodiment, the tactile resilient member 56 corresponding to the acting portion 1544 is disposed at the side away from the open region 1523. The extending direction of the acting end 564 of the tactile resilient member 56 is preferably parallel to the connection line of the restricting portions 1541 on two sides of the barrel-like object (e.g. parallel to the X axis direction). Therefore, when the keycap 10 is pressed, the acting portion 1544 cooperating with the acting end 564 achieves the clear tactile feedback and the hitting sound effect. Similar to the foregoing embodiments, the lower casing 156 has lower engaging portions 1562, which engage with upper engaging portions 1522 to combine the upper casing body 152 and the lower casing 156 to form a casing with an accommodation space 151. The lower casing 156 has a coupling portion 1564 configured to position the resilient member 54 and a guiding groove 1566 for allowing the positioning post 1543 to extend therein. The lower casing 156 further has a positioning hole 1563 provided to position the positioning end 562 of the tactile resilient member 56. Similarly, the restoring mechanism 150 can be positioned on the circuit board 32 by the wing portions 1568 of the lower casing 156. As such, when the restoring mechanism 150 is damaged and requires replacement, the damaged restoring mechanism 150 can be replaced with a new one by detaching the keycap 10, picking up the damaged one, and placing the new one, so as to effectively promote the serviceability and the repairing speed. It is noted that the lower engaging portion 1562, the positioning hole 1563, the coupling portion 1564, the guiding groove 1566, and the wing portions 1567 have structures and functions similar to those of the lower casing 254 of the restoring mechanism 50, and will not elaborate again.

Figure 22A:
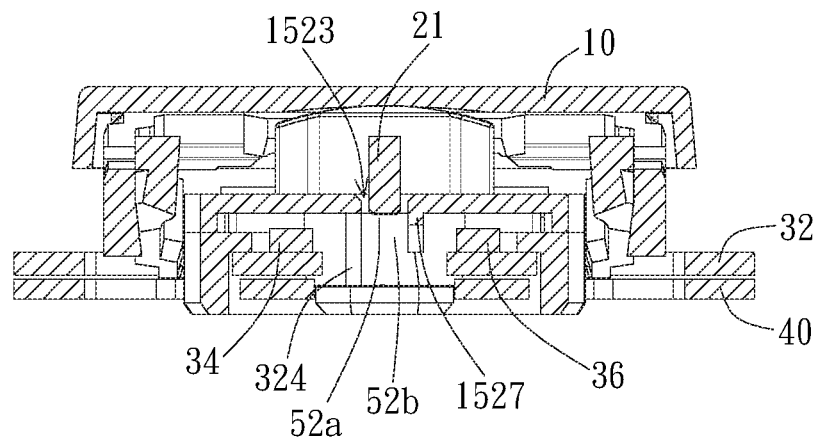
FIGS. 22A, 23A, and 24A are cross-sectional views of the optical keyswitch of the seventh embodiment of the invention along the X axis at the non-pressed position, the triggering position, and the lowest position, respectively.
Figure 22B:
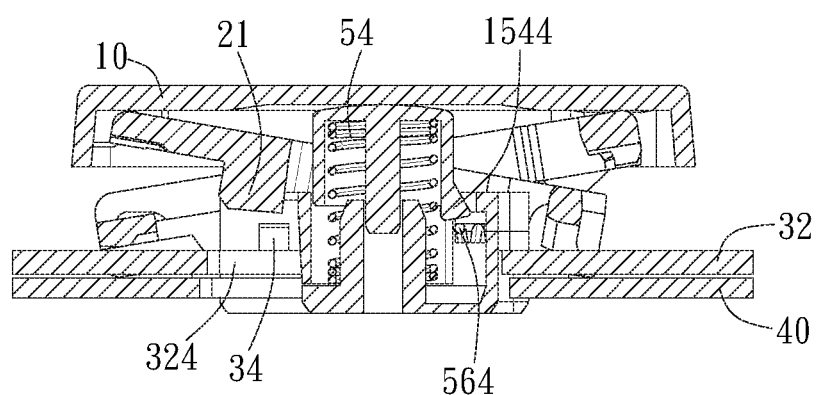
FIGS. 22B, 23B, and 24B are cross-sectional views of the optical keyswitch of the seventh embodiment of the invention along the Y axis at the non-pressed position, the triggering position, and the lowest position, respectively.
Figure 23A:
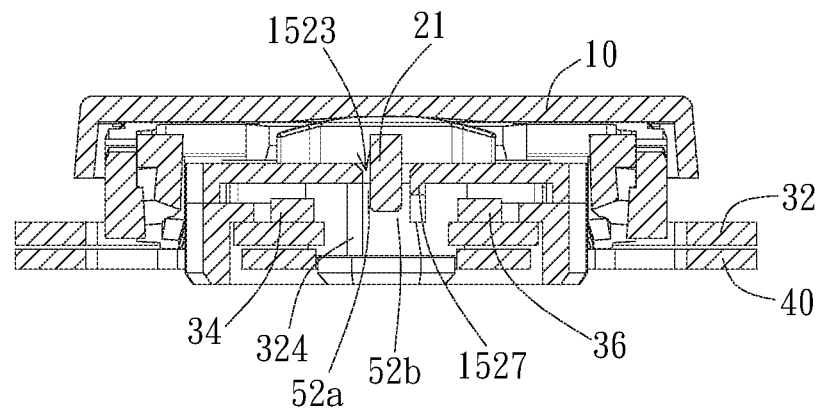
Figure 23B:
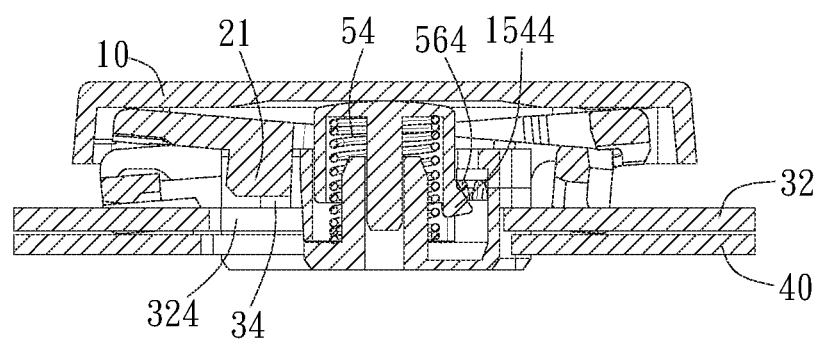
Figure 24A:
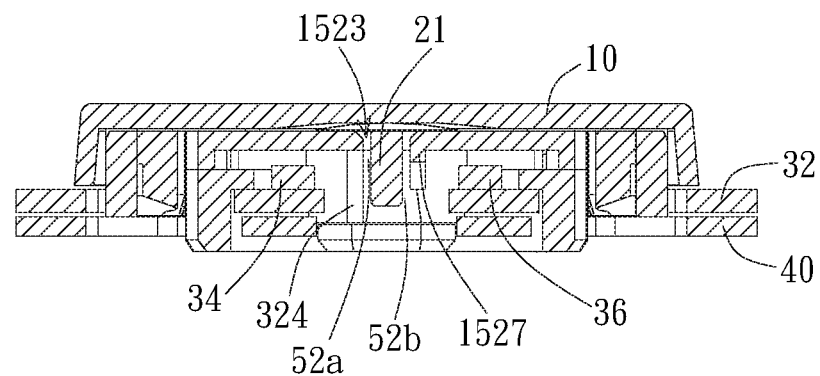
Figure 24B:
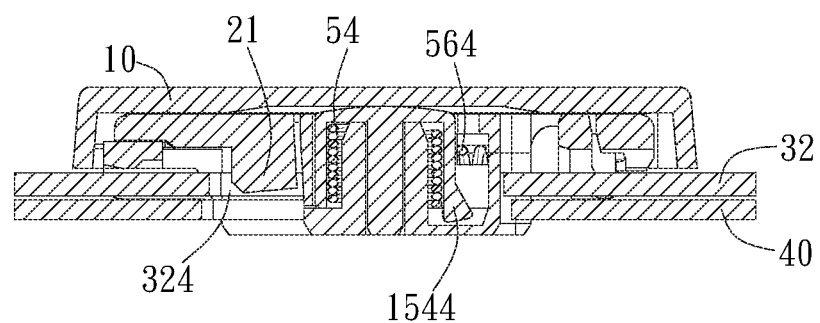

Referring to FIG. 22A to FIG. 24B, the operation of the optical keyswitch 7 of the seventh embodiment will be illustrated. FIGS. 22A, 23A, and 24A are cross-sectional views of the optical keyswitch of the seventh embodiment of the invention along the X axis at the non-pressed position, the triggering position, and the lowest position, respectively. FIGS. 22B, 23B, and 24B are cross-sectional views of the optical keyswitch of the seventh embodiment of the invention along the Y axis at the non-pressed position, the triggering position, and the lowest position, respectively.

As shown in FIGS. 22A and 22B, when the keycap 10 is not pressed, the protrusion 21 is located above the open region 1523 without substantially blocking the optical signal emitted from the emitter 34 along the straight optical path to the receiver 36, so the receiver 36 can receive the optical signal. That is, the protrusion 21 is located in the up-down path 52*a* without entering the intensity adjustment space 52*b* and does not influence the traveling (or transmitting) of the optical signal, and the acting end 564 of the tactile resilient member 56 is located under the acting portion 1544.

As shown in FIGS. 23A and 23B, when the keycap 10 is pressed to drive the protrusion 21, the protrusion 21 moves toward the open region 1523 to at least partially block the optical signal, so the intensity of the optical signal received by the receiver 36 is attenuated, and the switch module 30 is triggered to generate the triggering signal. In other words, the protrusion 21 moves downward in the up-down path 52*a* into intensity adjustment space 52*b* and at least partially blocks the optical signal, so that the switch module 30 is fast triggered, and the acting end 564 of the tactile resilient member 56 moves across the protrudent point of the acting portion 1544 along the inclined surface 1544*a* to above the acting portion 1544.

As shown in FIGS. 24A and 24B, the receiving space 324 of the circuit board 32 is aligned and communicates with the open region 1523. After reaching the triggering position, the protrusion 21 driven by the keycap 10 continuously moves downward into the receiving portion 1523 through the open region 1523. That is, the protrusion 21 continuously moves from the intensity adjustment space 52*b* to the receiving space 324, not only a faster triggering effect can be achieved, but also the stroke distance can be increased to enhance the tactile feedback.

Figure 25A:
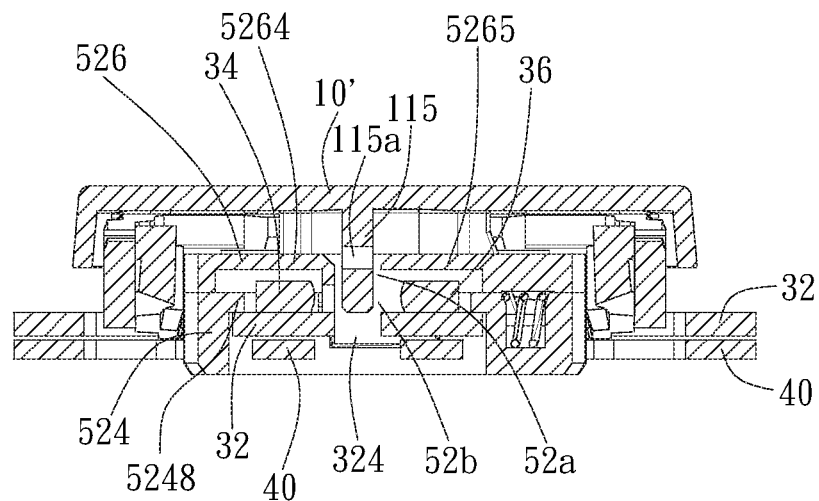
FIGS. 25A and 26A are cross-sectional views of the optical keyswitch of an eighth embodiment of the invention along the X axis at the non-pressed position and the triggering position, respectively.
Figure 25B:
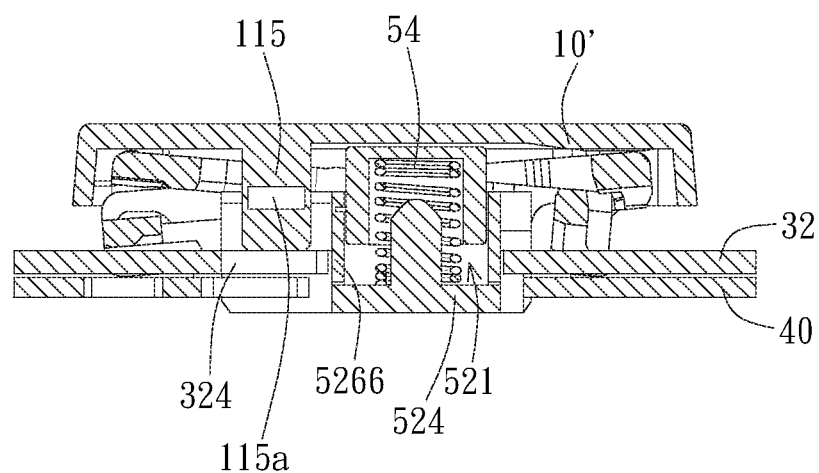
FIGS. 25B and 26B are cross-sectional views of the optical keyswitch of the eighth embodiment of the invention along the Y axis at the non-pressed position and the triggering position, respectively.
Figure 26A:
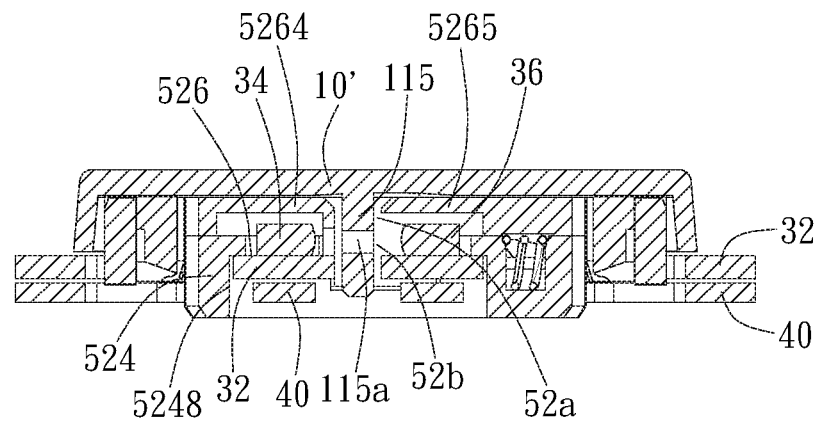
Figure 26B:
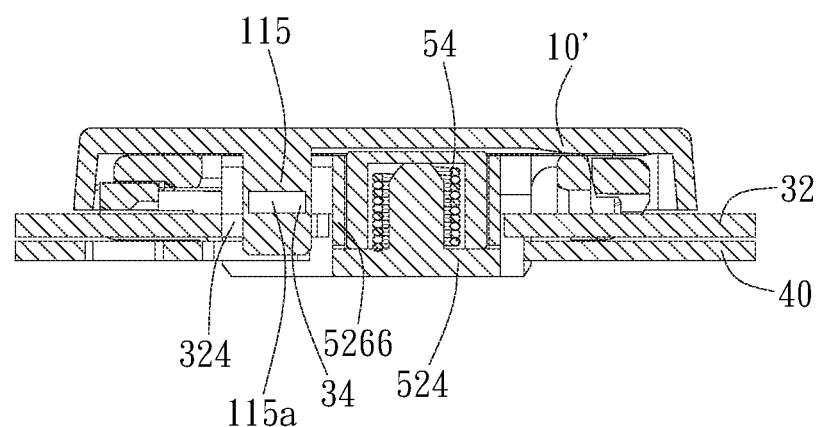

FIGS. 25A to 26B illustrate schematic views of an eighth embodiment of the optical keyswitch. FIGS. 25A and 26A are cross-sectional views of the optical keyswitch along the X axis at the non-pressed position and the triggering position, respectively. FIGS. 25B and 26B are cross-sectional views of the optical keyswitch along the Y axis at the non-pressed position and the triggering position, respectively. In the eighth embodiment, the optical keyswitch includes a structure similar to the optical keyswitch 2 of the second embodiment, but different in the design of the protrusion of the keycap 10'. As shown in FIGS. 25A and 25B, the protrusion 115 extends from the keycap 10' and has an opening 115*a*, and the protrusion 115 at least partially blocks the optical signal and attenuates the intensity of the optical signal received by the receiver 36. For example, when the keycap 10' is not pressed, the protrusion 115 is at a first position relative to the intensity adjustment space 52*b*, and the receiver 36 receives the optical signal of a first intensity. In this embodiment, the first position refers that the opening 115*a* is away from the intensity adjustment space 52*b*, and the protrusion 115 at least partially blocks the optical signal received by the receiver.

As shown in FIGS. 26A and 26B, when the keycap 10' is pressed, the protrusion 115 moves along with the keycap 10 outside the casing 52 to a second position relative to the intensity adjustment space 52*b*. The second position is different from the first position, and the protrusion 115 changes the optical signal received by the receiver to have a second intensity different from the first intensity, so that the switch module 30 is triggered to generate a triggering signal. In this embodiment, the second position refers that the opening 115*a* is located in the intensity adjustment space 52*b*, and the optical signal is allowed to pass the opening 115*a*, so that the second intensity is greater than the first intensity to trigger the switch module 30 to generate the triggering signal.

Figure 27:
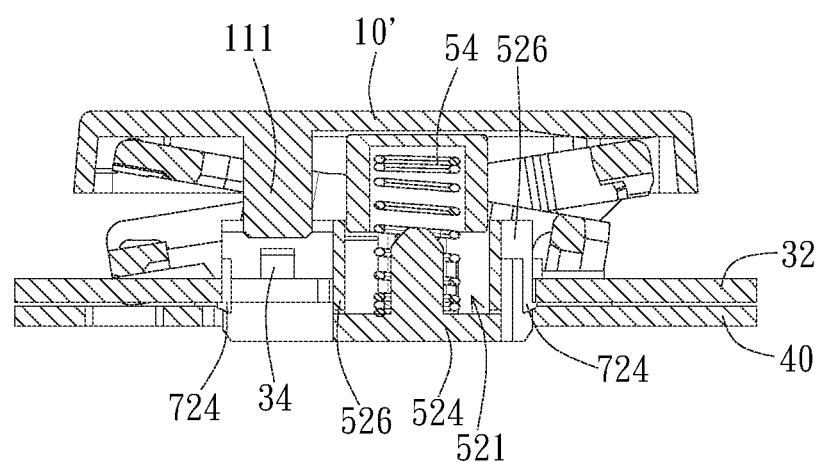
FIG. 27 is cross-sectional views of the optical keyswitch of a ninth embodiment of the invention along the Y axis at the non-pressed position.

FIG. 27 is cross-sectional views of the optical keyswitch of a ninth embodiment of the invention along the Y axis at the non-pressed position. In the ninth embodiment, the difference of the optical keyswitch in that the restoring mechanism 50 further has a hook portion 724, so the restoring mechanism 50 can be positioned on the circuit board 32 by the hook portion 724. Specifically, in an embodiment, the hook portions 724 are preferably disposed at two opposite sides of the upper casing body 526, e.g. at the first side 262 and the second side 264, respectively. When the restoring mechanism 50 requires replacement, by clicking the hook portions toward each other, the restoring mechanism 50 can be detached from the circuit board 32.

Figure 28A:
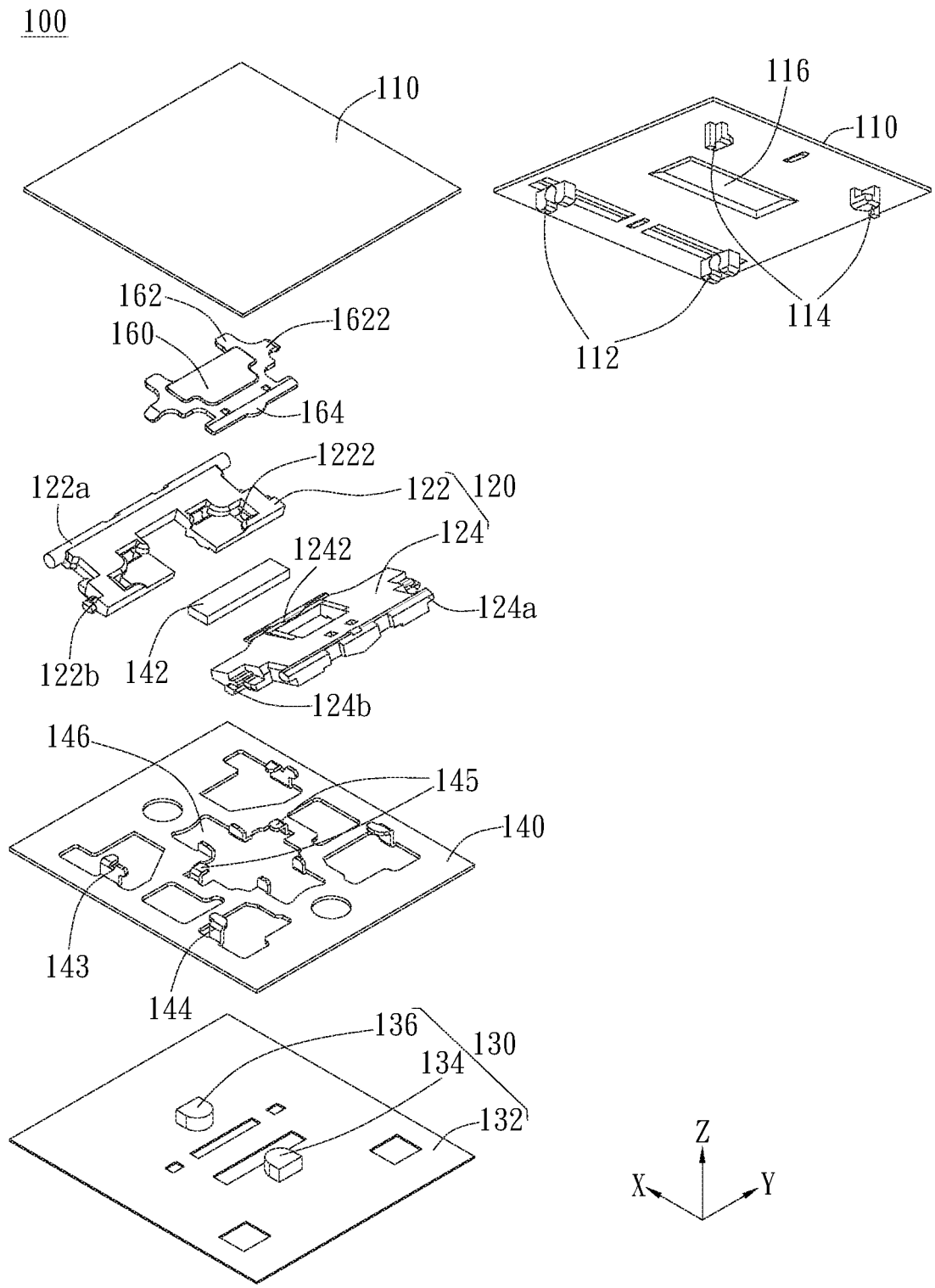
FIG. 28A is an exploded view of a tenth embodiment of the optical keyswitch of the invention.
Figure 28B:
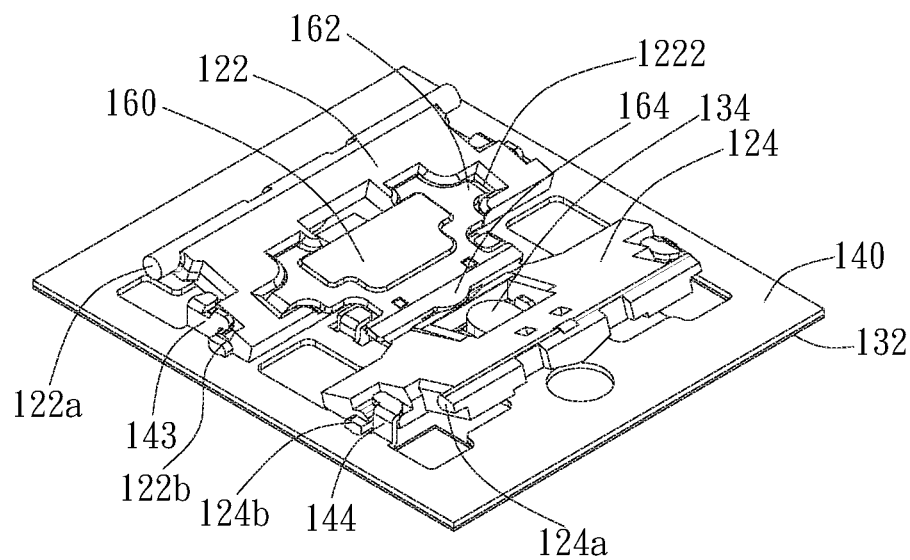
FIG. 28B is a schematic view of the optical keyswitch of FIG. 28A without the keycap.
Figure 28C:
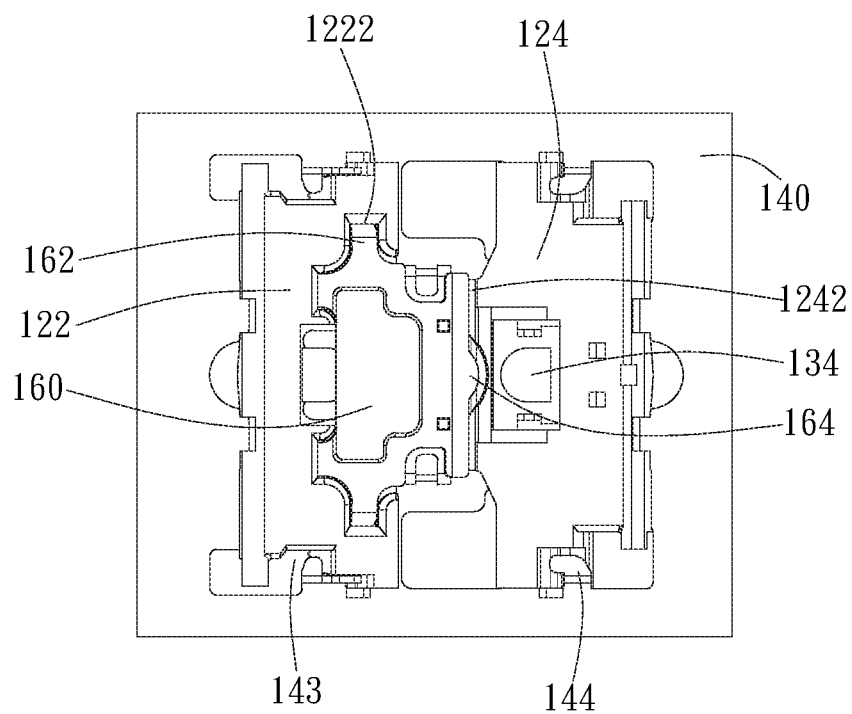
FIG. 28C is a top view of FIG. 28B.

FIGS. 28A to 30 are schematic views of a tenth embodiment of the optical keyswitch. FIG. 28A is an exploded view of the tenth embodiment of the optical keyswitch of the invention. FIG. 28B is a schematic view of the optical keyswitch of FIG. 28A without the keycap. FIG. 28C is a top view of FIG. 28B. As shown in the figures, in the tenth embodiment, the optical keyswitch 100 includes a keycap 110, a support mechanism 120, a switch module 130, a baseplate 140, and a magnetic member 160. The baseplate 140 has a magnetic portion 142. The keycap 110 is disposed above the baseplate 140. The support mechanism 120 is disposed between the keycap 110 and the baseplate 140 to support the keycap 110 moving relative to the baseplate 140. The support mechanism 120 includes a first frame 122 and a second frame 124, which are located on two opposite sides of the keycap 110, respectively. The magnetic member 160 is disposed corresponding to the magnetic portion 142. The magnetic member 160 has a first side 162 and a second side 164. The first side 162 is movably connected to the first frame 122, and the second side 164 corresponds to the second frame 124. The magnetic member 160 and the magnetic portion 142 contact each other to generate an attractive force to support the keycap 110 at a non-pressed position. The switch module 130 includes a circuit board 132, an emitter 134, and a receiver 136. The emitter 134 and the receiver 136 are electrically connected to the circuit board 132 and disposed along a connecting line of the first side 162 and the second side 164 of the magnetic member 160, e.g. along the X axis. The emitter 134 emits an optical signal to the receiver 136. When the keycap 110 is not pressed, the magnetic member 160 blocks the optical signal. When the keycap 110 is pressed, the second frame 124 moves along with the keycap 110 to drive the magnetic member 160 to move away from the magnetic portion 142 to allow the receiver 136 to receive the optical signal, so the switch module 130 is triggered to generate a triggering signal.

Specifically, the keycap 110 has coupling members 112 and 114 and a recessed groove 116 formed at its bottom surface. The baseplate 140 can be a metal plate with connection members 143 and 144 and a positioning portion 145, which is formed by stamping. The magnetic portion 142 can be a magnet and couples with the baseplate 140 by means of the positioning portion 145. The circuit board 132 is disposed under the baseplate 140, and the baseplate 140 has an opening 146, which allows the emitter 134 and the receiver 136 on the circuit board 132 to pass therethrough and protrude from the baseplate 140. The emitter 134 and the receiver 136 are higher than the magnetic portion 142. As such, the emitter 134 and the receiver 136 partially extend above the top surface of the magnetic portion 142, so as to allow at least a portion of the optical signal to be able to travel from the emitter 134 to the receiver 136 along a straight optical path above the top surface of the magnetic portion 142.

Two coupling portions 122a and 122b at two opposite ends of the first frame 122 can movably couple to the coupling member 112 of the keycap 110 and the connection member 143 of the baseplate 140, respectively. Two coupling portions 124a and 124b at two opposite ends of the second frame 124 can movably couple to the coupling member 114 of the keycap 110 and the connection member 144 of the baseplate 140, respectively. As such, the support mechanism 120 can stably support the keycap 110 to move relative to the baseplate 140.

The magnetic member 160 is disposed corresponding to the magnetic portion 142 between the baseplate 140 and the keycap 110, and positioned on the first frame 122. For example, the first frame 122 has a hole 1222, and the magnetic member 160 has a pivot 1622 rotatably engaging with the hole 1222, so the first side 162 of the magnetic member 160 is movably (or rotatably) connected to the first frame 122. The second frame 124 has a supporting portion 1242. The second side 164 of the magnetic member 160 is located above the supporting portion 1242, so that the second frame 124 can drive the magnetic member 160 to rotate when the second frame 124 moves along with the keycap 110.

Figure 29:
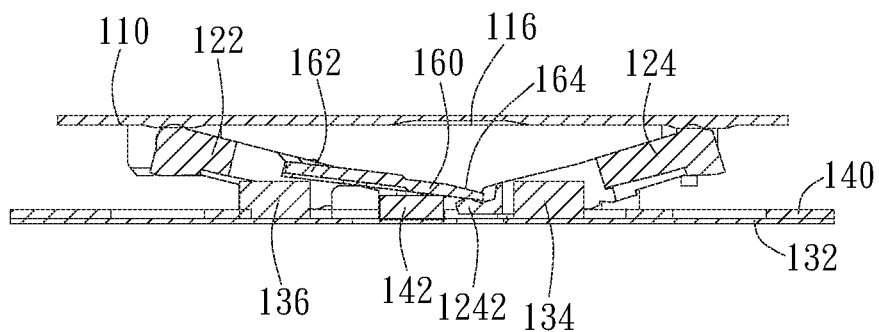
FIGS. 29 and 30 are cross-sectional views of the optical keyswitch of the tenth embodiment of the invention along the X axis at the non-pressed position and the triggering position, respectively.
Figure 30:
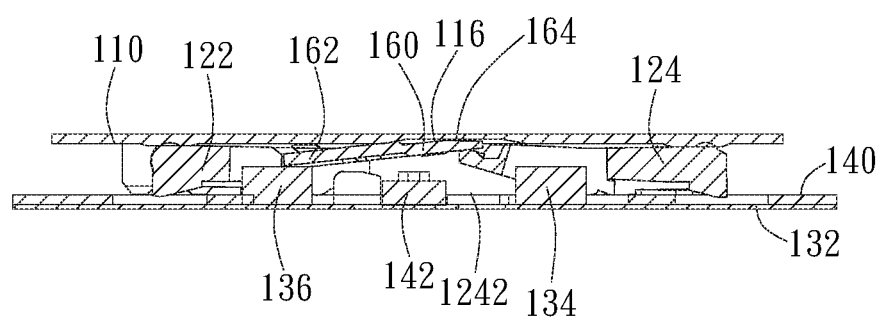

FIGS. 29 and 30 illustrate the operation of the optical keyswitch 100 of the tenth embodiment. FIGS. 29 and 30 are cross-sectional views of the optical keyswitch along the X axis at the non-pressed position and the triggering position, respectively. As shown in FIG. 29. When the keycap 110 is not pressed, the magnetic member 160 and the magnetic portion 142 contact each other to generate an attractive force, so that the second side 164 of the magnetic member 160 contacts the supporting portion 1242 and is at a lower position to block the optical signal. Therefore, the receiver 136 cannot receive the optical signal.

As shown in FIG. 30, when the keycap 110 is pressed to move downward, the second frame 124 rotates to enable the supporting portion 1242 to lift the second side 164 of the magnetic member 160 upward, so the magnetic member 160 moves away from the magnetic portion 142 to be located at a higher position revealing the optical path of the optical signal. Therefore, the receiver 136 is able to receive the optical signal, and the switch module 130 is triggered to generate the triggering signal.

Figure 31A:
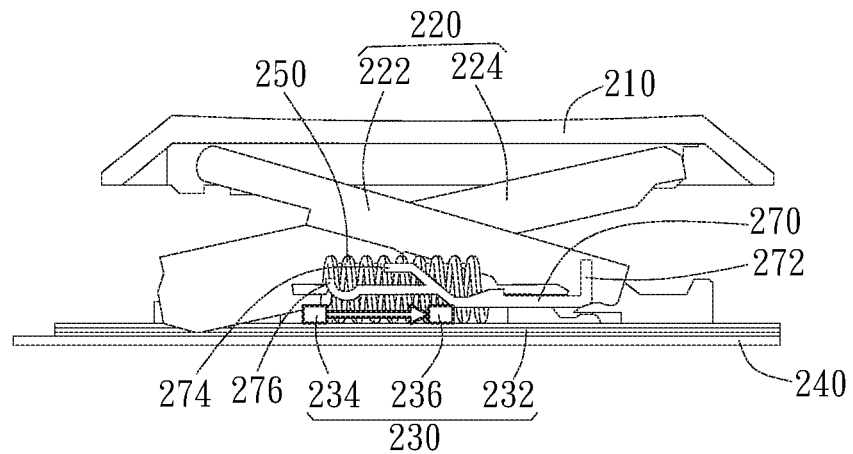
FIGS. 31A and 31B are cross-sectional views of the optical keyswitch of an eleventh embodiment of the invention at the non-pressed position and the triggering position, respectively.
Figure 31B:
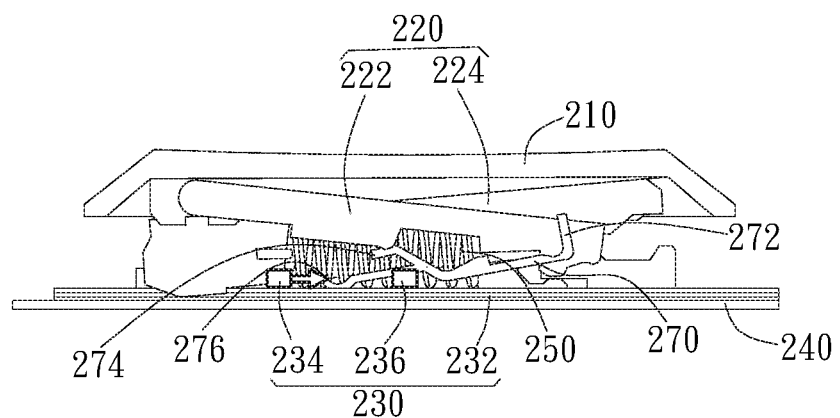

FIGS. 31A and 31B are cross-sectional views of the optical keyswitch of an eleventh embodiment of the invention at the non-pressed position and the triggering position, respectively. As shown in the figures, in the eleventh embodiment, the optical keyswitch includes a keycap 210, a support mechanism 220, a switch module 230, a resilient member 250, a tactile resilient member 270, and a baseplate 240. The support mechanism 220 is disposed below the keycap 210 and configured to support the keycap 210 moving upward and downward. The support mechanism 220 includes a first frame 222 and a second frame 224. The resilient member 250 connects the first frame 222 and the second frame 224. The tactile resilient member 270 has a connecting portion 272, a pressing portion 274, and a hitting portion 276. The connecting portion 272 connects the first frame 222. The pressing portion 274 corresponds to the first frame 222. The hitting portion 276 is connected to the pressing portion 274 and located opposite to the connecting portion 272. The switch module 230 includes a circuit board 232, an emitter 234, and a receiver 236. The emitter 234 and the receiver 236 are electrically connected to the circuit board 232. The emitter 234 emits an optical signal to the receiver 236, and the circuit board 232 is disposed on the baseplate 240.

For example, the first frame 222 and the second frame 224 are pivotally connected, so the support mechanism 220 can be a scissor-like support structure. The resilient member 250 can be implemented as a coil spring, and two ends of the spring are respectively coupled to the baseplate ends of the first frame 222 and the second frame 224 by engaging or hooking. As such, when the first frame 222 moves relative to the second frame 224, the resilient member 250 can elastically deform to provide the restoring force to enable the keycap 210 to return the non-pressed position. The connecting portion 272 of the tactile resilient member 270 is rotatably connected to the first frame 222. In response to the relative movement of the first frame 222 and the second frame 224, the hitting portion 276 rotates.

As shown in FIG. 31A, when the keycap 210 is not pressed, the resilient member 250 enables the baseplate ends of the first frame 222 and the second frame 224 to be close to each other, so the keycap 210 is maintained at the non-pressed position. Moreover, the emitter 234 and the receiver 236 are disposed along a connecting direction of the resilient member 250 connecting the first frame 222 and the second frame 224. The hitting portion 276 of the tactile resilient member 270 is positioned above the optical path of the emitter 234 and the receiver 236.

As shown in FIG. 31B, when the keycap 210 is pressed, the first frame 222 is driven by the keycap 210 to press against the pressing portion 274 of the tactile resilient member 270 and to stretch the resilient member 270, so that the hitting portion 276 rotates to hit the circuit board 232 (or the baseplate 240) and at least partially blocks the optical signal. Therefore, the switch module 230 is triggered to generate the triggering signal.

Figure 32A:
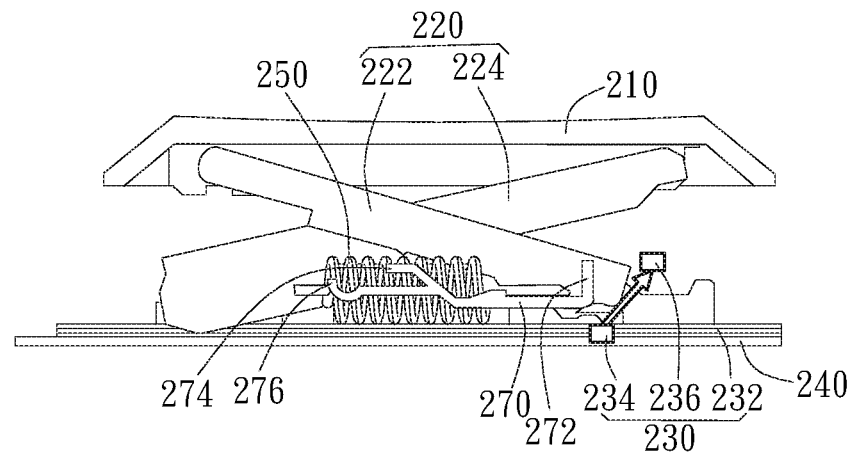
FIGS. 32A and 32B are cross-sectional views of the optical keyswitch of a twelfth embodiment of the invention at the non-pressed position and the triggering position, respectively.
Figure 32B:
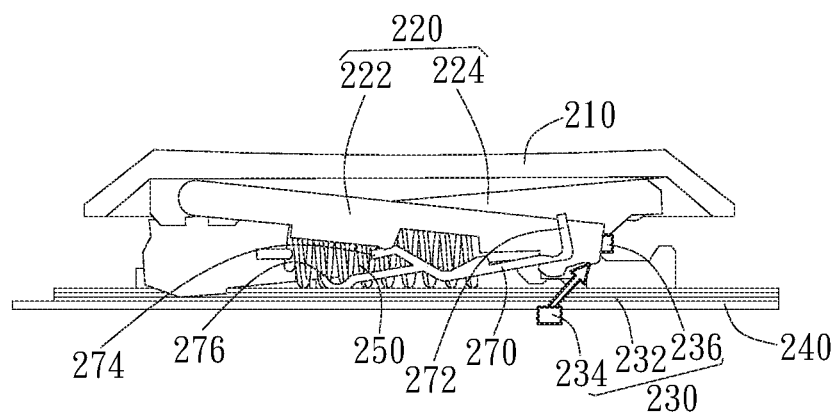

FIGS. 32A and 32B are cross-sectional views of the optical keyswitch of a twelfth embodiment of the invention at the non-pressed position and the triggering position, respectively. In the twelfth embodiment, the optical keyswitch includes the keycap 210, the support mechanism 220, the resilient member 250, and the switch module 230. The details of structure and connection of the keycap 210, the support mechanism 220, and the resilient member 250 can refer to the related descriptions of FIG. 31A. The optical keyswitch of this embodiment is different in that the locations of the emitter 234 and the receiver 236. As shown in FIG. 32A, in this embodiment, the emitter 234 and the receiver 236 are disposed on two opposite sides with respect to the connecting direction of the resilient member 250 connecting the first frame 222 and the second frame 224. As shown in FIG. 32B, when the keycap 210 is pressed, the first frame 222 is driven by the keycap 210 to slide substantially parallel to the circuit board 232 (or the baseplate 240) and at least partially block the optical signal, so the switch module is triggered to generate the triggering signal. In other words, in this embodiment, the emitter 234 and the receiver 222 are disposed at two opposite sides with respect to the moving path of the first frame 222, so the optical path of the optical signal intersects the moving path of the first frame 222. As such, when the first frame 222 is driven by the keycap 210, the first frame 222 moves to the optical path and attenuates the optical signal, and the switch module 230 is triggered to generate the triggering signal.

It is noted that in the first embodiment, the support mechanism 20 is illustrated as the scissor-like support mechanism, but not limited thereto. The support mechanism in the first embodiment can have any suitable configuration. For example, in the tenth embodiment of FIG. 28A, the optical keyswitch 100 with the butterfly type support mechanism 120 is illustrated to utilize the magnetic member 160 for changing the intensity of the optical signal, but not limited thereto. In other embodiments, by modifying the design of the support mechanism and the switch module, an optical keyswitch with the butterfly type support mechanism may have a protrusion, which is configured to function as the protrusion 21 of the first embodiment of FIG. 1A.

Figure 33A:
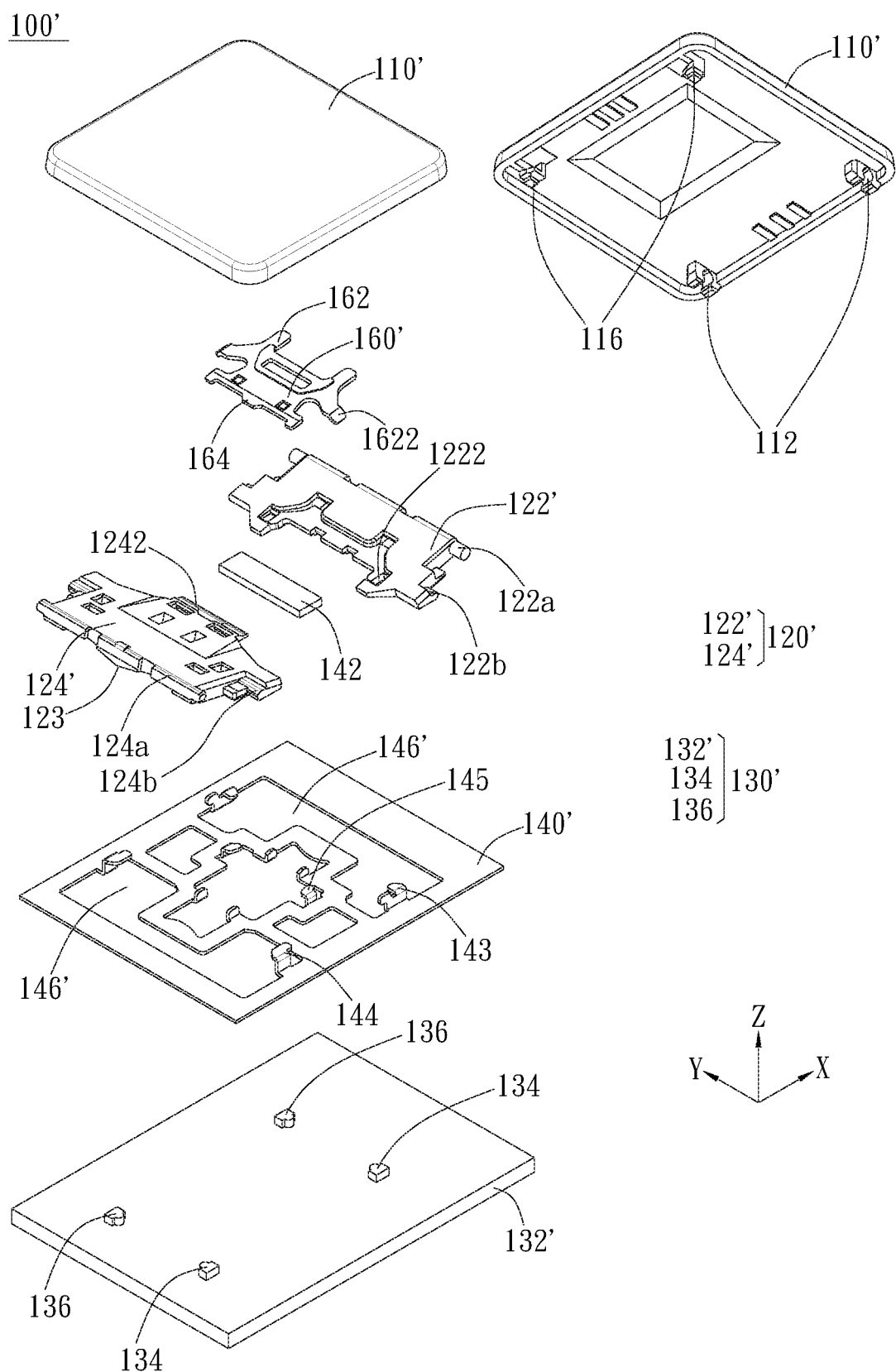
FIG. 33A is an exploded view of a thirteenth embodiment of the optical keyswitch of the invention.
Figure 33B:
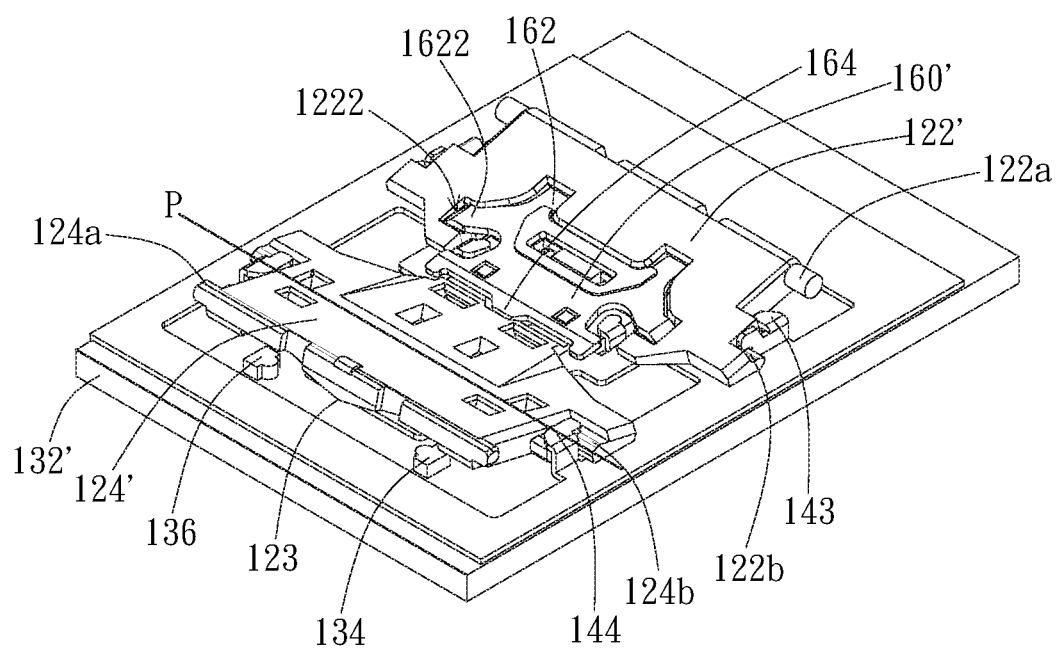
FIG. 33B is a schematic view of the optical keyswitch of FIG. 33A without the keycap.
Figure 33C:
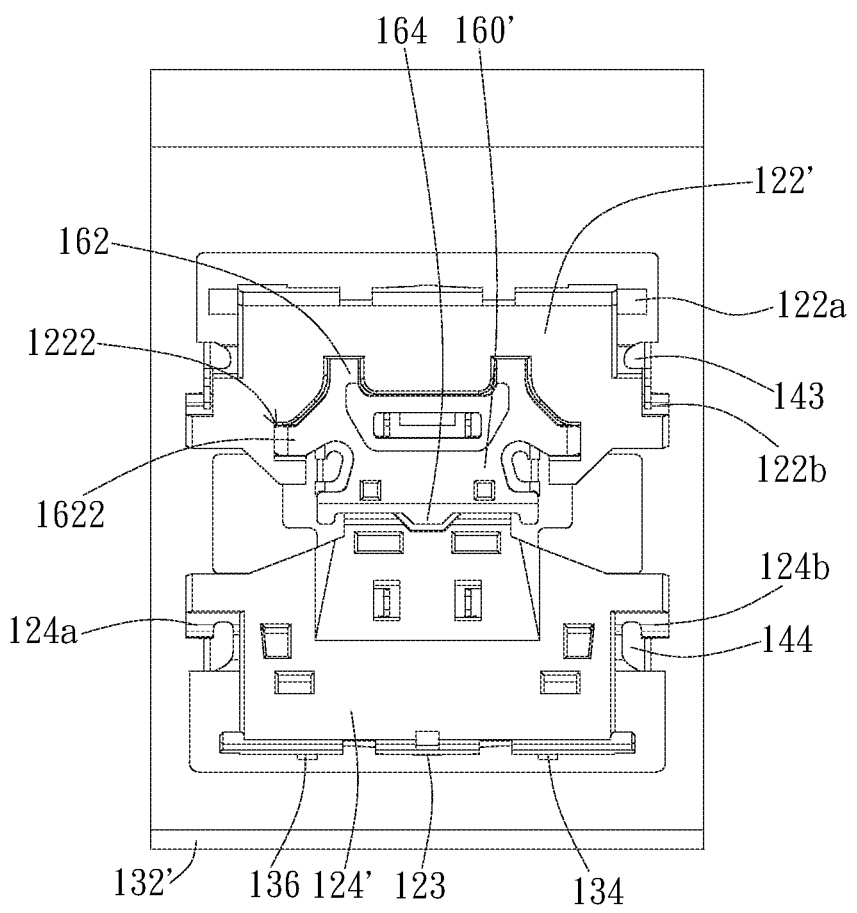
FIG. 33C is a top view of FIG. 33B.

Referring to FIG. 33A to FIG. 35B, which are schematic views of a thirteenth embodiment of the invention, FIG. 33A is an exploded view of the optical keyswitch, FIG. 33B is a schematic view of the optical keyswitch of FIG. 33A without the keycap, and FIG. 33C is a top view of FIG. 33B. As shown in the figures, in the thirteen embodiment, the optical keyswitch 100' includes a keycap 110', a support mechanism 120', a switch module 130', a baseplate 140', and a magnetic member 160'. The details of the keycap 110', the support mechanism 120', the switch module 130', the baseplate 140', and the magnetic member 160' can refer to the related descriptions of the tenth embodiment. Hereinafter, the difference between the thirteenth embodiment and the foregoing embodiments will be explained.

The support mechanism 120' includes a first frame 122' and a second frame 124', which are located on two opposite sides of the keycap 110'. For example, the first frame 122' and the second frame 124' are disposed on two opposite sides of the keycap 110 along the X axis, and two coupling portions (e.g. 122a and 122b, 124a and 124b) at two opposite ends of each of the first frame 122' and the second frame 124' are respectively connected to the keycap 110' and the baseplate 140' to construct a butterfly type support mechanism and rotate around a pivotal axis P. For example, the pivotal axis P can be a virtual connecting line of the coupling portions 124b on two opposite sides of the second frame 124'. The support mechanism 120' includes a protrusion 123 disposed corresponding to the emitter 134 and the receiver 136 of the switch module 130'. For example, at least one of the first frame 122' and the second frame 124' can have the protrusion 123 at its keycap end, i.e. the end neighboring the keycap 110' and far away from the baseplate 140'. In this embodiment, the first frame 122' and the second frame 124' both have the protrusion 123 at the keycap ends, and the protrusion 123 extends downward toward the baseplate 140'. The switch module 130' have two sets of the emitters 134 and the receivers 136, which are disposed on and electrically connected to the circuit board 132'. One set of the emitter 134 and the receiver 136 are disposed along the keycap end of the first frame 122' corresponding to the protrusion 123 of the first frame 122', and the other set of the emitter 134 and the receiver 136 are disposed along the keycap end of the second frame 124' corresponding to the protrusion 123 of the second frame 124'. In other words, each set of the emitter 134 and the receiver 136 are disposed along the Y axis and preferably below the first frame 122' or the second frame 124', so that the optical path between the emitter 134 and the receiver 136 is substantially a straight path along the Y axis, i.e. a straight connecting line connecting the emitter 134 and the receiver 136 is the optical path of the optical signal. The optical path (i.e. the straight connecting line) avoids intersection with the pivotal axis P. It is noted that the shape and the number of the opening 146' of the baseplate 140' can be modified to allow the two sets of the emitter 134 and the receiver 136 on the circuit board 132' to pass therethrough and protrude from the baseplate 140'.

Figure 34A:
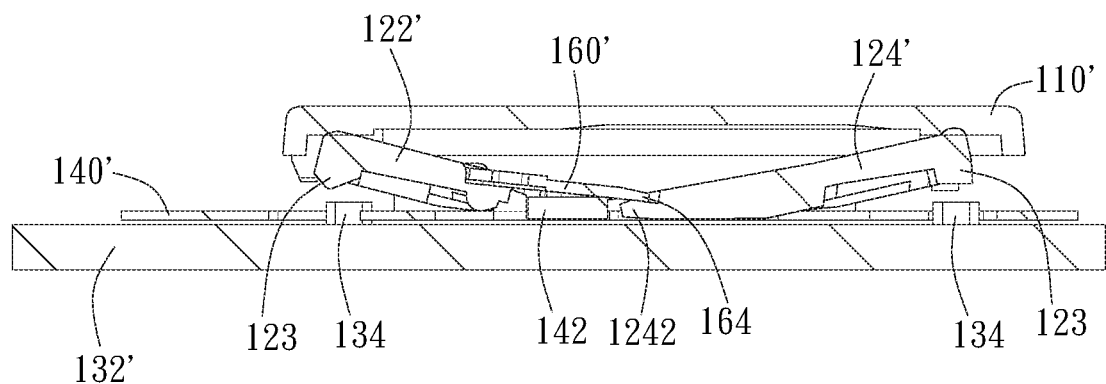
FIGS. 34A and 35A are cross-sectional views of the optical keyswitch of the thirteenth embodiment of the invention along the X axis at the non-pressed position and the triggering position, respectively.
Figure 34B:
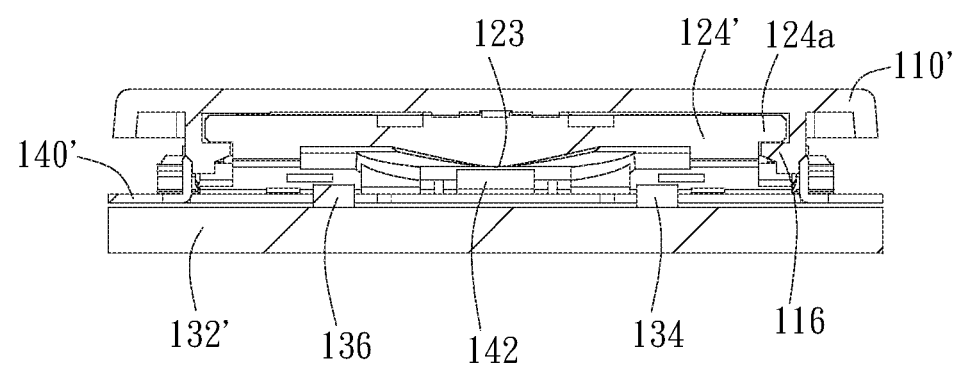
FIGS. 34B and 35B are cross-sectional views of the optical keyswitch of the thirteenth embodiment of the invention along the Y axis at the non-pressed position and the triggering position, respectively.
Figure 35A:
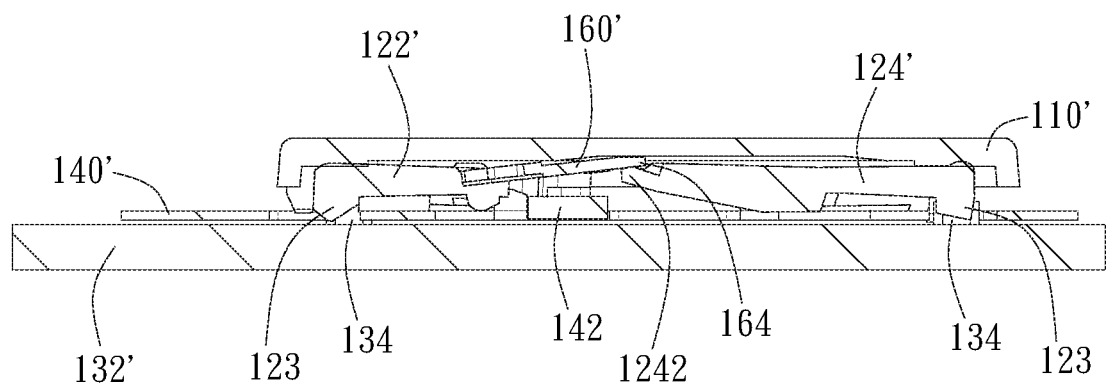
Figure 35B:
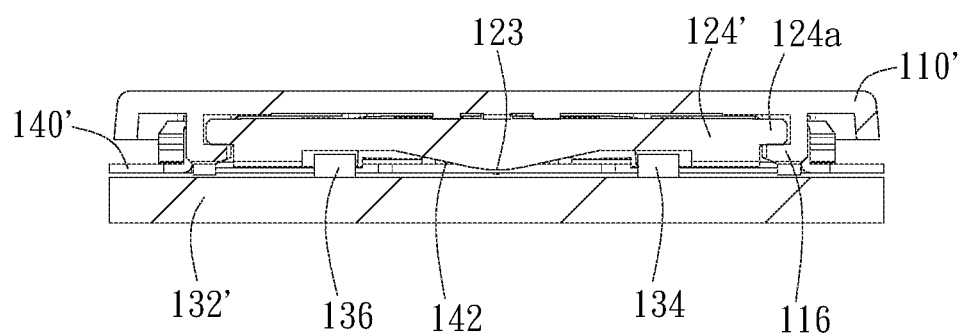

FIGS. 34A to 35B illustrate the operation of the optical keyswitch 100' of the thirteenth embodiment. FIGS. 34A and 35A are cross-sectional views of the optical keyswitch along the X axis at the non-pressed position and the triggering position, respectively. FIGS. 34B and 35B are cross-sectional views of the optical keyswitch along the Y axis at the non-pressed position and the triggering position, respectively. As shown in FIGS. 34A and 34B, when the keycap 110' is not pressed, the magnetic member 160' and the magnetic portion 142 contact each other to generate an attractive force, so that the second side 164 of the magnetic member 160' contacts the supporting portion 1242 and is at a lower position, and the keycap ends of the first frame 122' and the second frame 124' are away from the baseplate 140'. Therefore, the protrusion 123 at the keycap end is preferably located above the optical path of the corresponding emitter 134 and receiver 136 and substantially does not change the intensity of the optical signal. That is, the receiver 136 receives the optical signal of a first intensity, which is relatively stronger.

As shown in FIGS. 35A and 35B, when the keycap 110' is pressed to move downward, the second frame 124' rotates around the pivotal axis P to enable the supporting portion 1242 to lift the second side 164 of the magnetic member 160' upward, so the magnetic member 160' moves away from the magnetic portion 142 to be located at a higher position, and the keycap ends of the first frame 122' and the second frame 124' move downward toward the baseplate 140'. As such, the protrusion 123 at the keycap end driven by the keycap 110' moves downward and enters the optical path of the optical signal to change the optical signal received by the corresponding receiver 136 to have a second intensity, which is different from the first intensity, so that the switch module 130' is triggered to generate a triggering signal. In other words, when the keycap 110' is pressed, the protrusion 123 of the support mechanism 120' moves downward to at least partially block the optical signal, so that the second intensity is smaller than the first intensity, and the switch module 130' is triggered to generate a triggering signal.

It is noted that in the embodiment FIG. 33A, two sets of the emitters 134 and the receivers 136 are illustrated, but not limited thereto. In other embodiments, the optical keyswitch may have only one set of the emitter 134 and the receiver 136, which can be disposed along the keycap end of the first frame 122' or the second frame 124' to correspond to the protrusion 123 thereon. Moreover, by modifying the extending length of the protrusion 123, the triggering distance of the optical keyswitch can be controlled to achieve a faster triggering effect or a slower triggering effect.

Although the preferred embodiments of the present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. An optical keyswitch, comprising:
a keycap;
a baseplate disposed below the keycap and extending horizontally beyond the keycap;
a support mechanism comprising at least one frame having two opposite ends respectively connected to the keycap and the baseplate and configured to support the keycap moving upward and downward relative to the baseplate, the support mechanism having a protrusion protruding from the at least one frame; and
a switch module comprising a circuit board, an emitter, and a receiver, the emitter and the receiver electrically connected to the circuit board, the emitter emitting an optical signal to the receiver,
wherein when the keycap is not pressed, the receiver receives the optical signal of a first intensity;
when the keycap is pressed, the at least one frame is rotatable relative to the keycap or the baseplate to enable the protrusion to move along with the keycap, and the protrusion changes the optical signal received by the receiver to have a second intensity different from the first intensity, so that the switch module is triggered to generate a triggering signal.

2. The optical keyswitch of claim 1, wherein the at least one frame of the support mechanism comprises an inner frame and an outer frame; the inner frame is pivotally connected to an inner side of the outer frame to form a scissor-like support mechanism; the protrusion extends from an inner side of the inner frame toward an inner direction of the inner frame.

3. The optical keyswitch of claim 1, wherein when the protrusion moves along with the keycap, the protrusion at least partially blocks the optical signal, so that the second intensity is smaller than the first intensity.

4. The optical keyswitch of claim 1, further comprising a restoring mechanism disposed below the keycap and configured to provide a restoring force to enable the keycap to return to a non-pressed position after the keycap is released from being pressed, wherein the restoring mechanism comprises a casing and a resilient member; the casing has an accommodation space and includes an upper casing and a lower casing; the resilient member is disposed in the accommodation space; when the keycap is pressed, the protrusion moves outside the casing.

5. The optical keyswitch of claim 4, wherein the casing has an up-down path and a sidewall; the sidewall is located between the up-down path and the accommodation space to separate the up-down path from the accommodation space; when the keycap is pressed, the protrusion is driven by the keycap to move downward in the up-down path.

6. The optical keyswitch of claim 5, wherein the circuit board further has a receiving space aligned with the up-down path; when the keycap is pressed, the protrusion is driven by the keycap to move downward in the up-down path into the receiving space.

7. The optical keyswitch of claim 5, wherein the lower casing has a substantially U-shaped horizontal cross section; the upper casing includes a left arm portion and a right arm portion protruding toward each other beyond the lower casing to form an open region between the left arm portion and the right arm portion; the up-down path is located within the open region, and the emitter and the receiver are located beneath the left arm portion and the right arm portion, respectively.

8. The optical keyswitch of claim 4, wherein the support mechanism comprises a scissor-like support mechanism; the at least one frame includes an inner frame and an outer frame; the inner frame couples with the outer frame to rotate about a scissor axis; the restoring mechanism, the emitter, and the receiver are all within a vertical projection area of the inner frame; the restoring mechanism is substantially located at a first side with respect to the scissor axis; the emitter and the receiver are located at a second side opposite to first side with respect to the scissor axis.

9. The optical keyswitch of claim 8, wherein the emitter and the receiver are arranged along a straight optical path; the straight optical path is parallel to the scissor axis.

10. The optical keyswitch of claim 4, wherein the upper casing comprises an upper casing body and a movable part; the upper casing body has a through hole and an upper engaging portion; the movable part is movably inserted into the through hole to position the resilient member; the lower casing has a lower engaging portion engaging with the upper engaging portion to combine the upper casing and the lower casing.

11. The optical keyswitch of claim 10, wherein the upper casing body has an open region; the emitter and the receiver are disposed on two opposite sides with respect to the open region and covered by the upper casing body; the optical signal passes the open region;

when the protrusion is driven to move along with the keycap, the protrusion moves toward the open region to at least partially block the optical signal.

12. The optical keyswitch of claim 11, wherein the circuit board has a receiving space communicating with the open region; when the protrusion at least partially blocks the optical signal, the protrusion moves into the receiving space through the open region.

13. The optical keyswitch of claim 4, wherein the lower casing has a wing portion; the restoring mechanism is positioned on the circuit board by the wing portion leaning on the circuit board.

14. The optical keyswitch of claim 10, wherein the upper casing body further comprises a hook portion; the restoring mechanism is positioned on the circuit board by the hook portion engaging with the circuit board.

15. The optical keyswitch of claim 1, further comprising a backlight source, wherein the keycap has a light-transparent portion; the backlight source is electrically connected to the circuit board and provides a light toward the keycap to emit out from the light-transparent portion.

16. The optical keyswitch of claim 4, wherein the casing has a grating portion disposed corresponding to the emitter or the receiver to define a stroke distance of generating the triggering signal when the keycap is pressed.

17. The optical keyswitch of claim 1, wherein the at least one frame of the support mechanism comprises a first frame and a second frame; the first frame and the second frame are disposed on two opposite sides of the keycap to construct a butterfly type support mechanism rotating around a pivotal axis; the first frame has the protrusion; the emitter and the receiver are disposed below the first frame, and a straight line connecting the emitter and the receiver avoids intersection with the pivotal axis.

* * * * *